(12) United States Patent
Shimono et al.

(10) Patent No.: US 9,032,876 B2
(45) Date of Patent: May 19, 2015

(54) LITHOGRAPHIC PRINTING PLATE PRECURSOR, LITHOGRAPHIC PRINTING PLATE PLATEMAKING METHOD, AND POLYMERIZABLE MONOMER

(75) Inventors: Katsuhiro Shimono, Shizuoka (JP); Norio Aoshima, Shizuoka (JP); Junji Kawaguchi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 1072 days.

(21) Appl. No.: 13/121,600

(22) PCT Filed: Sep. 30, 2009

(86) PCT No.: PCT/JP2009/067065
§ 371 (c)(1),
(2), (4) Date: Mar. 29, 2011

(87) PCT Pub. No.: WO2010/038795
PCT Pub. Date: Apr. 8, 2010

(65) Prior Publication Data
US 2011/0174179 A1    Jul. 21, 2011

(30) Foreign Application Priority Data

Sep. 30, 2008 (JP) .................................. 2008-255326
Jun. 9, 2009 (JP) .................................. 2009-138300

(51) Int. Cl.
*B41C 1/10* (2006.01)
*B41N 1/08* (2006.01)
(Continued)

(52) U.S. Cl.
CPC .............. *B41C 1/1008* (2013.01); *B41N 1/08* (2013.01); *C08F 20/38* (2013.01); *G03F 7/027* (2013.01); *B41C 1/1016* (2013.01);
(Continued)

(58) Field of Classification Search
None
See application file for complete search history.

(56) References Cited

U.S. PATENT DOCUMENTS 6,030,750 A   2/2000   Vermeersch et al.
6,096,481 A   8/2000   Vermeersch et al.
(Continued)

FOREIGN PATENT DOCUMENTS

EP   0 770 494 A2   5/1997
EP   1 834 766 A2   9/2007
(Continued)

OTHER PUBLICATIONS

International Search Report dated Jan. 12, 2010 in International Application No. PCT/JP2009/067065.
(Continued)

*Primary Examiner* — Joshua D Zimmerman
(74) *Attorney, Agent, or Firm* — Birch, Stewart, Kolasch & Birch, LLP

(57) ABSTRACT

There is provided a lithographic printing plate precursor that enables image recording using a laser and that provides an excellent scumming resistance and an excellent developability while maintaining a satisfactory printing durability. Also provided are a platemaking method, and a novel polymerizable monomer. A lithographic printing plate precursor has a support, and an image recording layer disposed thereon and containing a radical polymerization initiator and a polymerizable monomer that has a sulfonamide group and at least two ethylenically unsaturated groups; a lithographic printing plate platemaking method uses this lithographic printing plate precursor; and a polymerizable monomer has a sulfonamide group and at least two ethylenically unsaturated groups.

16 Claims, 3 Drawing Sheets

(51) Int. Cl.
*C08F 20/38* (2006.01)
*G03F 7/027* (2006.01)

(52) U.S. Cl.
CPC ........ *B41C 2201/02* (2013.01); *B41C 2201/04* (2013.01); *B41C 2201/06* (2013.01); *B41C 2201/10* (2013.01); *B41C 2201/14* (2013.01); *B41C 2210/04* (2013.01); *B41C 2210/06* (2013.01); *B41C 2210/20* (2013.01); *B41C 2210/22* (2013.01); *B41C 2210/24* (2013.01)

(56) References Cited

U.S. PATENT DOCUMENTS

| | | | |
|---|---|---|---|
| 6,271,326 | B1 | 8/2001 | Nishikawa et al. |
| 6,740,464 | B2 | 5/2004 | Maemoto |
| 7,005,234 | B2 | 2/2006 | Hoshi et al. |
| 7,026,097 | B2 | 4/2006 | Hoshi et al. |
| 2004/0106060 | A1 | 6/2004 | Maemoto |
| 2004/0224258 | A1 | 11/2004 | Maemoto |
| 2004/0234883 | A1 | 11/2004 | Maemoto |
| 2007/0214987 | A1 | 9/2007 | Sonokawa et al. |
| 2007/0298351 | A1 | 12/2007 | Shimad et al. |

FOREIGN PATENT DOCUMENTS

| | | |
|---|---|---|
| EP | 1 862 301 A1 | 12/2007 |
| JE | 2001-277740 A | 10/2001 |
| JP | 61-118467 A | 6/1986 |
| JP | 3-56458 A | 3/1991 |
| JP | H06-256289 A | 9/1994 |
| JP | 2938397 B2 | 8/1999 |
| JP | 2000-17028 A | 1/2000 |
| JP | 2001-277742 A | 10/2001 |
| JP | 2002-287334 A | 3/2002 |
| JP | 2003313245 A | 11/2003 |
| JP | 2005-263988 A | 9/2005 |
| JP | 2007-101743 A | 4/2007 |
| JP | 2007-276454 A | 10/2007 |

OTHER PUBLICATIONS

Japanese Notice of Reasons for Refusal issued in Japanese Patent Application No. 2009-138300 on Nov. 14, 2013.

Japanese Office Action issued in Japanese Patent Application No. 2009-138300 on Jan. 27, 2014, with English translation.

Extended European Search Report issued in European Application No. 09817827.0 on Aug. 6, 2012.

LITHOGRAPHIC PRINTING PLATE PRECURSOR, LITHOGRAPHIC PRINTING PLATE PLATEMAKING METHOD, AND POLYMERIZABLE MONOMER

TECHNICAL FIELD

The present invention relates to a lithographic printing plate precursor and a platemaking method for providing a lithographic printing plate. More particularly, the present invention relates to a lithographic printing plate precursor that enables image recording using a laser and that can be subjected to on-press development or gum development. The present invention further relates to a platemaking method for providing a lithographic printing plate using this lithographic printing plate precursor.

BACKGROUND ART

A lithographic printing plate typically comprises an oleophilic image area that is ink receptive during the printing process and a hydrophilic nonimage area that is fountain solution receptive during the printing process. Lithographic printing is a method that utilizes the fact that water and oleophilic ink repel each other: differences in the ink attachment behavior are produced on the surface of the lithographic printing plate by using the oleophilic image areas on the lithographic printing plate as ink receptive areas and using the hydrophilic nonimage areas on the lithographic printing plate as fountain solution receptive areas (areas not receptive to ink). After ink uptake has been brought about only in the image areas, the ink is transferred to the receiving medium, e.g., paper.

A lithographic printing plate precursor (PS plate) comprising an oleophilic photosensitive resin layer (image recording layer) disposed on a hydrophilic support has heretofore been widely used to produce the aforementioned lithographic printing plate. The lithographic printing plate is typically obtained by carrying out platemaking by a method in which the lithographic printing plate precursor is exposed to light through an original image, for example, a lith film, after which the image recording layer corresponding to the image areas remains while the unwanted image recording layer corresponding to the nonimage areas is dissolved and removed by an alkaline developing solution or an organic solvent-containing developing solution to form the nonimage areas by exposing the surface of the hydrophilic support.

The conventional platemaking process for lithographic printing plate precursors has required a step in which, after photoexposure, the unwanted image recording layer corresponding to a nonimage area is dissolved and removed by, for example, a developing solution, and a concern with these separately conducted wet processes has been to render them unnecessary or to simplify them. In particular, attention to the environment has in recent years caused the disposal of the waste solutions discharged in association with wet processes to become a major issue for the industrial sector as a whole, and there has been an even stronger desire to address the aforementioned concern.

In this context, the method known as on-press development has been introduced as a simple and convenient platemaking method. In on-press development, an image recording layer is used that enables the removal of unwanted areas of the image recording layer to be carried out during the normal printing process: after photoexposure, the lithographic printing plate is obtained by removal of the unwanted areas of the image recording layer on the press.

The following are examples of specific methods of on-press development: use of a lithographic printing plate precursor that has an image recording layer that can be dissolved or dispersed in the fountain solution, in the ink solvent, or in an emulsion of the fountain solution and ink; mechanical removal of the image recording layer by contact with the blanket or rollers on the press; and mechanical removal of the image recording layer by carrying out contact with rollers or the blanket after the cohesive strength within the image recording layer or the adhesive force between the image recording layer and support has been weakened by penetration by, for example, the fountain solution or the ink solvent.

A method known as gum development has also been introduced as another convenient development method. In gum development, the unwanted portions of the image recording layer are removed without using a conventional highly alkaline developing solution, but rather using the gum solution known as the finisher that has been used after a conventional alkaline development.

Unless stated otherwise, in the present invention, the "development processing step" refers to a step in which the hydrophilic surface of the support is exposed by the removal of those areas of the image recording layer on the lithographic printing plate precursor that have not undergone photoexposure, wherein this removal is effected by contact with a fluid (typically an alkaline developing solution) using an apparatus (typically an automatic developing apparatus) outside of the press, while "on-press development" denotes a step and a method in which the hydrophilic surface of the support is exposed by the removal of those areas of the image recording layer on the lithographic printing plate precursor that have not undergone photoexposure, wherein this removal is effected by contact with a fluid (typically the printing ink and/or fountain solution) using the press.

The "development processing step" described above includes development, denoted in particular as "gum development", that uses a gum solution as the developing solution.

On the other hand, digitization technology, in which the image data is electronically processed, stored, and output by a computer, has become widespread in recent years, and a variety of new image output methods made possible by this digitization technology have entered into use. Accompanying this, computer-to-plate technology has been receiving attention; in computer-to-plate technology, the digitized image data is carried by highly convergent radiation, such as laser light, and the lithographic printing plate is directly produced by scanning photoexposure of the lithographic printing plate precursor with this radiation without going through a lith film. As a consequence, the acquisition of lithographic printing plate precursors adapted to this technology has become an important technical issue.

To simplify the previously described platemaking operation, a system that uses a light source and an image recording layer that support handling in a bright room or under yellow illumination is preferred from the standpoint of ease of operability.

Solid-state lasers that emit infrared radiation at wavelengths from 760 to 1200 nm, e.g., semiconductor lasers and YAG lasers, are such a laser light source and are very useful because small, high output solid-state lasers can be acquired inexpensively. UV lasers can also be used.

Within the realm of the lithographic printing plate precursors under consideration, for example, Patent Document 1 describes a lithographic printing plate precursor that has a hydrophilic support and disposed thereon an image-forming layer in which particles of a hydrophobic thermoplastic polymer are dispersed in a hydrophilic binder. This Patent Document 1 essentially states that on-press development by the fountain solution and/or ink is possible after this lithographic printing plate precursor has been photoexposed using an infrared laser to effect image formation by thermally coalescing the hydrophobic thermoplastic polymer particles and has thereafter been mounted on a cylinder in a press.

This image formation method based on coalescence by the simple hot-melt bonding of finely divided particles does provide an excellent on-press developability, but it has had the drawback of an unsatisfactory printing durability due to its very low image strength.

In addition, Patent Documents 2 and 3 describe lithographic printing plate precursors that have a hydrophilic support and disposed thereon microcapsules that incorporate a polymerizable compound.

Patent Document 4 describes a lithographic printing plate precursor comprising a support having disposed thereon a photosensitive layer that contains an infrared absorber, a radical polymerization initiator, and a polymerizable compound.

Due to the high chemical bond density in the image region, these polymerization reaction-based methods characteristically provide a better image strength than does an image region that has been formed by the hot-melt bonding of finely divided polymer particles, but when viewed from a practical perspective, the on-press developability, printing durability, and polymerization efficiency (sensitivity) are still unsatisfactory.

In order to solve this problem, Patent Document 5 describes a lithographic printing plate precursor that has a sulfonate salt and/or an alkyl sulfate ester salt in a photosensitive layer and Patent Document 6 describes a lithographic printing plate precursor that has an amino acid and/or a betaine in a protective layer; however, the balance here between on-press developability and printing durability is unsatisfactory.

In addition, the development of the nonphotoexposed regions has been completely unsatisfactory when these lithographic printing plate precursors have been subjected to gum development.

Patent Document 1: Japanese Patent No. 2,938,397
Patent Document 2: Japanese Patent Application Publication No. 2001-277740
Patent Document 3: Japanese Patent Application Publication No. 2001-277742
Patent Document 4: Japanese Patent Application Publication No. 2002-287334
Patent Document 5: Japanese Patent Application Publication No. 2007-276454
Patent Document 6: European Patent Application Publication No. 1862301 A

DISCLOSURE OF THE INVENTION

It has heretofore been found that the developability is degraded when, in order to improve the printing durability, an ink-resistant component is introduced into a simple binder polymer.

An object of the present invention is therefore to provide a lithographic printing plate precursor that exhibits an excellent on-press developability, gum developability, and alkaline developability and that does so while maintaining a satisfactory printing durability. A further object of the present invention is to provide a platemaking method that yields a lithographic printing plate that exhibits an excellent balance between printing durability and on-press developability, gum developability, or alkaline developability. A further object of the present invention is to provide a novel polymerizable monomer.

The present inventor carried out extensive and intensive investigations in order to achieve the problems described above and as a result discovered that the incorporation of a special polymerizable monomer in the image recording layer of a lithographic printing plate precursor made it possible to provide a lithographic printing plate precursor that could be subjected to on-press development, gum development, or conventional alkaline development processing, that had a high capacity to withstand the printing process, and that exhibited an excellent developability and an excellent scumming resistance. The present invention was achieved based on this discovery.

Accordingly, the present invention is a lithographic printing plate precursor that has a support, and an image recording layer disposed thereon and containing a radical polymerization initiator and a polymerizable monomer that has a sulfonamide group and at least two ethylenically unsaturated groups. This image recording layer may additionally incorporate a sensitizing dye. The arylsulfonamide group is a preferred example of the sulfonamide group in the polymerizable monomer. A preferred embodiment of this polymerizable monomer further contains at least one selected from a ureido bond, a urethane bond, and an isocyanuric acid structure.

This lithographic printing plate precursor may also have a protective layer. This protective layer can be exemplified by a protective layer that contains mica.

The present invention is also directed to a platemaking method for providing a lithographic printing plate using this lithographic printing plate precursor.

Exemplary embodiments of the platemaking method of the present invention, considered specifically with respect to the procedure for developing the lithographic printing plate precursor after its imagewise photoexposure with a laser, are a development procedure in which development with a conventional developing solution is followed by protection of the surface with a gum solution; a gum development procedure in which the gum solution and the developing solution are one and the same and the development process and protection by gumming are performed in a single bath; and an on-press development procedure in which development is performed on the printing press using printing ink and/or fountain solution.

Thus, specific exemplary embodiments of the lithographic printing plate platemaking method of the present invention are a lithographic printing plate platemaking method comprising the imagewise photoexposure of the previously described lithographic printing plate precursor using a laser followed by removal of a nonphotoexposed region of the image recording layer using a printing ink and/or a fountain solution; a lithographic printing plate platemaking method comprising the imagewise photoexposure of the previously described lithographic printing plate precursor using a laser followed by removal of a nonphotoexposed region of the image recording layer in the presence of a developing solution that has a pH of 5.0 to 13.5; and more specifically a lithographic printing plate platemaking method comprising removal of the nonphotoexposed region of the image recording layer in the presence of a developing solution that has a pH of 8.5 to 10.8. Another specific exemplary embodiment of the present invention is a lithographic printing plate platemaking method in which a gum solution is used for the developing solution and this gum developing solution contains a hydrophilic resin.

The present invention is additionally directed to a novel polymerizable monomer. The present invention is thus a polymerizable monomer that has a sulfonamide group and at least two ethylenically unsaturated groups. Exemplary embodiments of this polymerizable monomer are the polymerizable monomer in which the sulfonamide group is an arylsulfonamide group, for example, a benzenesulfonamide group, and the polymerizable monomer that further has at least one selected from a ureido bond, a urethane bond, and an isocyanuric structure.

The present invention provides a lithographic printing plate precursor that exhibits an excellent chemical resistance, an excellent developability, and an excellent scumming resistance and that does so while maintaining a satisfactory printing durability. The present invention also provides a plate-making method that yields a lithographic printing plate that exhibits an excellent developability and an excellent printing durability. The present invention provides a lithographic printing plate for which print scumming is inhibited.

BEST MODE FOR CARRYING OUT THE INVENTION

Figure 1:
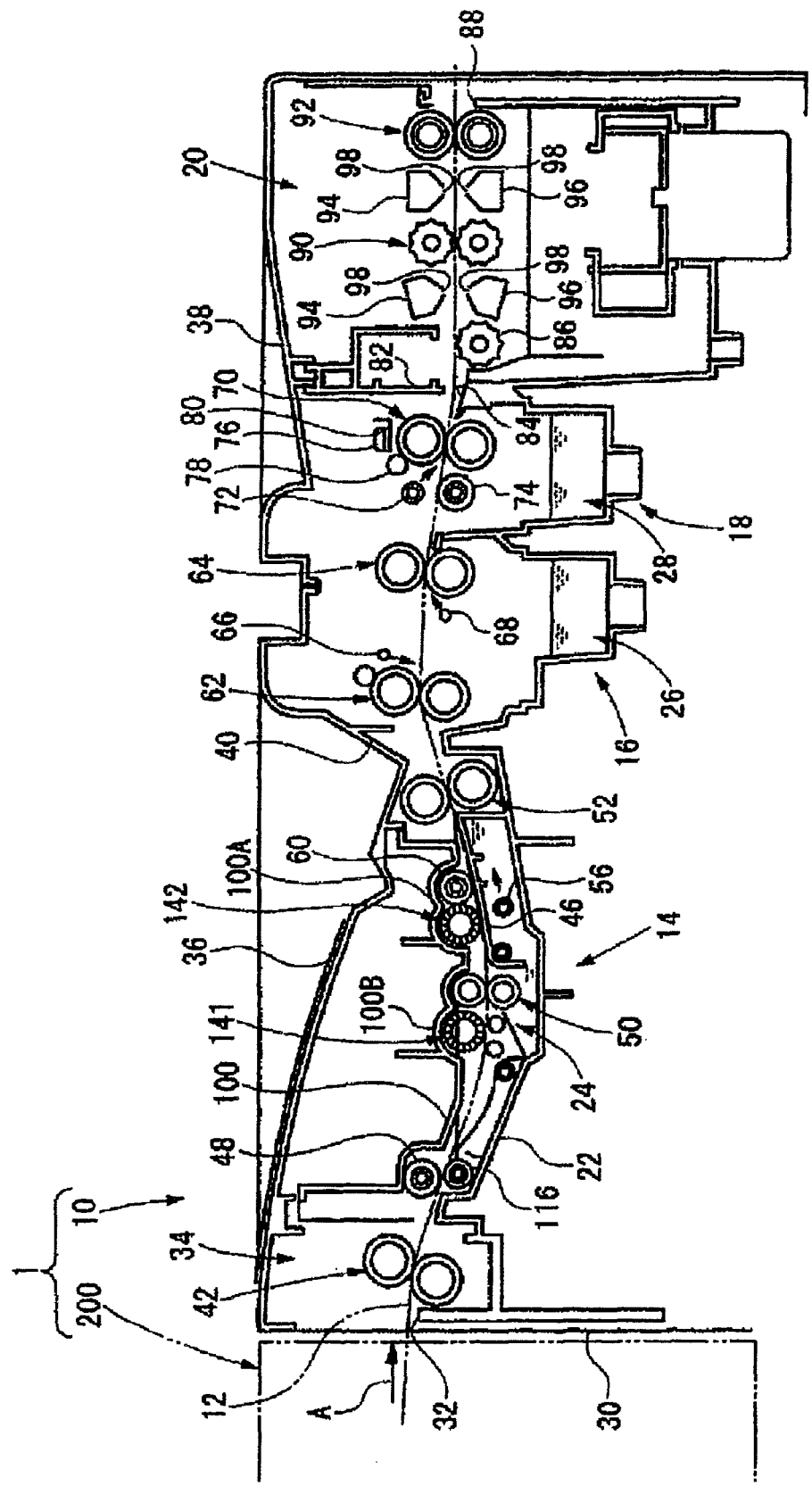
FIG. 1 is a drawing that shows the structure of an automatic developing apparatus for lithographic printing plates, wherein 1: automatic developing apparatus, 10: development processing section, 12: printing plate, 14: development section, 16: water rinse section, 18: desensitization processing section, 20: drying section, 24: development tank, 141, 142: brush roller (rubbing member), 200: pre-treatment section.

The lithographic printing plate precursor of the present invention has an image recording layer disposed on a support, exhibits an excellent printing durability and an excellent scumming resistance, and can be on-press developed by furnishing printing ink and/or fountain solution, or can be gum developed by furnishing a gum solution, or can be subjected to alkaline development by furnishing a developing solution.

<The Polymerizable Monomer that has a Sulfonamide Group and at Least Two Ethylenically Unsaturated Groups>

The polymerizable monomer of the present invention has a sulfonamide group and at least two ethylenically unsaturated groups in its molecular structure. The sulfonamide group is preferably directly bonded to an aromatic ring or to a heterocyclic ring, among which an arylsulfonamide group is preferred, the sulfonamide group is particularly preferably bonded to a benzene ring or naphthalene ring, and the sulfonamide group is most preferably bonded to a benzene ring.

The aromatic ring and heterocyclic ring referenced here may bear, for example, an alkyl group, aryl group, aralkyl group, halogen atom, amide group, ester bond, carboxyl group, sulfoxyl group, hydroxyl group, or ether bond.

The ethylenically unsaturated bond can be exemplified by the vinyl group, acryloyl group, methacryloyl group, allyl group, and styryl group, among which the acryloyl group, methacryloyl group, and allyl group are preferred.

The polymerizable monomer, for example, can have a structure as shown by the following general formula (I) or (II).

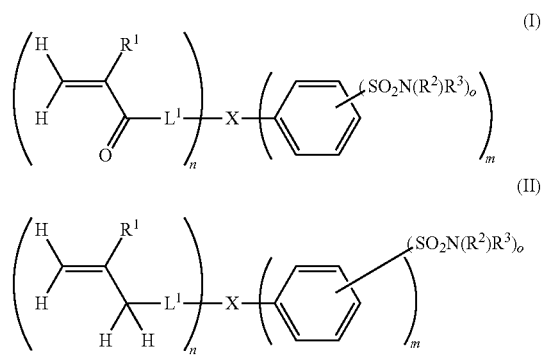

$R^1$ in the preceding formulas represents hydrogen, a $C_{1-10}$ alkyl group, an alkoxymethyl group, an alkyl ester-substituted methyl, or an α-alkoxymethyl group. Hydrogen and the methyl group are preferred and hydrogen is particularly preferred.

$R^2$ and $R^3$ in the preceding formulas each independently represent the hydrogen atom, an alkyl group, an alkynyl group, an alkenyl group, or an aryl group.

When $R^2$ or $R^3$ represents an alkyl group, $C_{1-30}$ is preferred, $C_{1-20}$ is more preferred, and $C_{1-10}$ is particularly preferred therefor.

When $R^2$ or $R^3$ represents an alkynyl group, $C_{1-30}$ is preferred, $C_{1-20}$ is more preferred, and $C_{1-10}$ is particularly preferred therefor.

When $R^2$ or $R^3$ represents an alkenyl group, $C_{2-30}$ is preferred, $C_{2-20}$ is more preferred, and $C_{2-10}$ is particularly preferred therefor.

When $R^2$ or $R^3$ represents an aryl group, $C_{6-30}$ is preferred, $C_{6-20}$ is more preferred, and $C_{6-20}$ is particularly preferred therefor.

$R^2$ and $R^3$ may carry a substituent and, as examples of preferred substituents, may carry a halogen atom, hydroxyl group, carboxyl group, sulfonate group, nitro group, cyano group, amide group, amino group, alkyl group, alkenyl group, alkynyl group, aryl group, substituted oxy group, substituted sulfonyl group, substituted carbonyl group, substituted sulfinyl group, sulfo group, phosphono group, phosphonate group, silyl group, or a heterocycle. $R^2$ and $R^3$ may also each contain, for example, an ether bond, ester bond, ureido bond (—NH—C(O)—NH—), carbonyl group (—C(O)—), amide group (—C(O)—NH—), or ethylenically unsaturated group.

$R^2$ and $R^3$ are preferably the hydrogen atom, an alkyl group, or an alkenyl group and more preferably are the hydrogen atom or an alkyl group. Among the preceding, $R^2$ and $R^3$ each preferably represent hydrogen or a $C_{1-10}$ alkyl group, wherein this alkyl group may be substituted by the hydroxyl group or amino group and may incorporate an ether bond, ester bond, or ureido bond. Hydrogen and methyl are preferred among the preceding.

n is 2 to 10 and is preferably 2 to 8 and more preferably 2 to 6. m is 1 to 10 and is preferably 1 to 5 and more preferably 1 to 3. o is 1 to 5.

$L^1$ is a single bond or a divalent linking group, for example, —O—, —NH—, or —NR—. The substituent represented by R is preferably, for example, a $C_{1-20}$ alkyl group, $C_{2-20}$ alkenyl group, or $C_{2-20}$ alkynyl group, and these groups may contain, for example, a halogen atom, hydroxyl group, carboxyl group, sulfonate group, nitro group, cyano group, amide group, amino group, alkyl group, alkenyl group, alkynyl group, aryl group, substituted oxy group, substituted sulfonyl group, substituted carbonyl group, substituted sulfinyl group, sulfo group, phosphono group, phosphonate group, silyl group, or heterocycle.

X is a trivalent to decavalent organic group composed of nonmetal atoms and, for example, can be composed of at least one element selected from 1 to 60 carbon atoms, 0 to 10 nitrogen atoms, 0 to 50 oxygen atoms, 1 to 100 hydrogen atoms, and 0 to 20 sulfur atoms. A more specific example is an organic group composed of a single one of the following structures or a combination of a plurality of the following structures.

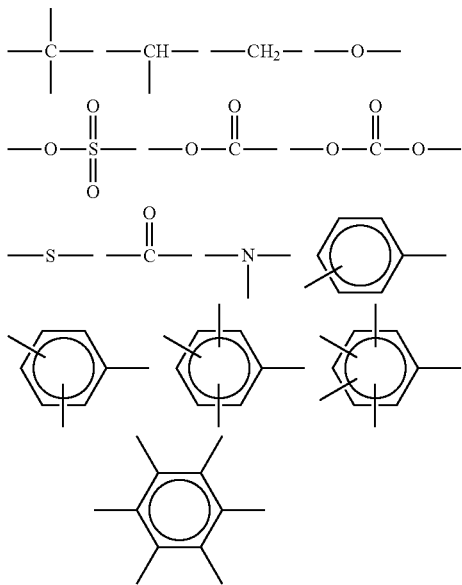

polyvalent naphthalene, polyvalent anthracene

The organic group represented by X may also bear a substituent, and substituents that may be introduced can be exemplified by a halogen atom, hydroxyl group, carboxyl group, sulfonate group, nitro group, cyano group, amide group, amino group, alkyl group, alkenyl group, alkynyl group, aryl group, substituted oxy group, substituted sulfonyl group, substituted carbonyl group, substituted sulfinyl group, sulfo group, phosphono group, phosphonate group, silyl group, and heterocyclic group. The organic group represented by X may also incorporate an ether bond, ester bond, or ureido bond. The organic group represented by X is preferably isocyanuryl, a heterocycle, or a substituted dipropyl ether and is more preferably isocyanuryl or a substituted dipropyl ether.

The polymerizable monomer used in the present invention, which has a sulfonamide group and at least two ethylenically unsaturated groups, preferably also has at least one selected from the ureido bond (—NH—C(O)—NH), urethane bond (—O—C(O)—NH—), and isocyanuric acid structure.

An example is the polymerizable monomer having the isocyanuric acid structure indicated below.

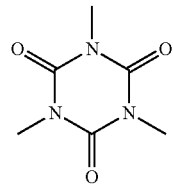

The polymerizable monomer used in the present invention, which has a sulfonamide group and at least two ethylenically unsaturated groups, can also be represented by the following general formula (III) or (IV).

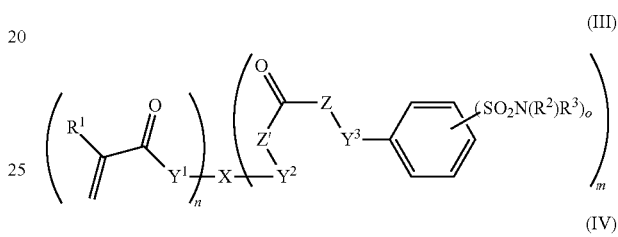

(III)

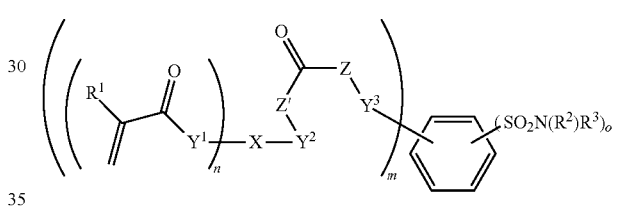

(IV)

$R^1$ in the preceding formulas represents hydrogen, a $C_{1-10}$ alkyl group, an alkoxymethyl group, an alkyl ester-substituted methyl, or an α-alkoxymethyl group. Hydrogen and the methyl group are preferred and hydrogen is particularly preferred.

$R^2$ and $R^3$ in the preceding formulas each independently represent the hydrogen atom, an alkyl group, an alkynyl group, an alkenyl group, or an aryl group.

When $R^2$ or $R^3$ represents an alkyl group, $C_{1-30}$ is preferred, $C_{1-20}$ is more preferred, and $C_{1-10}$ is particularly preferred.

When $R^2$ or $R^3$ represents an alkynyl group, $C_{1-30}$ is preferred, $C_{1-20}$ is more preferred, and $C_{1-10}$ is particularly preferred.

When $R^2$ or $R^3$ represents an alkenyl group, $C_{2-30}$ is preferred, $C_{2-20}$ is more preferred, and $C_{2-10}$ is particularly preferred.

When $R^2$ or $R^3$ represents an aryl group, $C_{6-30}$ is preferred, $C_{6-20}$ is more preferred, and $C_{6-20}$ is particularly preferred.

$R^2$ and $R^3$ may carry a substituent and, as examples of preferred substituents, may carry a halogen atom, hydroxyl group, carboxyl group, sulfonate group, nitro group, cyano group, amide group, amino group, alkyl group, alkenyl group, alkynyl group, aryl group, substituted oxy group, substituted sulfonyl group, substituted carbonyl group, substituted sulfinyl group, sulfo group, phosphono group, phosphonate group, silyl group, or a heterocyclic group. $R^2$ and $R^3$ may also each contain, for example, an ether bond, ester bond, ureido bond (—NH—C(O)—NH—), carbonyl group (—C(O)—), amide group (—C(O)—NH—), or ethylenically unsaturated group.

$R^2$ and $R^3$ are preferably the hydrogen atom, an alkyl group, or an alkenyl group and more preferably are the hydrogen atom or an alkyl group. Hydrogen and methyl are preferred among the preceding.

n is 2 to 8 and is preferably 2 to 6. m is 1 to 5 and is more preferably 1 to 3. o is 1 to 3 and is more preferably 1 to 2.

X is a trivalent to decavalent organic group composed of nonmetal atoms and, for example, can be composed of at least one element selected from 1 to 60 carbon atoms, 0 to 10 nitrogen atoms, 0 to 50 oxygen atoms, 1 to 100 hydrogen atoms, and 0 to 20 sulfur atoms. A more specific example is an organic group composed of a single one of the following structures or a combination of a plurality of the following structures.

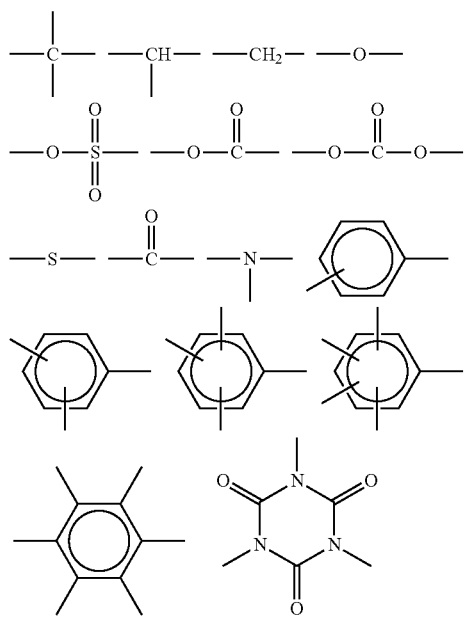

polyvalent naphthalene, isocyanuric acid structure
polyvalent anthracene

The organic group represented by X may also bear a substituent, and substituents that may be introduced can be exemplified by a halogen atom, hydroxyl group, carboxyl group, sulfonate group, nitro group, cyano group, amide group, amino group, alkyl group, alkenyl group, alkynyl group, aryl group, substituted oxy group, substituted sulfonyl group, substituted carbonyl group, substituted sulfinyl group, sulfo group, phosphono group, phosphonate group, silyl group, and heterocyclic group. The organic group represented by X may also incorporate an ether bond, ester bond, ureido bond, or isocyanuric acid structure. The organic group represented by X is preferably isocyanuryl, a heterocycle, or a substituted dipropyl ether and is more preferably isocyanuryl or a substituted dipropyl ether.

The $Y^1$, $Y^2$, and $Y^3$ in the preceding general formulas (III) and (IV) are each independently a single bond or a divalent linking group or a trivalent to decavalent organic group composed of nonmetal atoms, and, for example, can be composed of at least one element selected from 1 to 60 carbon atoms, 0 to 10 nitrogen atoms, 0 to 50 oxygen atoms, 1 to 100 hydrogen atoms, and 0 to 20 sulfur atoms. The divalent linking group that may constitute each of $Y^1$, $Y^2$, and $Y^3$ can be exemplified by an organic group composed of a single one of the structural formulas provided above as specific examples of X or an organic group composed of a combination of a plurality of the structural formulas provided above as specific examples of X. The divalent linking group that may constitute each of $Y^1$, $Y^2$, and $Y^3$ is more specifically exemplified by a $C_{1-10}$ alkyl chain and alkyleneoxy groups.

The Z and Z' in general formulas (III) and (IV) each represent a single bond, O, or NH. The —Z—C(O)—Z'— in the preceding formulas can be exemplified by the ureido bond (—NH—C(O)—NH—) and the urethane bond (—O—C(O)—NH—).

The polymerizable monomer in the present invention preferably has an arylsulfonamide group, at least two ethylenically unsaturated groups, and at least one selected from the ureido bond, urethane bond, and isocyanuric acid structure.

The specific compounds (1-a) to (7-k) provided below are examples that correspond to the polymerizable monomer used in the present invention and having the previously indicated general formula (I), (II), (III), or (IV); however, the present invention is not limited to these.

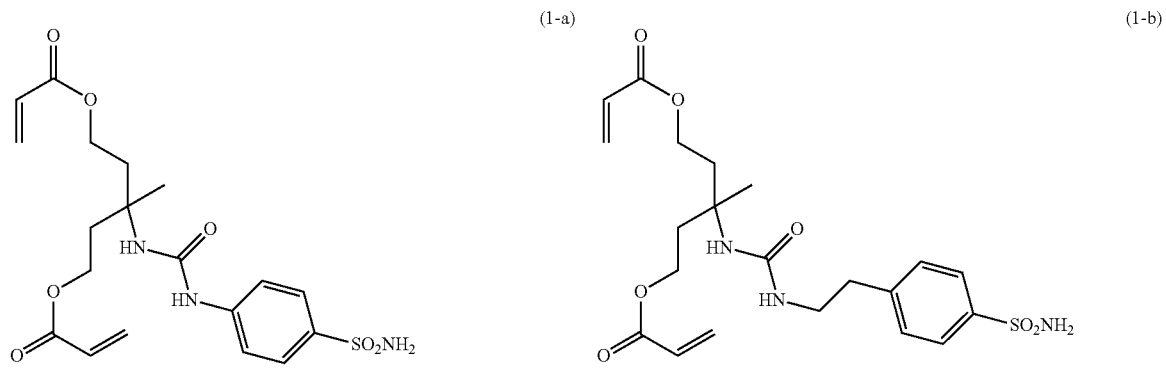

-continued
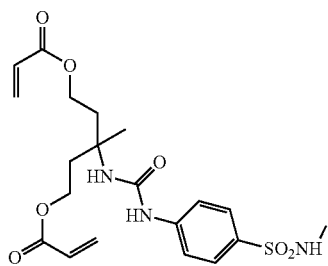
(1-c)
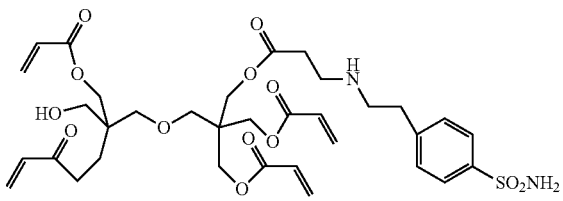
(2-a)
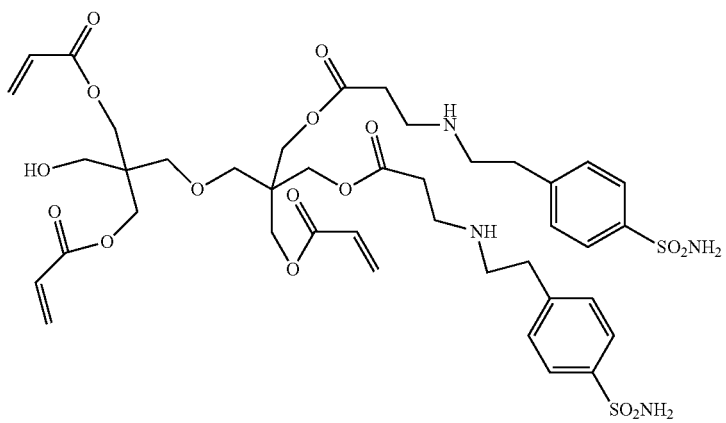
(2-b)
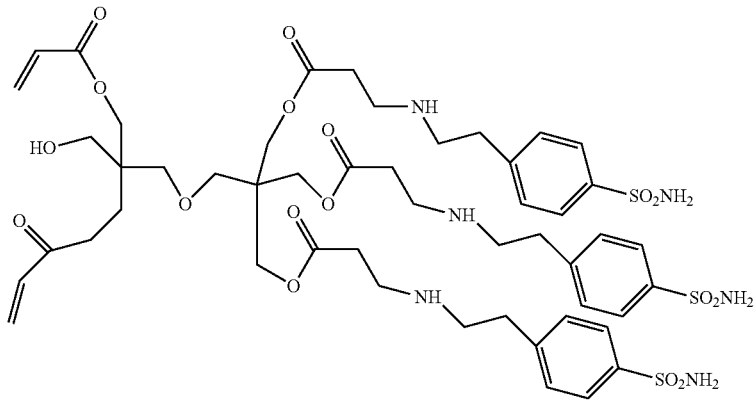
(2-c)
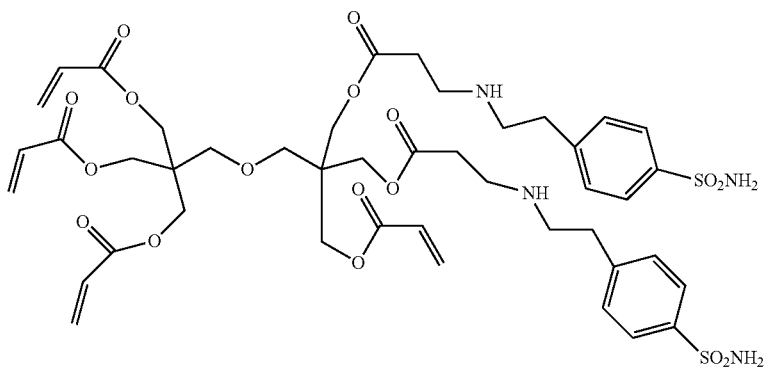
(2-d)

(2-e)
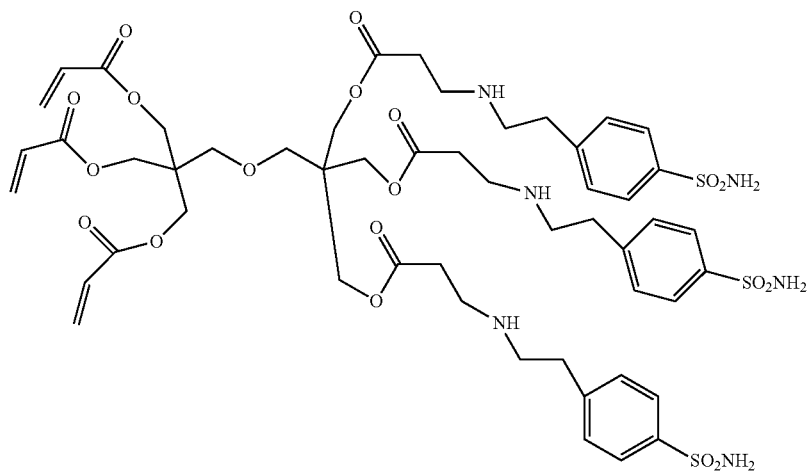
(3-a)
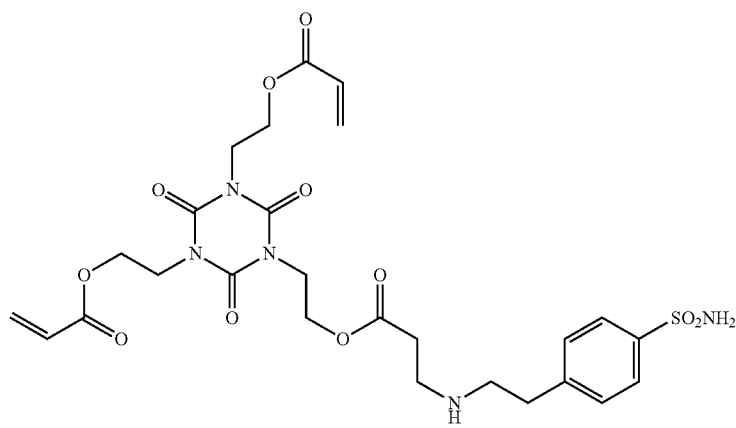
(3-b)
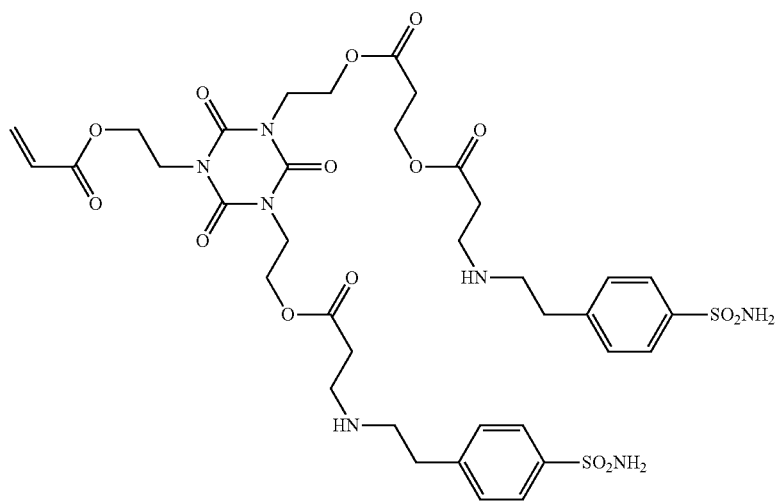

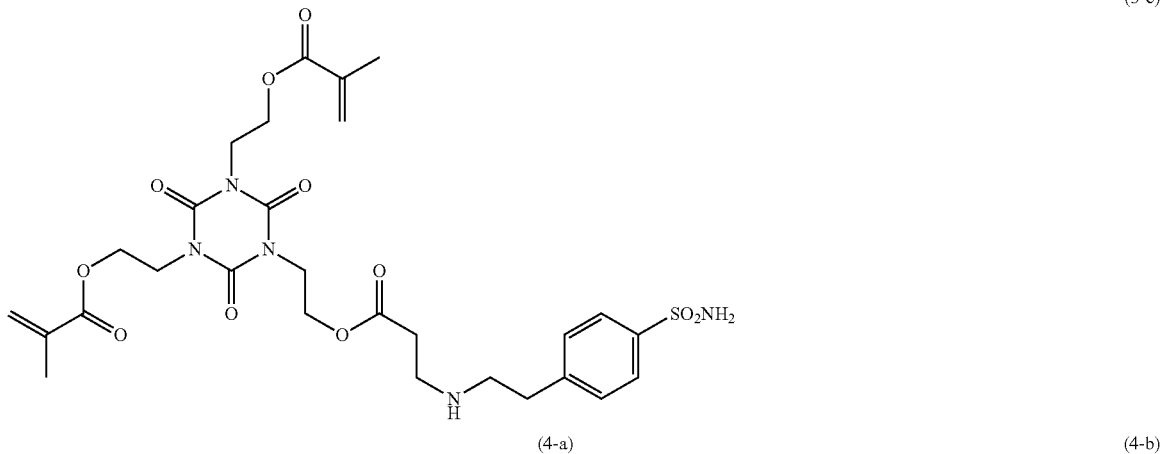
(3-c)
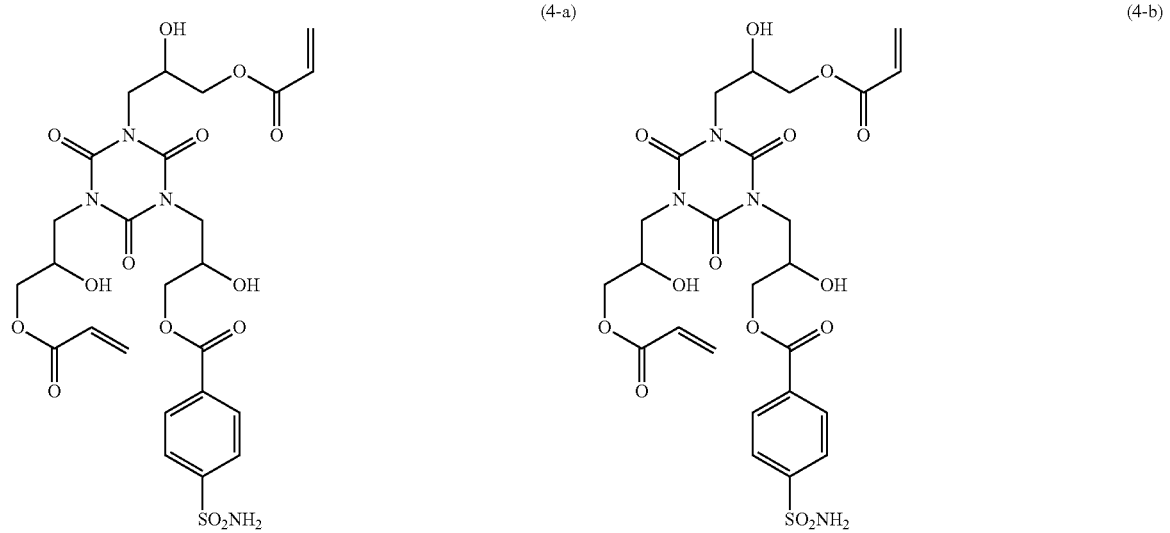
(4-a) (4-b)
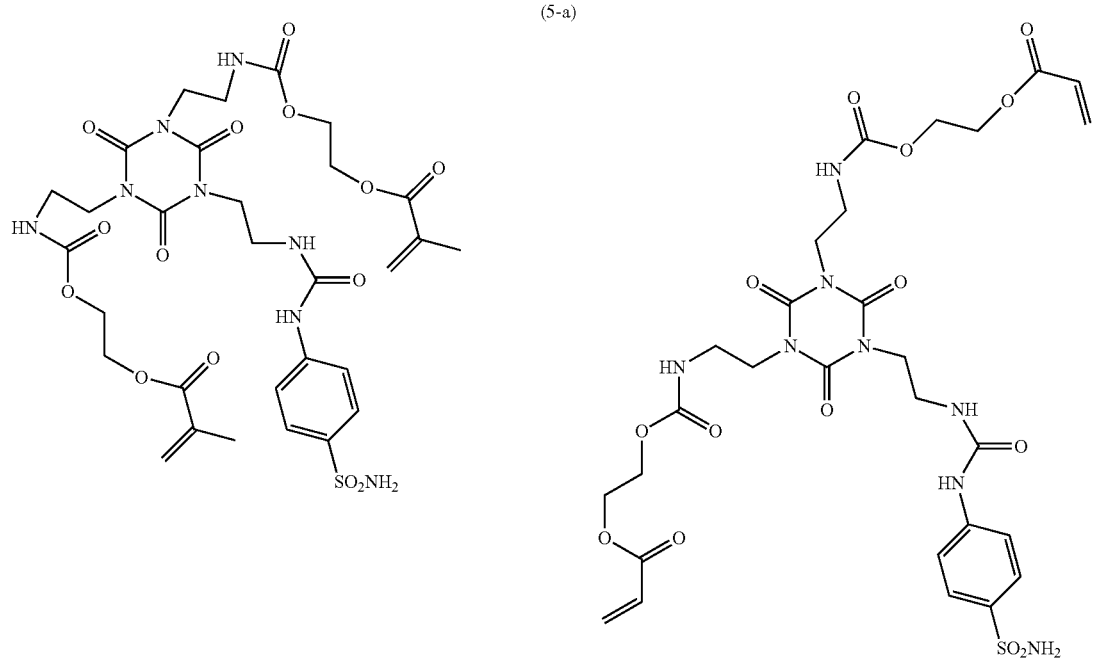
(5-a) (5-b)

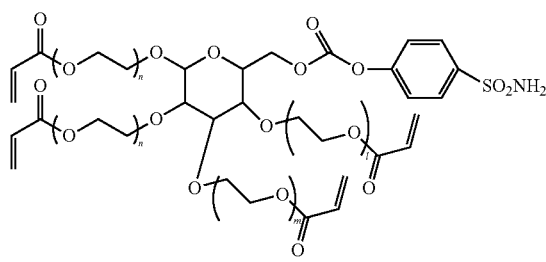
(6-a)
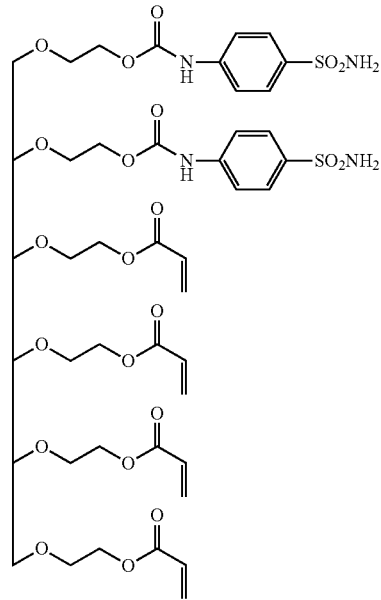
(6-b)
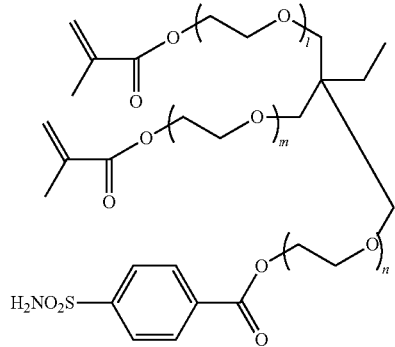
(6-c)
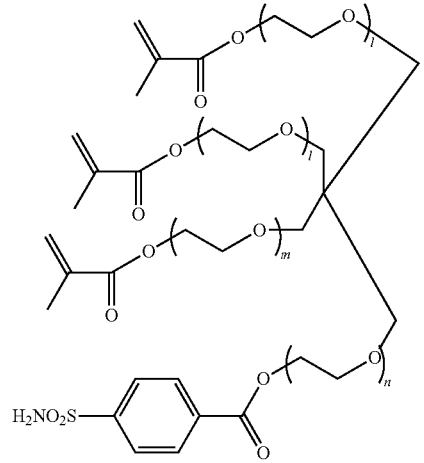
(6-d)
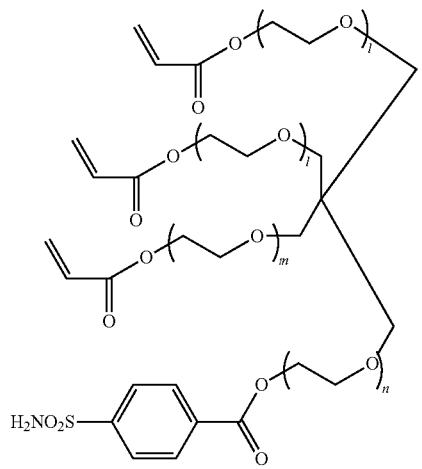
(6-e)
*l, m, n* = 2-15 l, m, and n in the preceding (6-a) to (6-e) each represent a number in the range from 2 to 15.
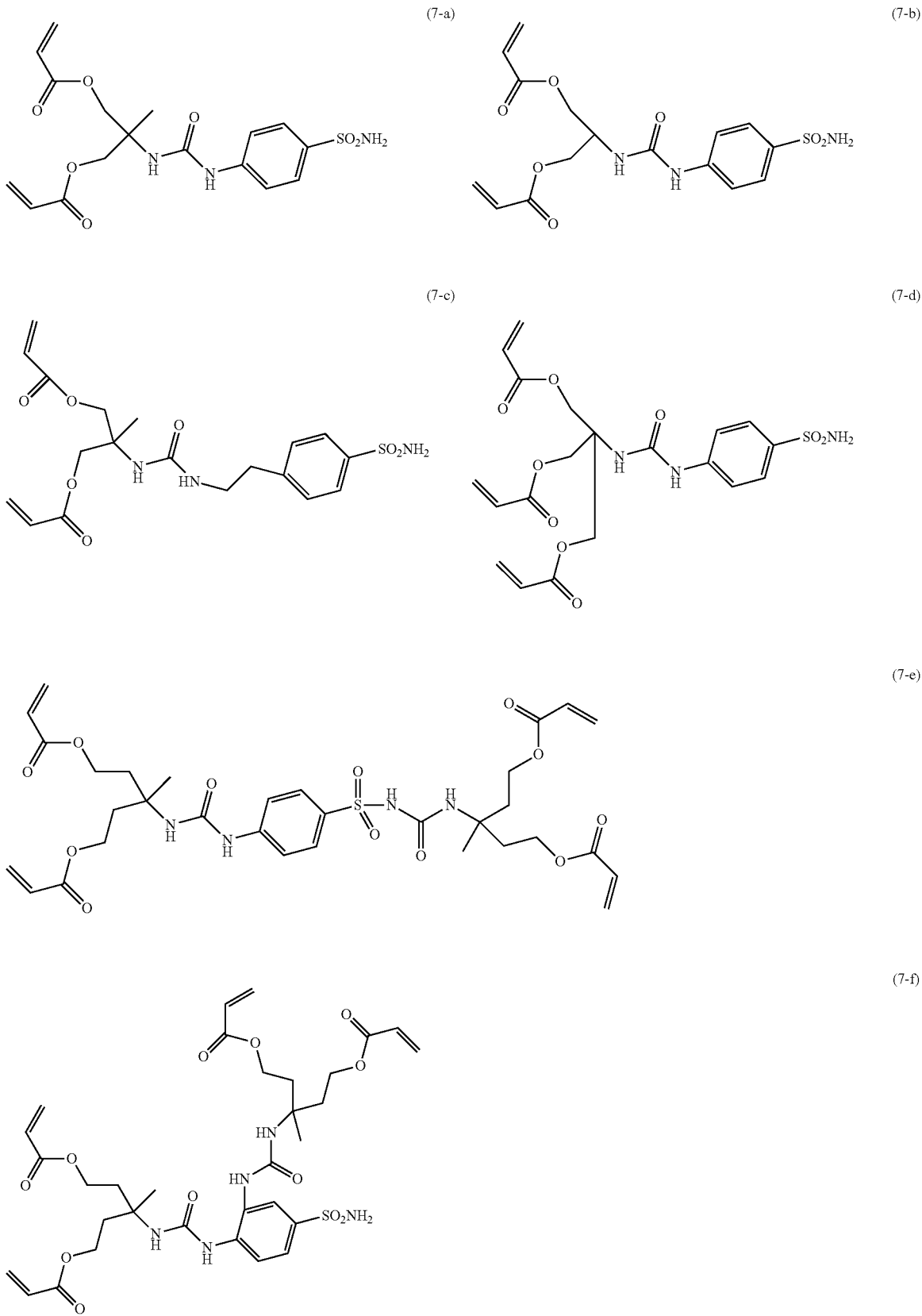

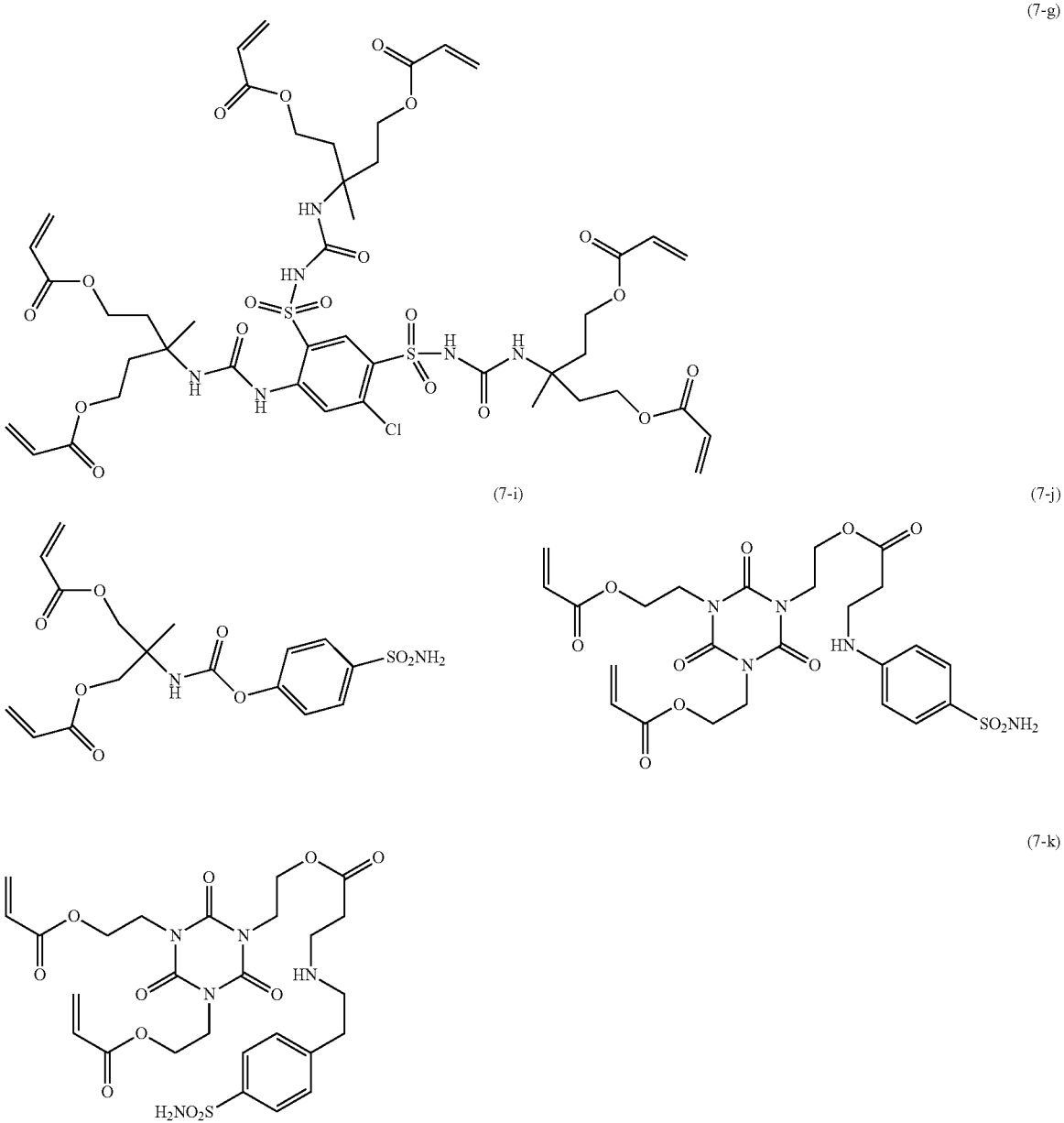

Examples are provided below of methods for producing the monomer described hereinabove.

Method 1 for Producing the Sulfonamide-Containing Monomer 1 equivalent of 4-(2-aminoethyl)benzenesulfonamide is added to 1 equivalent of di(2-acryloylethyl)-1-methylmethyl isocyanate in N-methylpyrrclidone solvent; heating and stirring are carried out for 6 hours at 60° C. in the presence of a small amount of the bismuth catalyst, Neostan U-600 (Nitto Kasei Co., Ltd.); and purification then yields 1-a.

Method 2 for Producing the Sulfonamide-Containing Monomer 1 equivalent of 4-(2-aminoethyl)benzenesulfonamide is added to 1 equivalent of dipentaerythritol pentaacrylate (SR-399, Sartomer) in acetone solvent; heating is carried out for 6 hours at 70° C.; and purification then yields 2-a.

Method 3 for Producing the Sulfonamide-Containing Monomer 1 equivalent of betaine and 1 equivalent of sulfanylbenzoic acid are added to triglycidyl isocyanurate in N-methylpyrrolidone solvent; heating is carried out for 6 hours at 90° C.; and purification then yields 4-a.

Method 4 for Producing the Sulfonamide-Containing Monomer 4 equivalents of acryloyl chloride were added dropwise at 0° C. in the presence of triethylamine to 1 equivalent of 1,2,3,4,5,6-hexahydroxyhexane in N-methylpyrrolidone solvent; the temperature was raised to room temperature and stirring was performed for 2 hours; 2 equivalents of methyl 4-sulfanylbenzoate were then added; a small amount of concentrated sulfuric acid was added dropwise; and heating was then carried out to 100° C. and a reaction was run for 6 hours. Purification then yields 6-b.

The quantity of addition of the polymerizable monomer to the image recording layer in the lithographic printing plate precursor of the present invention is suitably 0.1 to 50 mass % of the total solids fraction of the image recording layer. This quantity of addition is more preferably in the range from 1.0 to 40 mass % and is even more preferably in the range from 5.0 to 30 mass %. An excellent scumming resistance and an excellent printing durability are obtained in these ranges.

Two or more of the polymerizable monomers as described hereinabove may be used in the image recording layer.

In addition to its incorporation in the image recording layer, the previously described polymerizable monomer may also be incorporated in an undercoat layer and/or in a protective layer. The quantity of addition to the undercoat layer or protective layer is preferably not more than 10 mass % of the total solids fraction in the protective layer. A single one of these compounds may be used or a combination of two or more may be used.

The Image Recording Layer

The constituent components of the image recording layer are more particularly described below.

The image recording layer used in the present invention is an image recording layer that post-photoexposure can form an image by the removal of the nonphotoexposed regions on the press by feeding printing ink and fountain solution or that post-photoexposure can form an image by treatment with a gum solution. An example of a typical on-press-developable or gum-developable image-forming structure that may be present in the image recording layer is an embodiment that comprises (A) an infrared absorber, (B) a radical polymerization initiator, and (C) a polymerizable compound and that cures into an image region via a polymerization reaction. A (D) hydrophobing precursor may also be incorporated.

The image recording layer in the lithographic printing plate precursor of the present invention can also be implemented as an image recording layer that is alkaline-developable using a conventional alkaline developing solution.

The components that may be present in the image recording layer are individually described below.

<The Sensitizing Dye (A)>

The image recording layer of the present invention can contain a sensitizing dye that exhibits absorption at 350 to 450 nm or in the infrared region (760 to 1200 nm) in correspondence to the wavelength of the photoexposure light source.

Sensitizing dyes that exhibit an absorption maximum in the 350 to 450 nm wavelength region will be described first. This type of sensitizing dye can be exemplified by the merocyanine dyes represented by general formula (I) below, the coumarins and benzopyrans represented by general formula (II) below, the aromatic ketones represented by general formula (III) below, and the anthracenes represented by general formula (IV) below.

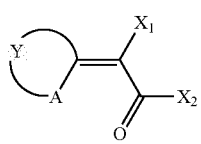
(I)

(In formula, A represents a sulfur atom or $NR_6$ wherein $R_6$ represents a monovalent nonmetal atomic group; Y represents a nonmetal atomic group that forms the basic nucleus of the dye in cooperation with an adjacent A and an adjacent carbon atom; and $X^1$ and $X^2$ each independently represent a monovalent nonmetal atomic group wherein $X^1$ and $X^2$ may be bonded to each other to form the acidic nucleus of the dye.)

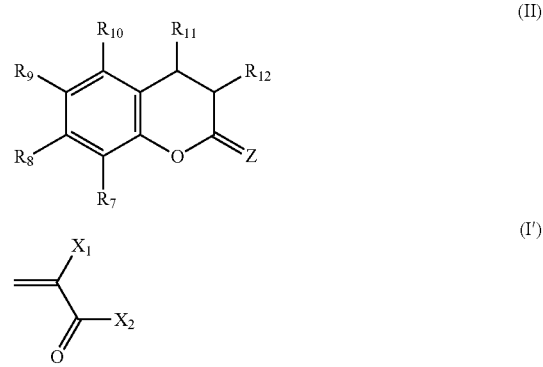

(In formula, =Z represents the carbonyl group, thiocarbonyl group, imino group, or the alkylidene group represented by the partial structural formula (1') above; $X_1$ and $X_2$ have the same definition as for general formula (2); and $R_7$ to $R_{12}$ each independently represent a monovalent nonmetal atomic group.)

(In formula, $Ar_3$ represents a possibly substituted aromatic group or heteroaromatic group and $R_{13}$ represents a monovalent nonmetal atomic group. Aromatic groups and heteroaromatic groups are more preferred for $R_{13}$, and $Ar_3$ and $R_{13}$ may be bonded to one another to form a ring.)

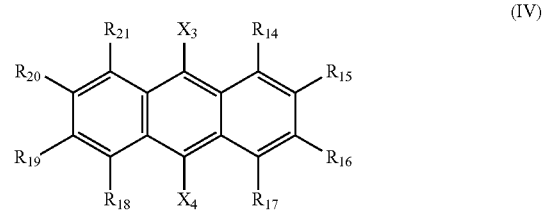

(In formula, $X_3$, $X_4$, and $R_{14}$ to $R_{21}$ each independently represent a monovalent nonmetal atomic group. Electron-donating groups having a negative Hammett substituent constant are more preferred for $X_3$ and $X_4$.)

The following are preferred examples of the monovalent nonmetal atomic group represented by $X_1$ to $X_4$ and $R_6$ to $R_{21}$ in general formulas (I) to (IV): the hydrogen atom, alkyl (for example, methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl, 2-norbornyl, chloromethyl, bromomethyl, 2-chloroethyl, trifluoromethyl, methoxymethyl, methoxyethoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoyl ethyl, N-methyl-N-(sulfophenyl)carbamoylmethyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl, phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonooxypropyl, phosphonatooxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl, 3-butynyl, and so forth), aryl (for example, phenyl, biphenyl, naphthyl, tolyl, xylyl, mesityl, cumenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxyphenylcarbonyl, phenoxycarbonylphenyl, N-phenylcarbamoylphenyl, phenyl, cyanophenyl, sulfophenyl, sulfonatophenyl, phosphonophenyl, phosphonatophenyl, and so forth), heteroaryl (for example, thiophene, thianthrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthyridine, quinazoline, cinnoline, pteridine, carbazole, carboline, phenanthrene, acridine, perimidine, phenanthroline, phthalazine, phenarsazine, phenoxazine, furazan, phenoxazine and so forth), alkenyl (for example, vinyl, 1-propenyl, 1-butenyl, cinnamyl, 2-chloro-1-ethenyl, and so forth), alkynyl (for example, ethynyl, 1-propynyl, 1-butynyl, trimethylsilylethynyl, and so forth), halogen atoms (—F, —Br, —Cl, —I), the hydroxyl group, alkoxy, aryloxy, the mercapto group, alkylthio, arylthio, alkyldithio, aryldithio, the amino group, N-alkylamino, N,N-dialkylamino, N-arylamino, N,N-diarylamino, N-alkyl-N-arylamino, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, acylthio, acylamino, N-alkylacylamino, N-arylacylamino, the ureido group, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N',N'-dialkyl-N-alkylureido, N',N'-dialkyl-N-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, N-aryl-N-aryloxycarbonylamino, the formyl group, acyl, the carboxyl group, alkoxycarbonyl, aryloxycarbonyl, the carbamoyl group, N-alkylcarbamoyl, N,N-dialkylcarbamoyl, N-arylcarbamoyl, N,N-diarylcarbamoyl, N-alkyl-N-arylcarbamoyl, alkylsufinyl, arylsulfinyl, alkylsulfonyl, arylsulfonyl, the sulfo group (—SO$_3$H) and its conjugate base (referred to below as the sulfonato group), alkoxysulfonyl, aryloxysulfonyl, sulfinamoyl, N-alkylsulfinamoyl, N,N-dialkylsulfinamoyl, N-arylsulfinamoyl, N,N-diarylsulfinamoyl, N-alkyl-N-arylsulfinamoyl, sulfamoyl, N-alkylsulfamoyl, N,N-dialkylsulfamoyl, N-arylsulfamoyl, N,N-diarylsulfamoyl, N-alkyl-N-arylsulfamoyl, the phosphono group (—PO$_3$H$_2$) and its conjugate base (referred to below as the phosphonato group), dialkylphosphono (—PO$_3$(alkyl)$_2$), diarylphosphono (—PO$_3$(aryl)$_2$), alkylarylphosphono (—PO$_3$(alkyl)(aryl)), monoalkylphosphono (—PO$_3$H(alkyl)) and its conjugate base (referred to below as the alkylphosphonato group), monoarylphosphono (—PO$_3$H(aryl)) and its conjugate base (referred to below as the arylphosphonato group), phosphonooxy (—OPO$_3$H$_2$) and its conjugate base (referred to below as the phosphonatooxy group), dialkylphosphonooxy (—OPO$_3$H(alkyl)$_2$), diarylphosphonooxy (—OPO$_3$(aryl)$_2$), alkylarylphosphonooxy (—OPO$_3$(aryl)(alkyl)), monoalkylphosphonooxy (—OPO$_3$H(alkyl)) and its conjugate base (referred to below as the alkylphosphonatooxy group), monoarylphosphonooxy (—OPO$_3$H(aryl)) and its conjugate base (referred to below as the arylphosphonatooxy group), the cyano group, the nitro group, and so forth. The following are particularly preferred among the substituents cited above: the hydrogen atom, alkyl groups, aryl groups, halogen atoms, alkoxy groups, and acyl groups.

5-, 6-, and 7-membered nitrogenous or sulfur-containing heterocycles are examples of the basic nucleus of the dye that is formed in general formula (I) by Y in cooperation with the adjacent A and the adjacent carbon atom, and 5- and 6-membered heterocycles are preferred.

Suitable examples of the nitrogenous heterocycle are the nitrogenous heterocycles known to constitute the basic nucleus in the merocyanine dyes described in, for example, L. G. Brooker et al., *J. Am. Chem. Soc.*, 73, 5326-5358 (1951) and in the references cited therein. The following are specific examples: thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole, and so forth), benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxy-benzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole, 5-ethoxycarbonylbenzothiazole, and so forth), naphthothiazoles (for example, naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole, 7-methoxynaphtho[1,2]thiazole, and so forth), thianaphtheno-7',6',4,5-thiazoles (for example, 4'-methoxythianaphtheno-7',6',4,5-thiazole and so forth), oxazoles (for example, 4-methyloxazole, 5-methyloxazole, 4-phenyloxazole, 4,5-diphenyloxazole, 4-ethyloxazole, 4,5-dimethyloxazole, 5-phenyloxazole, and so forth), benzoxazoles (benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, 6-hydroxybenzoxazole, and so forth), naphthoxazoles (for example, naphtho[1,2]oxazole, naphtho[2,1]oxazole, and so forth), selenazoles (for example, 4-methylselenazole, 4-phenylselenazole, and so forth), benzoselenazoles (for example, benzoselenazole, 5-chlorobenzoselenazole, 5-methoxybenzoselenazole, 5-hydroxybenzoselenazole, tetrahydrobenzoselenazole, and so forth), naphthoselenazoles (for example, naphtho[1,2]selenazole, naphtho[2,1]selenazole, and so forth), thiazolines (for example, thiazoline, 4-methylthiazoline, and so forth), 2-quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, 8-hydroxyquinoline, and so forth), 4-quinolines (for example, quinoline, 6-methoxyquinoline, 7-methylquinoline, 8-methylquinoline, and so forth), 1-isoquinolines (for example, isoquinoline, 3,4-dihydroisoquinoline, and so forth), 3-isoquinolines (for example, isoquinoline and so forth), benzimidazoles (for example, 1,3-diethylbenzimidazole, 1-ethyl-3-phenylbenzimidazole, and so forth), 3,3-dialkylindolenines (for example, 3,3-dimethylindolenine, 3,3,5-trimethylindolenine, 3,3,7-trimethylindolenine, and so forth), 2-pyridines (for example, pyridine, 5-methylpyridine, and so forth), 4-pyridines (for example, pyridine and so forth), and so forth.

The sulfur-containing heterocycles can be exemplified by the dithiol substructures in the dyes in, for example, Japanese Patent Application Publication No. Hei 3-296759.

Specific examples are benzodithiols (for example, benzodithiol, 5-t-butylbenzodithiol, 5-methylbenzodithiol, and so forth), naphthodithiols (for example, naphtho[1,2]dithiol, naphtho[2,1]dithiol, and so forth), dithiols (for example, 4,5-dimethyldithiols, 4-phenyldithiols, 4-methoxycarbonyldithiols, 4,5-dimethoxycarbonyldithiols, 4,5-ditrifluoromethyldithiol, 4,5-dicyanodithiol, 4-methoxycarbonylmethyldithiol, 4-carboxymethyldithiol, and so forth), and so forth.

The nomenclature used in the preceding description of the heterocycles has used the name of the parent heterocycle skeleton both for the sake of convenience and in keeping with customary usage; however, when the heterocycle forms the basic skeleton substructure in the sensitizing dye, it is introduced in the form of the alkylidene-type substituent, which is lowered by one degree of unsaturation, such as 3-substituted-2(3H)-benzothiazolylidene for the example of the benzothiazole skeleton.

Among sensitizing dyes that have an absorption maximum in the 360 nm to 450 nm wavelength region, dyes represented by the following general formula (V) are preferred for their high sensitivity.

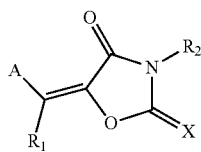

(V)

(In general formula (V), A represents a possibly substituted aromatic ring or heterocycle and X represents the oxygen atom, sulfur atom, or N—$R_3$. $R_1$, $R_2$, and $R_3$ each independently represent a hydrogen atom or a monovalent nonmetal atomic group; A and $R_1$, and $R_2$ and $R_3$ may be bonded to each to form an aliphatic or aromatic ring.)

General formula (V) is described more particularly in the following. $R_1$, $R_2$, and $R_3$ each independently represent a hydrogen atom or a monovalent nonmetal atomic group and preferably represent a substituted or unsubstituted alkyl group, substituted or unsubstituted alkenyl group, substituted or unsubstituted aryl group, the residue of a substituted or unsubstituted aromatic heterocycle, a substituted or unsubstituted alkoxy group, a substituted or unsubstituted alkylthio group, the hydroxyl group, or a halogen atom.

Preferred specific examples of $R^1$, $R^2$, and $R^3$ are provided. Preferred examples of the alkyl are $C_{1-20}$ straight chain alkyl, branched alkyl, and cyclic alkyl, wherein specific examples thereof are methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl, and 2-norbornyl. More preferred thereamong are $C_{1-12}$ straight chain alkyl, $C_{3-12}$ branched alkyl, and $C_{5-10}$ cyclic alkyl.

A monovalent nonmetal atomic group, excluding hydrogen, can be used for the substituent on the substituted alkyl, and preferred examples of this substituent are as follows: halogen atoms (—F, —Br, —Cl, —I), the hydroxyl group, alkoxy, aryloxy, the mercapto group, alkylthio, arylthio, alkyldithio, aryldithio, the amino group, N-alkylamino, N,N-dialkylamino, N-arylamino, N,N-diarylamino, N-alkyl-N-arylamino, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, acylthio, acylamino, N-alkylacylamino, N-arylacylamino, the ureido group, N'-alkylureido, N',N'-dialkylureido, N'-arylureido, N',N'-diarylureido, N'-alkyl-N'-arylureido, N-alkylureido, N-arylureido, N'-alkyl-N-alkylureido, N'-alkyl-N-arylureido, N',N'-dialkyl-N-alkylureido, N',N'-dialkyl-N-arylureido, N'-aryl-N-alkylureido, N'-aryl-N-arylureido, N',N'-diaryl-N-alkylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, N-aryl-N-aryloxycarbonylamino, formyl, acyl, the carboxyl group, alkoxycarbonyl, aryloxycarbonyl, the carbamoyl group, N-alkylcarbamoyl, N,N-dialkylcarbamoyl, N-arylcarbamoyl, N,N-diarylcarbamoyl, N-alkyl-N-arylcarbamoyl, alkylsufinyl, arylsulfinyl, alkylsulfonyl, arylsulfonyl, the sulfo group (—$SO_3H$) and its conjugate base (referred to below as the sulfonato group), alkoxysulfonyl, aryloxysulfonyl, sulfinamoyl, N-alkylsulfinamoyl, N,N-dialkylsulfinamoyl, N-arylsulfinamoyl, N,N-diarylsulfinamoyl, N-alkyl-N-arylsulfinamoyl, sulfamoyl, N-alkylsulfamoyl, N,N-dialkylsulfamoyl, N-arylsulfamoyl, N,N-diarylsulfamoyl, N-alkyl-N-arylsulfamoyl, the phosphono group (—$PO_3H_2$) and its conjugate base (referred to below as the phosphonato group)dialkylphosphono (—$PO_3(alkyl)_2$), diarylphosphono (—$PO_3(aryl)_2$), alkylarylphosphono (—$PO_3(alkyl)(aryl)$), monoalkylphosphono (—$PO_3H(alkyl)$) and its conjugate base (referred to below as the alkylphosphonato group), monoarylphosphono (—$PO_3H(aryl)$) and its conjugate base (referred to below as the arylphosphonato group), phosphonooxy (—$OPO_3H_2$) and its conjugate base (referred to below as the phosphonatooxy group), dialkylphosphonooxy (—$OPO_3(alkyl)_2$), diarylphosphonooxy (—$OPO_3(aryl)_2$), alkylarylphosphonooxy (—$OPO_3(alkyl)(aryl)$), monoalkylphosphonooxy (—$OPO_3H(alkyl)$) and its conjugate base (referred to below as the alkylphosphonatooxy group), monoarylphosphonooxy (—$OPO_3H(aryl)$) and its conjugate base (referred to below as the arylphosphonatooxy group), the cyano group, the nitro group, aryl, heteroaryl groups, alkenyl, and alkynyl.

The alkyl moiety in these substituents is specifically exemplified by the previously described alkyl. The following are specific examples of the aryl: phenyl, biphenyl, naphthyl, tolyl, xylyl, mesityl, cumenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxyphenylcarbonyl, phenoxycarbonylphenyl, N-phenylcarbamoylphenyl, phenyl, cyanophenyl, sulfophenyl, sulfonatophenyl, phosphonophenyl, phosphonatophenyl, and so forth.

The heteroaryl group preferred for $R^1$, $R^2$, and $R^3$ is a monocyclic or polycyclic aromatic ring that contains at least one type selected from the nitrogen atom, oxygen atom, and sulfur atom, and particularly preferred examples of the heteroaryl groups are as follows: thiophene, thianthrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthyridine, quinazoline, cinnoline, pteridine, carbazole, carboline, phenanthrene, acridine, perimidine, phenanthroline, phthalazine, phenarsazine, phenoxazine, furazan, phenoxazine and so forth. These groups may additionally be a condensed ring system with benzene or may bear a substituent.

The alkenyl group preferred for $R^1$, $R^2$, and $R^3$ is exemplified by vinyl, 1-propenyl, 1-butenyl, cinnamyl, 2-chloro-1-ethenyl, and so forth. The alkynyl is exemplified by ethynyl, 1-propynyl, 1-butynyl, trimethylsilylethynyl, and so forth. $G^1$ in the acyl group ($G^1CO$—) can be exemplified by the hydrogen atom and the preciously described alkyl and aryl. More preferred among these substituents are halogen atoms (—F, —Br, —I), alkoxy, aryloxy, alkylthio, arylthio, N-alkylamino, N,N-dialkylamino, acyloxy, N-alkylcarbamoyloxy, N-arylcarbamoyloxy, acylamino, formyl, acyl, the carboxyl group, alkoxycarbonyl, aryloxycarbonyl, carbamoyl, N-alkylcarbamoyl, N,N-dialkylcarbamoyl, N-arylcarbamoyl, N-alkyl-N-arylcarbamoyl, the sulfo group, sulfonato, sulfamoyl, N-alkylsulfamoyl, N,N-dialkylsulfamoyl, N-arylsulfamoyl, N-alkyl-N-arylsulfamoyl, phosphono, phosphonato, dialkylphosphono, diarylphosphono, monoalkylphosphono, alkylphosphonato, monoarylphosphono, arylphosphonato, phosphonooxy, phosphonatooxy, and aryl.

The alkylene moiety in the substituted alkyl is, for example, the divalent organic residue obtained by removing any one of the hydrogen atoms on the $C_{1-20}$ alkyl described above, and preferred examples thereof are $C_{1-12}$ straight chain alkylene, $C_{3-12}$ branched alkylene, and $C_{5-10}$ cyclic alkylene.

The following are specific examples of substituted alkyl preferred for $R^1$, $R^2$, and $R^3$ and obtained by combining alkylene with a substituent as described above: chloromethyl, bromomethyl, 2-chloroethyl, trifluoromethyl, methoxymethyl, methoxyethoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfobutyl, sulfonatopropyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl, phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonooxypropyl, phosphonatooxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl, 3-butynyl, and so forth.

Specific examples of aryl groups preferred for $R^1$, $R^2$, and $R^3$ are aryl groups in which from one to three benzene rings form a condensed ring system and aryl groups in which a benzene ring forms a condensed ring system with a 5-membered heterocycle. Specific examples here are phenyl, naphthyl, anthryl, phenanthryl, indenyl, acenaphthenyl, and fluorenyl, wherein phenyl and naphthyl are more preferred thereamong.

Specific examples of substituted aryl groups preferred for $R^1$, $R^2$, and $R^3$ are substituted aryl groups that have a monovalent nonmetal atomic group (excluding the hydrogen atom) as a substituent on a ring-forming carbon atom present in an aryl group as described above. Examples of preferred substituents are the previously described alkyl and substituted alkyl and the substituents previously cited for the substituted alkyl. Preferred examples of the substituted aryl are as follows: biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, ethylaminophenyl, diethylaminophenyl, morpholinophenyl, acetyloxyphenyl, benzyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl)carbamoylphenyl, sulfophenyl, sulfonatophenyl, sulfamoylphenyl, N-ethylsulfamoylphenyl, N,N-dipropylsulfamoylphenyl, N-tolylsulfamoylphenyl, N-methyl-N-(phosphonophenyl)sulfamoylphenyl, phosphonophenyl, phosphonatophenyl, diethylphosphonophenyl, diphenylphosphonophenyl, methylphosphonophenyl, methylphosphonatophenyl, tolylphosphonophenyl, tolylphosphonatophenyl, allyl, 1-propenylmethyl, 2-butenyl, 2-methylallylphenyl, 2-methylpropenylphenyl, 2-propynylphenyl, 2-butynyiphenyl, 3-butynylphenyl, and so forth.

The group A in general formula (V) is described in the following. This A represents a possibly substituted aromatic ring or heterocycle, and this possibly substituted aromatic ring and heterocycle are specifically exemplified by the same groups provided for $R^1$, $R^2$, and $R^3$ in general formula (V).

The sensitizing dye with general formula (V) of the present invention is obtained by a condensation reaction between an active methylene-containing acidic nucleus or an acidic nucleus as shown above and a substituted or unsubstituted aromatic ring or substituted or unsubstituted heterocycle, and these can be synthesized with reference to Japanese Patent Publication No. Sho 59-28329.

The following (D1) to (D75) are preferred specific examples of compounds represented by general formula (V). In those instances in which isomers are created due to the double bond connecting the acidic nucleus to the basic nucleus, there is no limitation to either or any isomer.

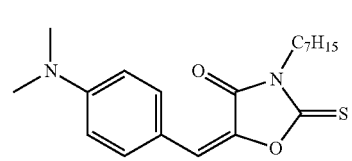

(D1)

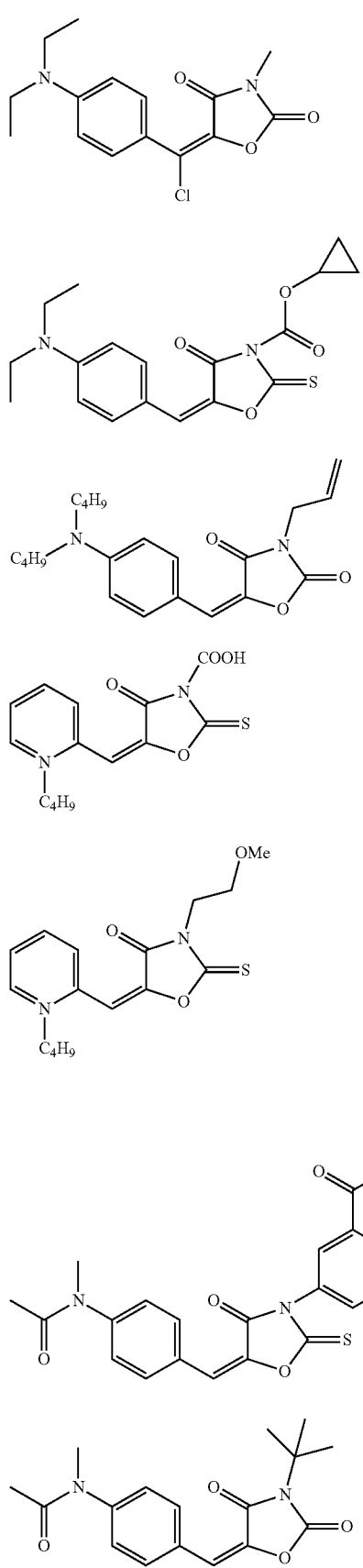
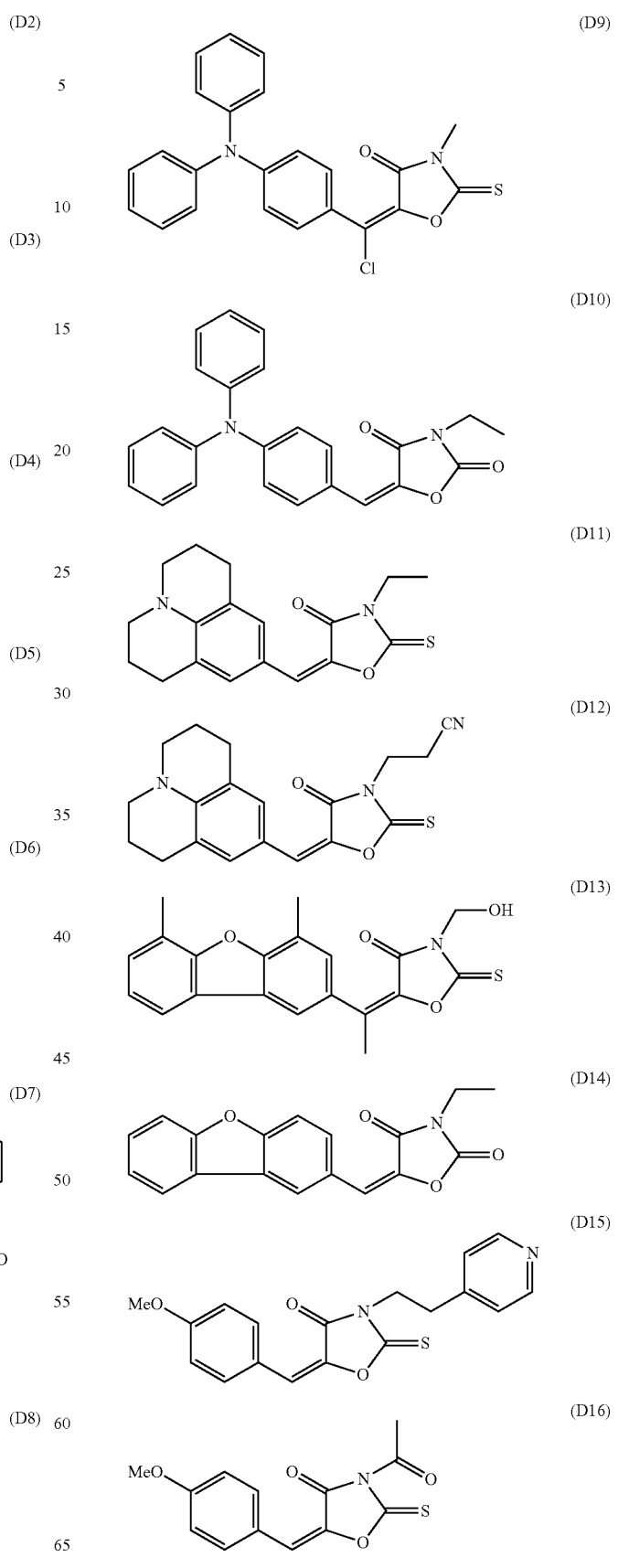

(D17)
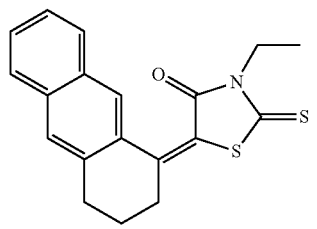
(D18)
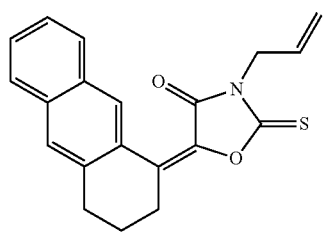
(D19)
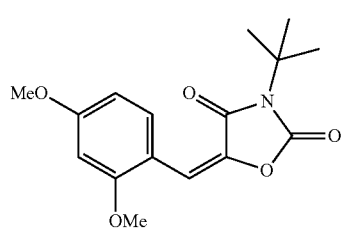
(D20)
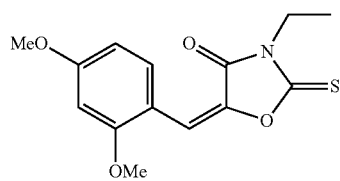
(D21)
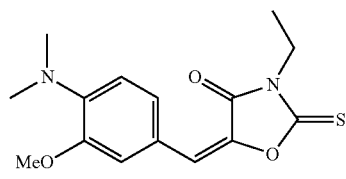
(D22)
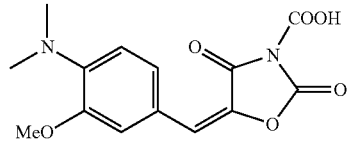
(D23)
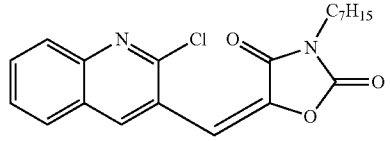
(D24)
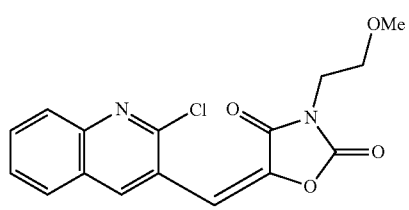
(D25)
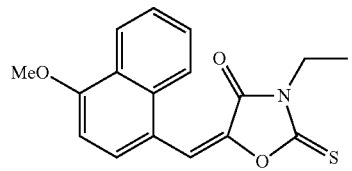
(D26)
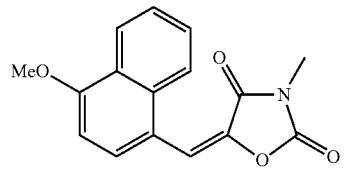
(D27)
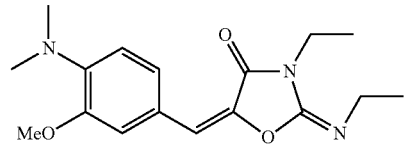
(D28)
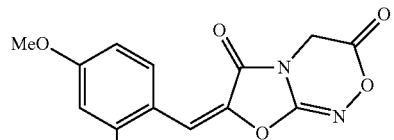
(D29)
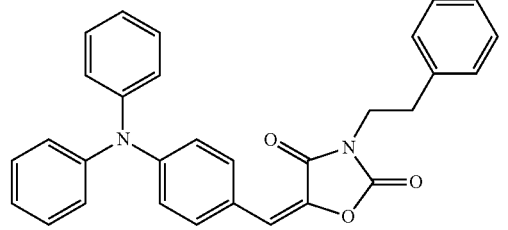
(D30)
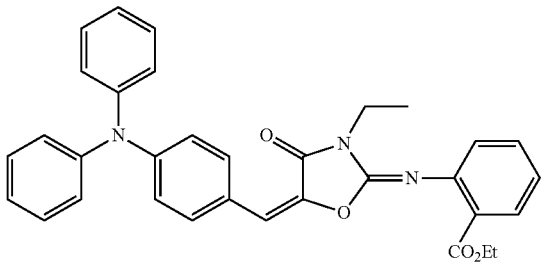
(D31)
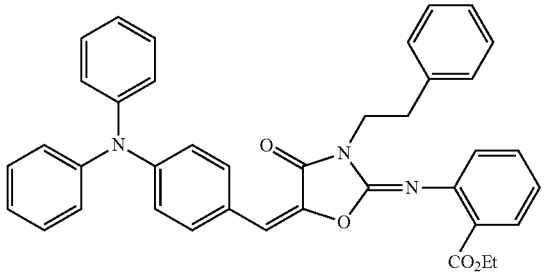

(D32)
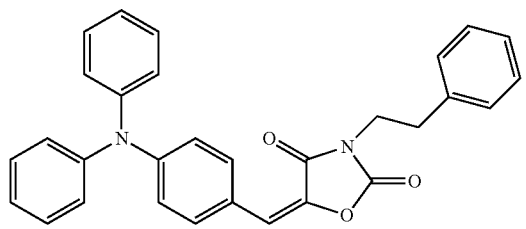
(D33)
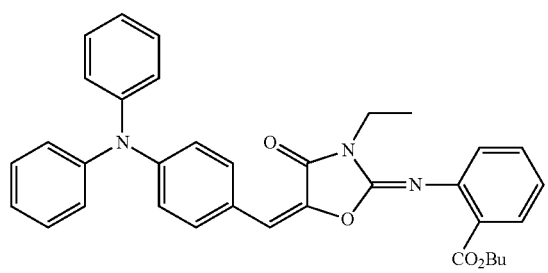
(D34)
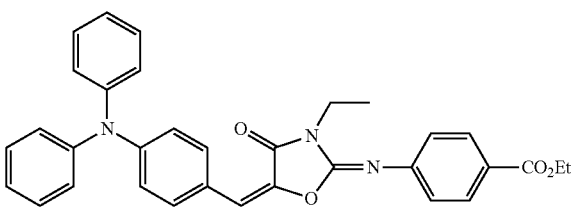
(D35)
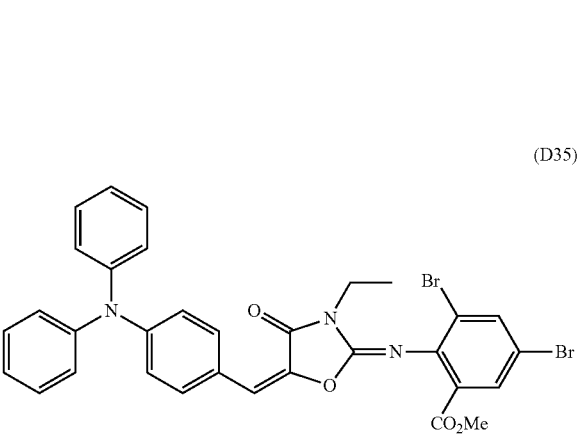
(D36)
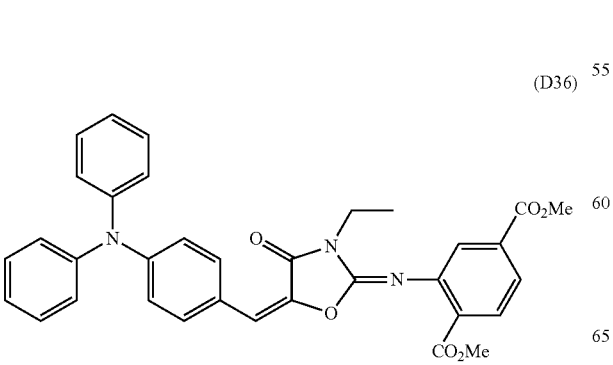
(D37)
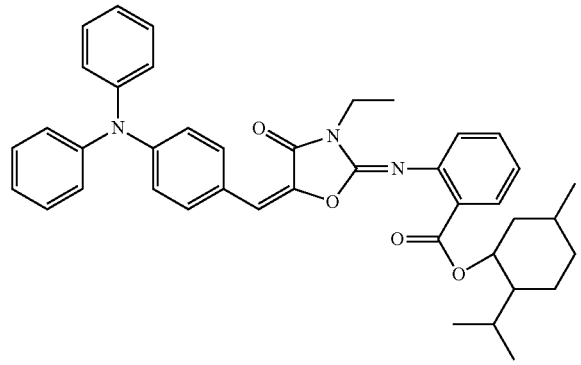
(D38)
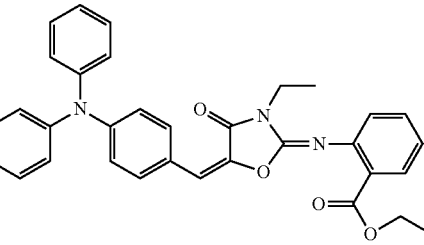
(D39)
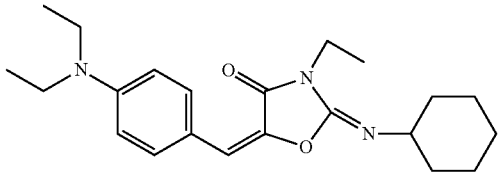
(D40)
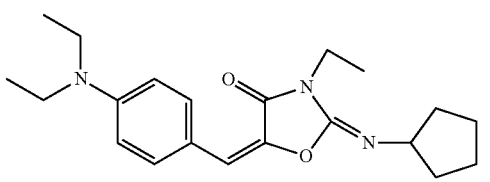
(D41)
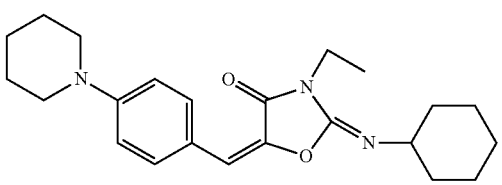
(D42)
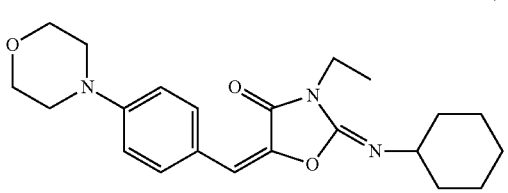

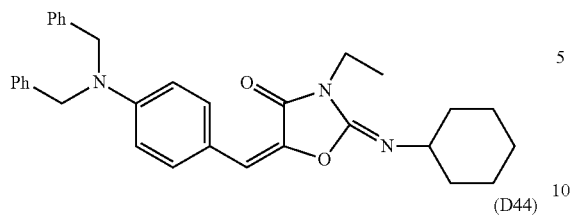 (D43)
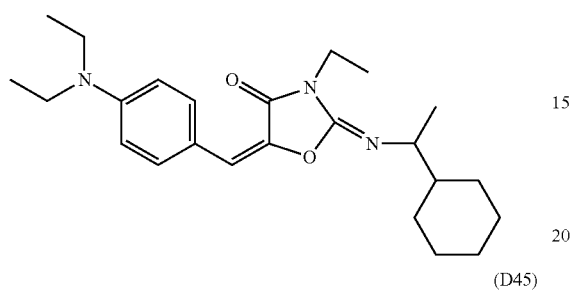 (D44)
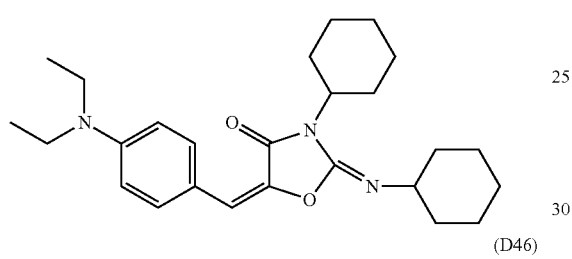 (D45)
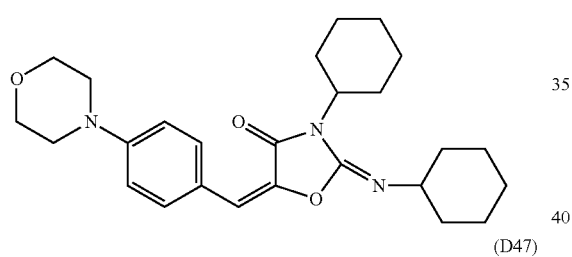 (D46)
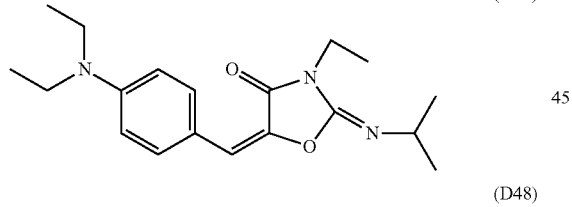 (D47)
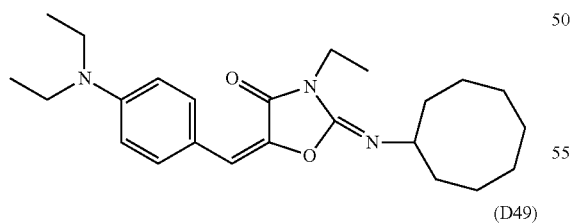 (D48)
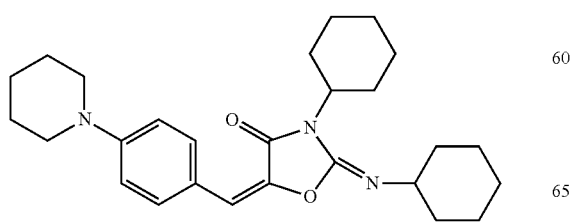 (D49)
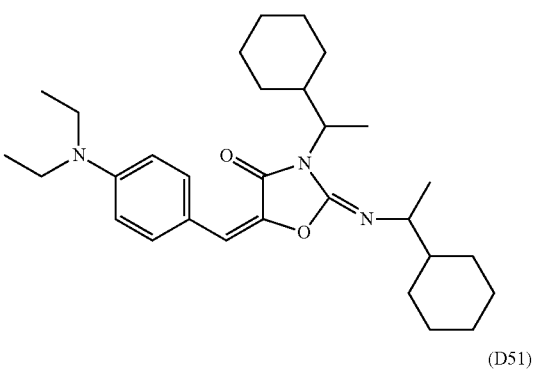 (D50)
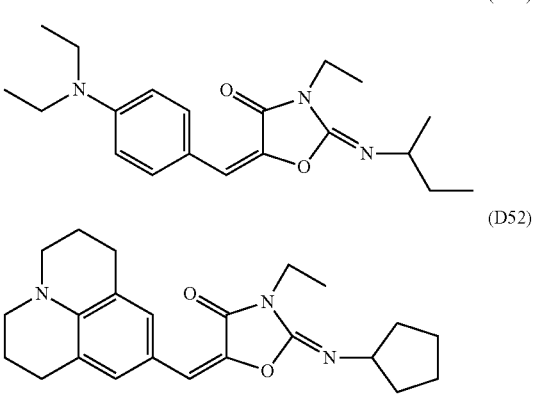 (D51)
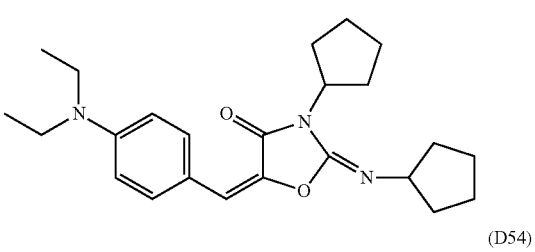 (D52)
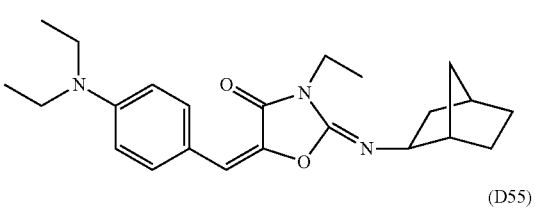 (D53)
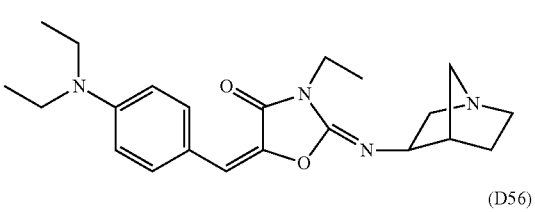 (D54)
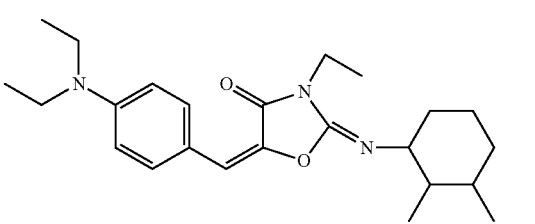 (D55)
(D56)

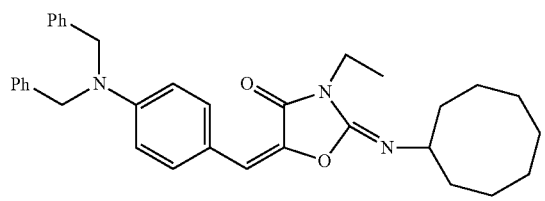
(D57)
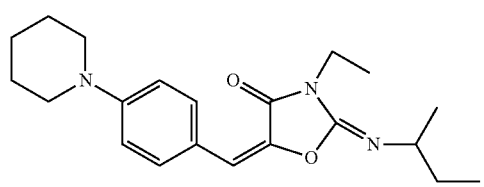
(D58)
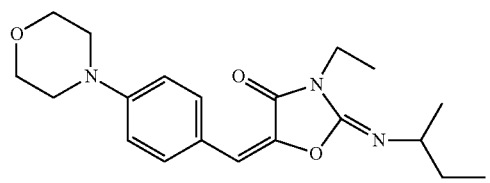
(D59)
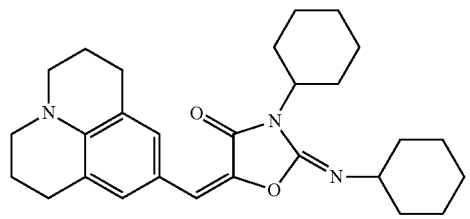
(D60)
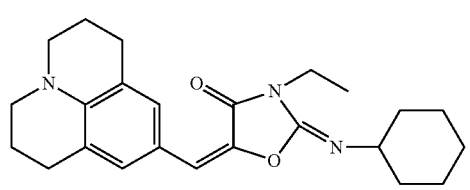
(D61)
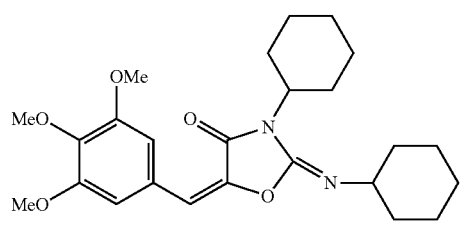
(D62)
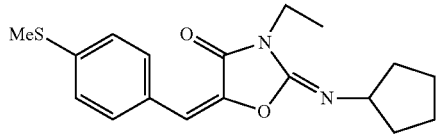
(D63)
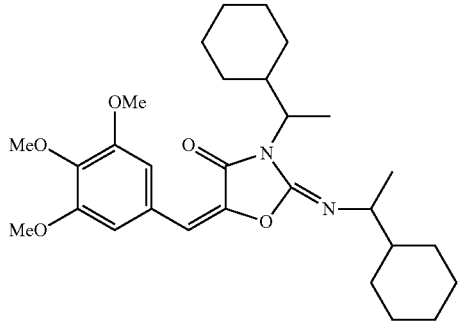
(D64)
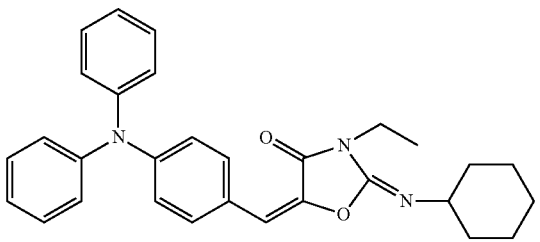
(D65)
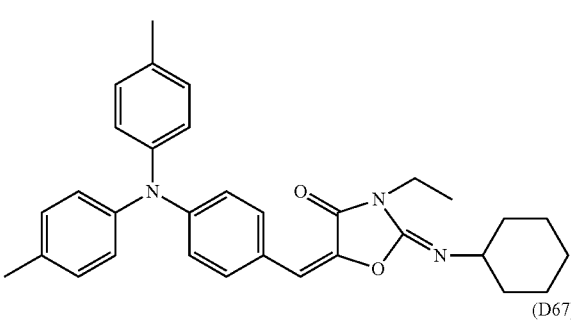
(D66)
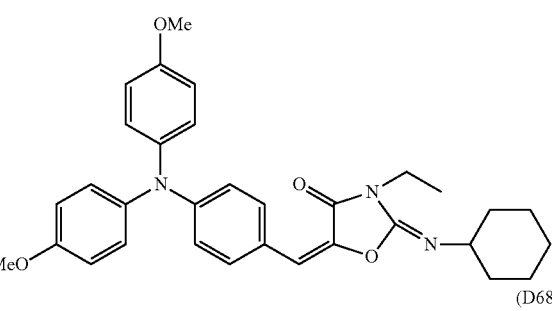
(D67)
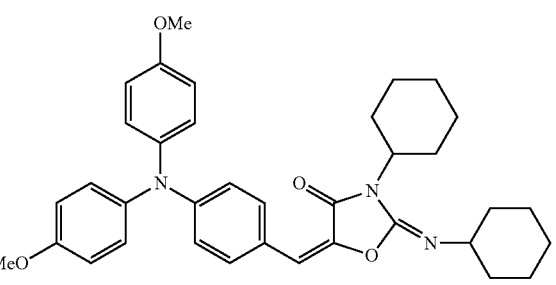
(D68)

(D69)
(D70)
(D71)
(D72)
(D73)
(D74)

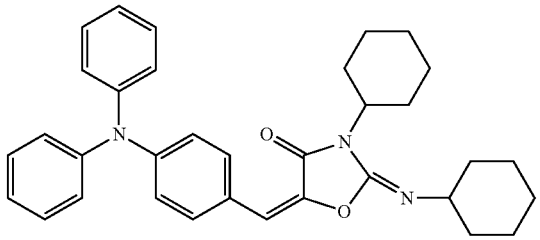
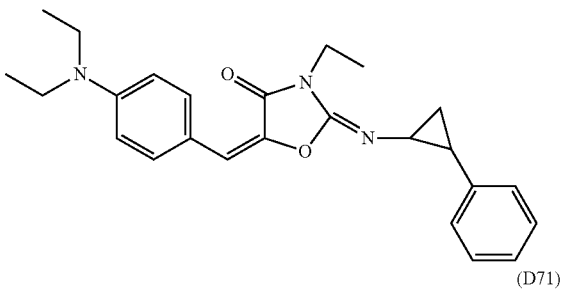

(D75)

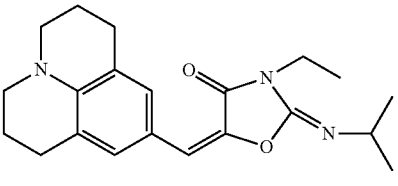

The details of use—such as, for example, which of these sensitizing dye structures is to be used, whether a single sensitizing dye or two or more sensitizing dyes should be used, and the quantity of addition—can be established as appropriate in conformity to the design properties for the final sensitized material.

For example, the compatibility in the composition constituting the image recording layer can be raised by using a combination of two or more sensitizing dyes. In addition to the photosensitivity, the molar absorption coefficient at the emission wavelength of the light source used is an important factor in the selection of the sensitizing dye. The use of a dye with a large molar absorption coefficient makes possible a relative reduction in the quantity of dye addition and as a consequence is economical and, with respect to use in a lithographic printing plate precursor, is also advantageous in terms of the film properties of the corresponding image recording layer. Because the photosensitivity and resolution of the image recording layer and the properties of the photo-exposed film are substantially influenced by the absorbance at the wavelength of the light source, an appropriate selection of the quantity of sensitizing dye addition is made considering these.

However, when, for example, one considers the goal of bringing about the curing of films with a thickness of 5 μm or more, in some instances a lower absorbance will, conversely, increase the degree of curing. In the case of application as a lithographic printing plate that employs a relatively thin film thickness, the quantity of sensitizing dye addition is preferably established so as to provide an absorbance for the image recording layer of the present invention in the range from 0.1 to 1.5 and preferably in the range from 0.25 to 1. In general, the range from 0.05 to 30 mass parts is preferred, the range from 0.1 to 20 mass parts is more preferred, and the range from 0.2 to 10 mass parts is most preferred, in each case per 100 mass parts of the total solids fraction of the image recording layer.

An infrared absorber is preferably incorporated in the image recording layer when image formation is performed on the lithographic printing plate precursor of the present invention using a laser that emits infrared radiation at 760 to 1200 nm as the light source.

An infrared absorber has the ability to convert absorbed infrared radiation into heat and the ability to undergo excitation by infrared radiation and engage in electron transfer and/or energy transfer to a radical polymerization initiator, vide infra. The infrared absorber used in the present invention is a dye or pigment that has an absorption maximum at a wavelength of 760 to 1200 nm.

Usable dyes can be exemplified by commercially available dyes and by known dyes described in the literature, for example, *Dye Handbook* (edited by The Society of Synthetic Organic Chemistry, Japan, 1970). Specific examples are dyes such as azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts, metal thiolate complexes, and so forth.

described in Japanese Patent Application Publication No. 2002-278057, as exemplified below.

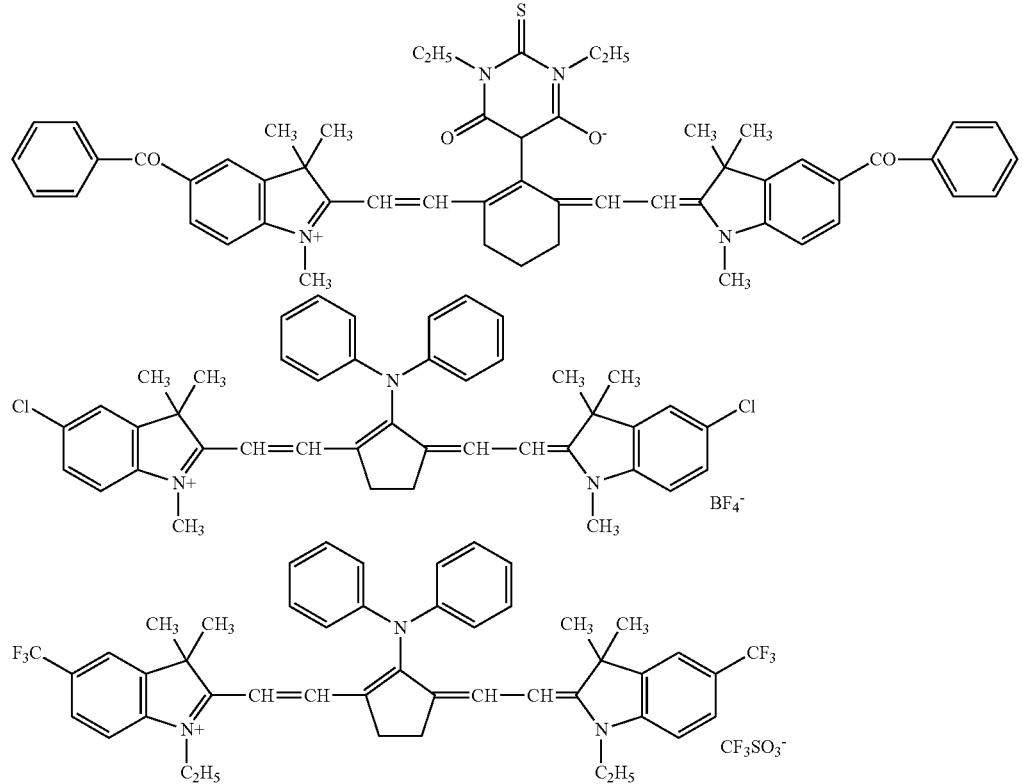

Preferred dyes can be exemplified by the cyanine dyes described in Japanese Patent Application Publication Nos. Sho 58-125246, Sho 59-84356, and Sho 60-78787; the methine dyes described in Japanese Patent Application Publication Nos. Sho 58-173696, Sho 58-181690, and Sho 58-194595; the naphthoquinone dyes described in Japanese Patent Application Publication Nos. Sho 58-112793, Sho 58-224793, Sho 59-48187, Sho 59-73996, Sho 60-52940, and Sho 60-63744; the squarylium dyes described in Japanese Patent Application Publication No. Sho 58-112792; and the cyanine dyes described in Great Britain Patent Specification No. 434,875.

The use is also preferred of the near infrared absorbers/sensitizers described in U.S. Pat. No. 5,156,938; the substituted arylbenzo(thio)pyrylium salts described in U.S. Pat. No. 3,881,924; the trimethine thiapyrylium salts described in Japanese Patent Application Publication No. Sho 57-142645 (U.S. Pat. No. 4,327,169); the pyrylium compounds described in Japanese Patent Application Publication Nos. Sho 58-181051, Sho 58-220143, Sho 59-41363, Sho 59-84248, Sho 59-84249, Sho 59-146063, and Sho 59-146061; the cyanine dyes described in Japanese Patent Application Publication No. Sho 59-216146; the pentamethine thiopyrylium salts described in U.S. Pat. No. 4,283,475; and the pyrylium compounds disclosed in Japanese Patent Publication Nos. Hei 5-13514 and Hei 5-19702.

Other preferred dye examples are the near infrared-absorbing dyes represented by formulas (I) and (II) in U.S. Pat. No. 4,756,993.

Other preferred examples of infrared-absorbing dyes for the present invention are the special indolenine cyanine dyes The following are particularly preferred among the dyes cited above: cyanine dyes, squarylium dyes, pyrylium dyes, nickel thiolate complexes, and indolenine cyanine dyes.

The cyanine dyes and indolenine cyanine dyes are more preferred, while the cyanine dyes given by the following general formula (1) are a particularly preferred example.

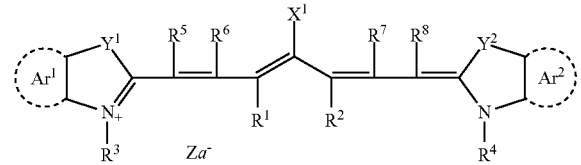

(1)

$X^1$ in general formula (1) represents the hydrogen atom, a halogen atom, —$NPh_2$, $X^2$-$L^1$, or the group represented by the structural formula given below. Here, $X^2$ represents an oxygen atom, nitrogen atom, or sulfur atom; $L^1$ represents $C_{1-12}$ hydrocarbyl, a heteroatom-containing aromatic ring, or heteroatom-containing $C_{1-12}$ hydrocarbyl. This heteroatom represents the nitrogen atom, the sulfur atom, the oxygen atom, a halogen atom, or the selenium atom. $R^a$ represents a substituent selected from the hydrogen atom, alkyl, aryl, substituted and unsubstituted amino, and halogen atoms, while $X_a^-$ has the same definition as the $Z_a^-$ described below.

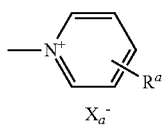

$R^1$ and $R^2$ each independently represent $C_{1-12}$ hydrocarbyl. Based on a consideration of the storage stability of the coating fluid for forming the image recording layer, $R^1$ and $R^2$ are preferably hydrocarbyl that contains at least 2 carbon atoms and are particularly preferably bonded to each other to form a 5-membered ring or 6-membered ring.

$Ar^1$ and $Ar^2$ each independently represent a possibly substituted aromatic hydrocarbyl group. The benzene ring and naphthalene ring are preferred for the aromatic hydrocarbyl group. Preferred substituents are hydrocarbyl groups containing no more than 12 carbons, halogen atoms, and alkoxy groups containing no more than 12 carbons, wherein hydrocarbyl groups containing no more than 12 carbons and alkoxy groups containing no more than 12 carbons are most preferred. $Y^1$ and $Y^2$ each independently represent the sulfur atom or a dialkylmethylene group that has no more than 12 carbons. $R^3$ and $R^4$ each independently represent a possibly substituted hydrocarbyl having no more than 20 carbons. Preferred substituents are alkoxy groups having no more than 12 carbons, the carboxyl group, and the sulfo group, wherein alkoxy groups having no more than 12 carbons are most preferred. $R^5$, $R^6$, $R^7$, and $R^8$ each independently represent the hydrogen atom or a hydrocarbyl having no more than 12 carbons. The hydrogen atom is preferred based on the ease of starting material acquisition. $Z_a—$ represents a counteranion. However, $Z_a—$ is not required when the cyanine dye with general formula (1) has an anionic substituent within its structure and charge neutralization is then not required. Based on a consideration of the storage stability of the coating fluid for forming the image recording layer, $Z_a—$ is preferably a halogen ion, the perchlorate ion, the tetrafluoroborate ion, the hexafluorophosphate ion, or a sulfonate ion and particularly preferably is the perchlorate ion, the tetrafluoroborate ion, the hexafluorophosphate ion, or an arylsulfonate ion.

Specific examples of cyanine dyes with general formula (1) that can be suitably used in the present invention are, for example, the dyes described in paragraph numbers [0017] to [0019] of Japanese Patent Application Publication No. 2001-133969.

Additional, particularly preferred examples are the special indolenine cyanine dyes described in the previously mentioned Japanese Patent Application Publication No. 2002-278057.

The pigment used in the present invention may be a commercially available pigment or a pigment as described in the Colour Index (C. I.) Handbook, *The Handbook of Modern Pigments* (Edited by the Japan Association of Pigment Technology, 1977), *Modern Pigment Applications Technology* (CMC, 1986), or *Printing Ink Technology* (CMC, 1984).

With regard to type, the pigment can be, for example, a black pigment, yellow pigment, orange pigment, brown pigment, red pigment, purple pigment, blue pigment, green pigment, fluorescent pigment, metal powder pigment, or polymer-bonded dye. Specific examples are insoluble azo pigments, azo lake pigments, condensed azo pigments, chelate azo pigments, phthalocyanine-based pigments, anthraquinone-based pigments, perylene-based pigments, perinone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments, carbon black, and so forth. Carbon black is preferred among these pigments.

These pigments may be used without a surface treatment or may be used after a surface treatment. Examples of the surface treatment method include coating the surface with a resin or wax, attaching a surfactant, and bonding a reactive material (e.g., silane coupling agent, epoxy compound, polyisocyanate) to the surface of the pigment. These surface treatment methods are described in *Properties and Applications of Metal Soaps* (Saiwai Shobo), *Printing Ink Technology* (CMC, 1984), and *Modern Pigment Applications Technology* (CMC, 1986).

The particle diameter of the pigment is preferably from 0.01 μm to 10 μm, more preferably from 0.05 μm to 1 μm, and particularly preferably from 0.1 μm to 1 μm. Good stability by the pigment dispersion in the coating fluid for forming the image recording layer and good uniformity on the part of the image recording layer are obtained in the cited range.

The known dispersion technologies used, for example, for ink production or toner production, can be used as the method of dispersing the pigment. The dispersing apparatus can be exemplified by ultrasonic dispersers, sand mills, attritors, pearl mills, super mills, ball mills, impellers, dispersers, KD mills, colloid mills, dynatrons, three-roll mills, and pressure kneaders. The details are described in *Modern Pigment Applications Technology* (CMC, 1986).

These infrared absorbers may be incorporated in the same layer as other components or may be incorporated in a separately disposed image recording layer. The infrared absorber is incorporated during production of the lithographic printing plate precursor in such a manner that the absorbance of the image recording layer at the wavelength of maximum absorption in the wavelength range of 760 nm to 1200 nm is in the range from 0.3 to 1.2 as measured by a reflection method. The range from 0.4 to 1.1 is preferred. An excellent film strength by the image areas and an excellent adhesion to the support are obtained in the cited range, as is the development of a uniform polymerization reaction across the thickness of the image recording layer.

The absorbance of the image recording layer can be adjusted through the quantity of infrared absorber addition to the image recording layer and through the thickness of the image recording layer. The absorbance can be measured by the usual methods. Measurement can be carried out, for example, by the following methods: a method in which the image recording layer is formed on a reflective support, e.g., aluminum, in a thickness determined as appropriate in the range required of the post-drying coating rate for lithographic printing plates, and the reflection density is then measured with an optical densitometer, or a method in which measurement is carried out using a spectrophotometer by reflection using an integrating sphere.

The content of the infrared absorber (A) in the image recording layer in the present invention, when expressed in terms of the specific quantity of addition, is preferably 0.1 to 10.0 mass % of the total solids fraction of the image recording layer and is more preferably 0.5 to 5.0 mass % of the total solids fraction of the image recording layer.

<The Radical Polymerization Initiator (B)>

The radical polymerization initiator used in the present invention denotes a compound that generates radicals under the action of thermal energy or light energy or both and that thereby initiates and promotes the polymerization of a polymerizable compound. Radical polymerization initiators usable in the present invention can be exemplified by known thermal polymerization initiators, known compounds that have a bond with a small bond dissociation energy, and photopolymerization initiators.

The radical polymerization initiator in the present invention can be exemplified by (a) organic halides, (b) carbonyl compounds, (c) azo-type polymerization initiators, (d) organoperoxides, (e) metallocene compounds, (f) azide compounds, (g) hexaarylbiimidazole compounds, (h) organoborate compounds, (i) disulfone compounds, (j) oxime ester compounds, and (k) onium salt compounds.

The organic halides (a) can be specifically exemplified by the compounds described in Wakabayashi et al., *Bull. Chem. Soc. Japan,* 42, 2924 (1969); U.S. Pat. No. 3,905,815; Japanese Patent Publication No. Sho 46-4605; Japanese Patent Application Publication Nos. Sho 48-36281, Sho 55-32070, Sho 60-239736, Sho 61-169835, Sho 61-169837, Sho 62-58241, Sho 62-212401, Sho 63-70243, and Sho 63-298339; and M. P. Hutt, *Journal of Heterocyclic Chemistry* 1, No. 3 (1970). Trihalomethyl-substituted oxazole compounds and s-triazine compounds are particularly preferred.

s-triazine derivatives and oxadiazole derivatives that have at least one mono-, di-, or tri-halogen-substituted methyl group bonded therein are more preferred. Specific examples in this regard are 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-(p-bromophenyl)-4,6-bis(trichloromethyl)-s-triazine, 2-(p-fluorophenyl)-4,6-bis(trichloromethyl)-s-triazine, 2-(p-trifluoromethylphenyl)-4,6-bis(trichloromethyl)-s-triazine, 2-(2,6-dichlorophenyl)-4,6-bis(trichloromethyl)-s-triazine, 2-(2,6-difluorophenyl)-4,6-bis(trichloromethyl)-s-triazine, dibromophenyl)-4,6-bis(trichloromethyl)-s-triazine, 2-(4-biphenylyl)-4,6-bis(trichloromethyl)-s-triazine, 2-(4'-chloro-4-biphenylyl)-4,6-bis(trichloromethyl)-s-triazine, 2-(p-cyanophenyl)-4,6-bis(trichloromethyl)-s-triazine, 2-(p-acetylphenyl)-4,6-bis(trichloromethyl)-s-triazine, 2-(p-ethoxycarbonylphenyl)-4,6-bis(trichloromethyl)-s-triazine, 2-(p-phenoxycarbonylphenyl)-4,6-bis(trichloromethyl)-s-triazine, 2-(p-methylsulfonylphenyl)-4,6-bis(trichloromethyl)-s-triazine, 2-(p-dimethylsulfoniumphenyl)-4,6-bis(trichloromethyl)-s-triazine tetrafluoroborate, 2-(2,4-difluorophenyl)-4,6-bis(trichloromethyl)-s-triazine, 2-(p-diethoxyphosphorylphenyl)-4,6-bis(trichloromethyl)-s-triazine, 2-[4-(4-hydroxyphenylcarbonylamino)phenyl]-4,6-bis(trichloromethyl)-s-triazine, 2-[4-(p-methoxyphenyl)-1,3-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-1-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloro methyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-triazine, 2-methoxy-4,6-bis(tribromomethyl)-s-triazine, 2-(o-methoxystyryl)-5-trichloromethyl-1,3,4-oxadiazole, 2-(3,4-epoxystyryl)-5-trichloromethyl-1,3,4-oxadiazole, 2-[1-phenyl-2-(4-methoxyphenyl)vinyl]-5-trichloromethyl-1,3,4-oxadiazole, 2-(p-hydroxystyryl)-5-trichloromethyl-1,3,4-oxadiazole, 2-(3,4-dihydroxystyryl)-5-trichloromethyl-1,3,4-oxadiazole, 2-(p-t-butoxystyryl)-5-trichloromethyl-1,3,4-oxadiazole, and so forth.

The carbonyl compounds (b) can be exemplified by benzophenone derivatives, e.g., benzophenone, Michler's ketone, 2-methylbenzophenone, 3-methylbenzophenone, 4-methylbenzophenone, 2-chlorobenzophenone, 4-bromobenzophenone, 2-carboxybenzophenone, and so forth; acetophenone derivatives, e.g., 2,2-dimethoxy-2-phenylacetophenone, 2,2-diethoxyacetophenone, 1-hydroxycyclohexyl phenyl ketone, α-hydroxy-2-methylphenylpropanone, 1-hydroxy-1-methylethyl(p-isopropylphenyl) ketone, 1-hydroxy-1-(p-dodecylphenyl)ketone, 2-methyl-(4'-(methylthio)phenyl)-2-morpholino-1-propanone, 1,1,1-trichloromethyl(p-butylphenyl)ketone, and so forth; thioxanthone derivatives, e.g., thioxanthone, 2-ethylthioxanthone, 2-isopropylthioxanthone, 2-chlorothioxanthone, 2,4-dimethylthioxanthone, 2,4-diethylthioxanthone, 2,4-diisopropylthioxanthone, and so forth; and benzoic acid ester derivatives, e.g., ethyl p-dimethylaminobenzoate, ethyl p-diethylaminobenzoate, and so forth.

The azo compounds (c) can be exemplified, inter alia, by the azo compounds described in Japanese Patent Application Publication No. Hei 8-108621.

The organoperoxides (d) can be exemplified by trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoylperoxide, succinic peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, 3,3',4,4'-tetra(t-butylperoxycarbonyl)benzophenone, 3,3',4,4'-tetra(t-hexylperoxycarbonyl)benzophenone, 3,3',4,4'-tetra(p-isopropylcumylperoxycarbonyl)benzophenone, carbonyl di(t-butylperoxydihydrogen diphthalate), carbonyl di(t-hexylperoxydihydrogen diphthalate), and so forth.

The metallocene compounds (e) can be exemplified by the titanocene compounds described in Japanese Patent Application Publication Nos. Sho 59-152396, Sho 61-151197, Sho 63-41484, Hei 2-249, Hei 2-4705, and Hei 5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl, and dicyclopentadienyl-Ti-bis-2,6-difluoro-3-(pyrrol-1-yl)phen-1-yl; additional examples are the iron-arene complexes described in Japanese Patent Application Publication Nos. Hei 1-304453 and Hei 1-152109.

The azide compounds (f) can be exemplified by compounds such as 2,6-bis(4-azidobenzylidene)-4-methylcyclohexanone and so forth.

The hexaarylbiimidazole compounds (g) can be exemplified by the compounds described in Japanese Patent Publication No. Hei 6-29285 and U.S. Pat. Nos. 3,479,185, 4,311,783, and 4,622,286, and specifically 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetrakis(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluorophenyl)-4,4',5,5'-tetraphenylbiimidazole, and so forth.

The organoborate salt compounds (h) can be specifically exemplified by the organoborate salts described in Japanese Patent Application Publication Nos. Sho 62-143044, Sho 62-150242, Hei 9-188685, Hei 9-188686, Hei 9-188710, 2000-131837, and 2002-107916, Japanese Patent No. 2,764,769, Japanese Patent Application Publication No. 2002-116539, and Martin Kunz, *RadTech '98 Proceedings* Apr. 19-22, 1998, Chicago; the organoboron sulfonium complexes and organoboron oxosulfonium complexes described in Japanese Patent Application Publication Nos. Hei 6-157623, Hei 6-175564, and Hei 6-175561; the organoboron iodonium complexes described in Japanese Patent Application Publication Nos. Hei 6-175554 and Hei 6-175553; the organoboron phosphonium complexes described in Japanese Patent Application Publication No. Hei 9-188710; and the organoboron transition metal coordination complexes described in Japanese Patent Application Publication Nos. Hei 6-348011, Hei 7-128785, Hei 7-140589, Hei 7-306527, and Hei 7-292014.

The disulfone compounds (i) can be exemplified by the compounds described in Japanese Patent Application Publication Nos. Sho 61-166544 and 2003-328465.

The oxime ester compounds (j) can be exemplified by the compounds described in *J. C. S. Perkin II*, 1653-1660 (1979), *J. C. S. Perkin II*, 156-162 (1979), *Journal of Photopolymer Science and Technology*, 202-232 (1995), and Japanese Patent Application Publication No. 2000-66385; by the compounds described in Japanese Patent Application Publication No. 2000-80068; and specifically by the compounds given by the structural formulas provided below.

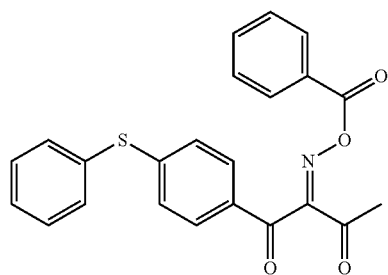

-continued

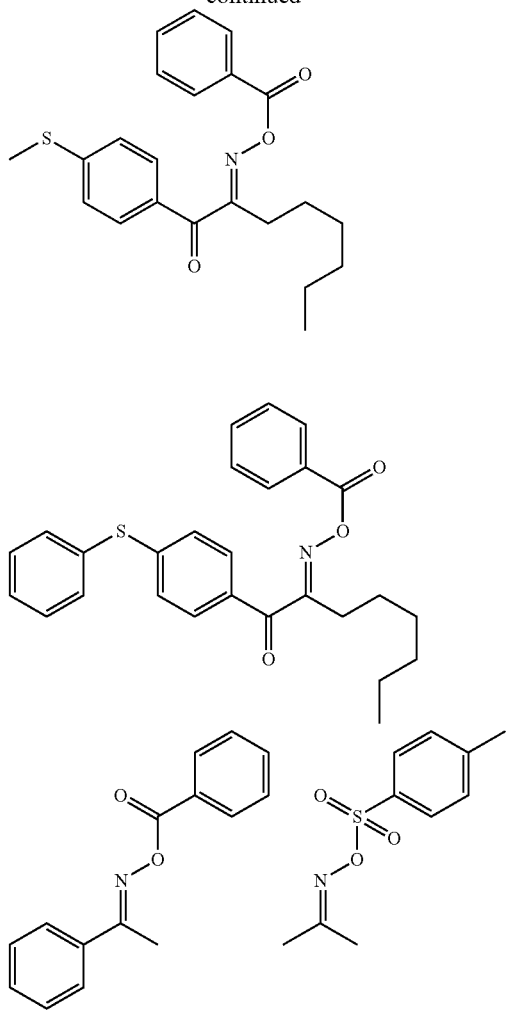

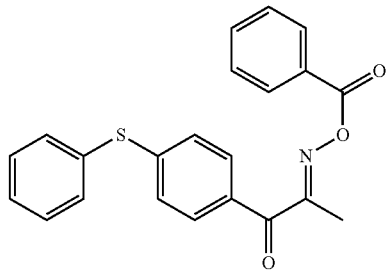

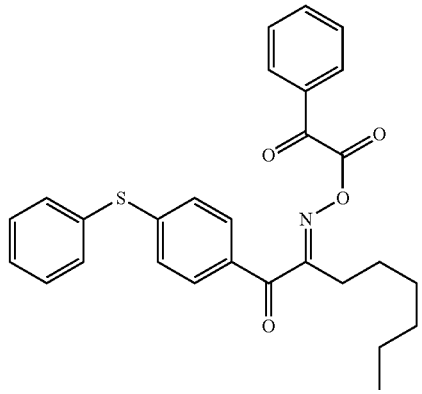

51
-continued
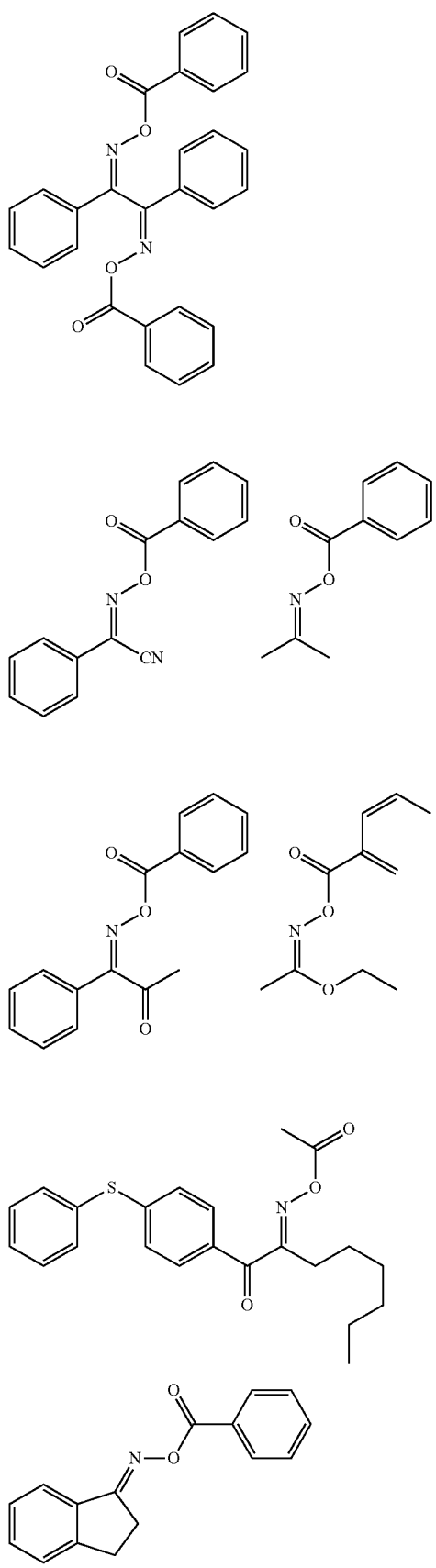
52
-continued
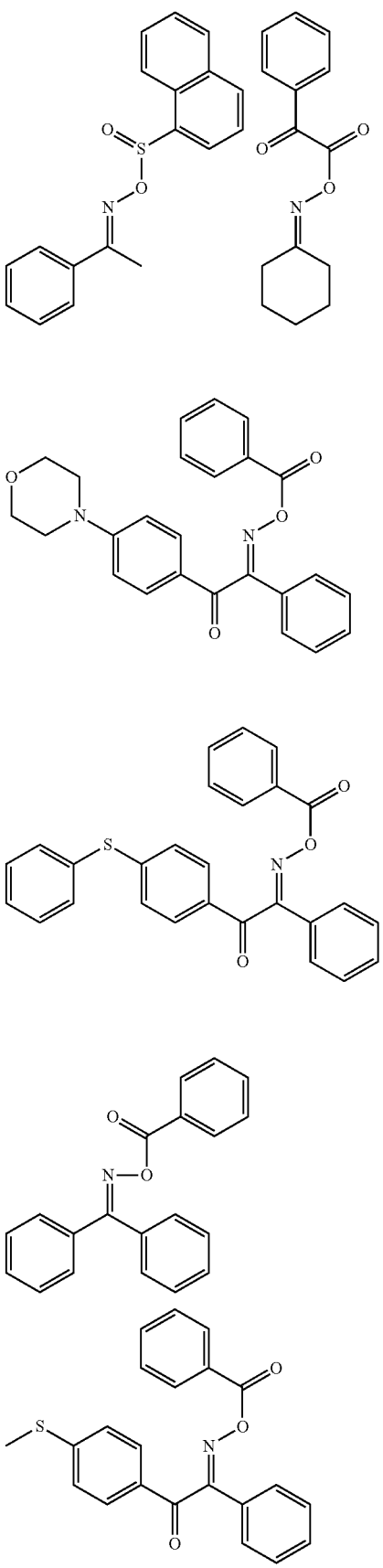

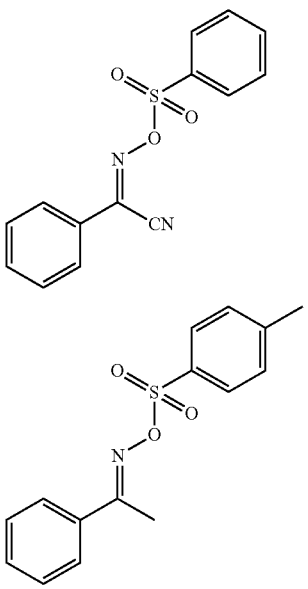

The onium salt compound (k) can be exemplified by onium salts such as the diazonium salts described in S. I. Schlesinger, *Photogr. Sci. Eng.*, 18, 387 (1974) and T. S. Bal et al., *Polymer*, 21, 423 (1980); the ammonium salts described in U.S. Pat. No. 4,069,055 and Japanese Patent Application Publication No. Hei 4-365049; the phosphonium salts described in U.S. Pat. Nos. 4,069,055 and 4,069,056; the iodonium salts described in European Patent No. 104,143, U.S. Pat. Nos. 339,049 and 410,201, and Japanese Patent Application Publication Nos. Hei 2-150848 and Hei 2-296514; the sulfonium salts described in European Patent Nos. 370,693, 390, 214, 233, 567, 297,443, and 297,442, U.S. Pat. Nos. 4,933,377, 160,811, 410,201, 339,049, 4,760,013, 4,734,444, and 2,833,827, and German Patent Nos. 2,904, 626, 3,604,580 and 3,604,581; the selenonium salts described in J. V. Crivello et al., *Macromolecules*, 10(6), 1307 (1977) and J. V. Crivello et al., *J. Polymer Sci., Polymer Chem. Ed.*, 17, 1047 (1979); and the arsonium salts described in C. S. Wen et al., *The Proc. Conf. Rad. Curing, ASIA*, p. 478, Tokyo, October (1988).

Viewed from the standpoints of reactivity and stability, the previously described oxime ester compounds and diazonium salts, iodonium salts, and sulfonium salts are particularly preferred examples. These onium salts function in the present invention not as an acid generator, but rather as an ionic radical polymerization initiator.

The onium salts represented by the following general formulas (RI-I) to (RI-III) are onium salts that are well suited for use in the present invention.

$$Ar^{11}-N^+\equiv N \quad Z^{11-} \tag{RI-I}$$

$$Ar^{21}-I^+-Ar^{22} \quad Z^{21-} \tag{RI-II}$$

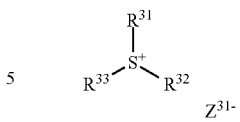
(RI-III)

$Ar^{11}$ in formula (RI-I) represents an aryl group that has 20 or fewer carbons and that may have from 1 to 6 substituents. Preferred substituents can be exemplified by $C_{1-12}$ alkyl, $C_{1-12}$ alkenyl, $C_{1-12}$ alkynyl, $C_{1-12}$ aryl, $C_{1-12}$ alkoxy, $C_{1-12}$ aryloxy, halogen, $C_{1-12}$ alkylamino, $C_{1-12}$ dialkylamino, $C_{1-12}$ alkylamide or $C_{1-12}$ arylamide, a carbonyl group, the carboxyl group, the cyano group, a sulfonyl group, $C_{1-12}$ thioalkyl, and $C_{1-12}$ thioaryl. $Z^{11}{-}$ represents a monovalent anion and is a halogen ion, perchlorate ion, hexafluorophosphate ion, tetrafluoroborate ion, sulfonate ion, sulfinate ion, thiosulfonate ion, or sulfate ion. Viewed from the perspective of stability and the inspectability of the printed out image, the perchlorate ion, hexafluorophosphate ion, tetrafluoroborate ion, sulfonate ion, and sulfinate ion are preferred.

$Ar^{21}$ and $Ar^{22}$ in formula (RI-II) each independently represent an aryl group that has 20 or fewer carbons and that may have from 1 to 6 substituents. Preferred substituents can be exemplified by $C_{1-12}$ alkyl, $C_{1-12}$ alkenyl, $C_{1-12}$ alkynyl, $C_{1-12}$ aryl, $C_{1-12}$ alkoxy, $C_{1-12}$ aryloxy, halogen, $C_{1-12}$ alkylamino, $C_{1-12}$ dialkylamino, $C_{1-12}$ alkylamide or $C_{1-12}$ arylamide, a carbonyl group, the carboxyl group, the cyano group, a sulfonyl group, $C_{1-12}$ thioalkyl, and $C_{1-12}$ thioaryl. $Z^{21}{-}$ represents a monovalent anion and is a halogen ion, perchlorate ion, hexafluorophosphate ion, tetrafluoroborate ion, sulfonate ion, sulfinate ion, thiosulfonate ion, or sulfate ion. Viewed from the perspective of stability and the inspectability of the printed out image, the perchlorate ion, hexafluorophosphate ion, tetrafluoroborate ion, sulfonate ion, sulfinate ion, and carboxylate ion are preferred.

$R^{31}$, $R^{32}$, and $R^{33}$ in formula (RI-III) each independently represent an aryl, alkyl, alkenyl, or alkynyl group that has 20 or fewer carbons and that may have from 1 to 6 substituents, wherein aryl is preferred from the standpoints of reactivity and stability. Preferred substituents can be exemplified by $C_{1-12}$ alkyl, $C_{1-12}$ alkenyl, $C_{1-12}$ alkynyl, $C_{1-12}$ aryl, $C_{1-12}$ alkoxy, $C_{1-12}$ aryloxy, halogen, $C_{1-12}$ alkylamino, $C_{1-12}$ dialkylamino, $C_{1-12}$ alkylamide or $C_{1-12}$ arylamide, a carbonyl group, the carboxyl group, the cyano group, a sulfonyl group, $C_{1-12}$ thioalkyl, and $C_{1-12}$ thioaryl. $Z^{31}{-}$ represents a monovalent anion and is a halogen ion, perchlorate ion, hexafluorophosphate ion, tetrafluoroborate ion, sulfonate ion, sulfinate ion, thiosulfonate ion, or sulfate ion. Viewed from the perspective of stability and the inspectability of the printed out image, the perchlorate ion, hexafluorophosphate ion, tetrafluoroborate ion, sulfonate ion, sulfinate ion, and carboxylate ion are preferred, while the carboxylate ion described in Japanese Patent Application Publication No. 2001-343742 is more preferred and the carboxylate ion described in Japanese Patent Application Publication No. 2002-148790 is particularly preferred.

Examples are provided below of onium salts suitable for use as a radical polymerization initiator in the present invention, but the present invention is not limited to these.

-continued

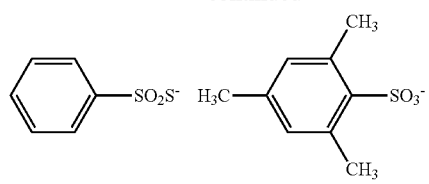
(I-10)　(I-11)
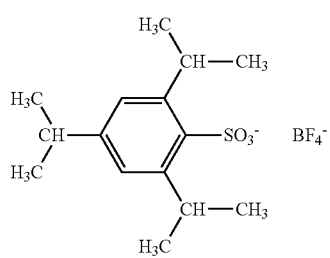
(I-12)　(I-13)
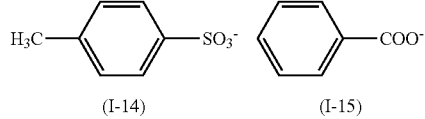
(I-14)　(I-15)
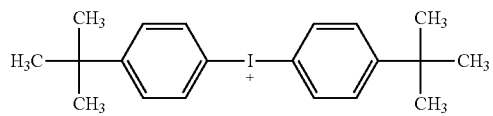
(I-16)
ClO$_4^-$　PF$_6^-$　C$_4$F$_9$SO$_3^-$
(I-17)　(I-18)　(I-19)
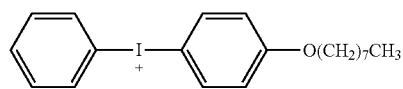
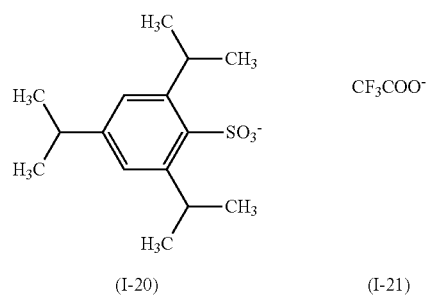
(I-20)　(I-21)
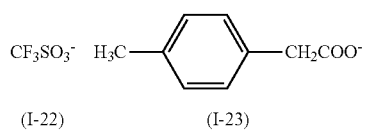
CF$_3$SO$_3^-$　　　　　　
(I-22)　(I-23)
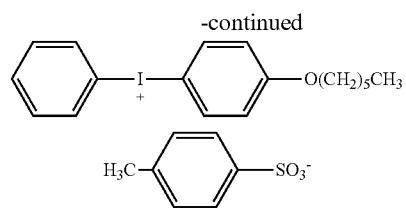
(I-24)
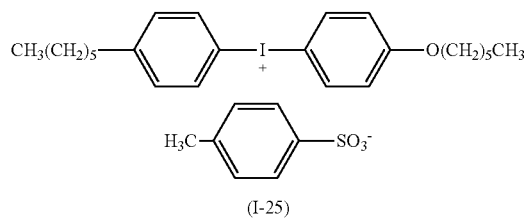
(I-25)
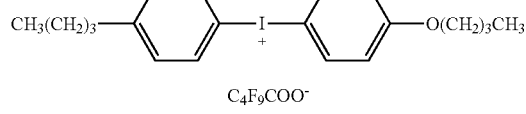
C$_4$F$_9$COO$^-$
(I-26)
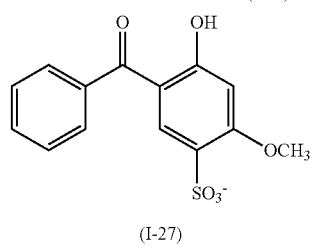
(I-27)
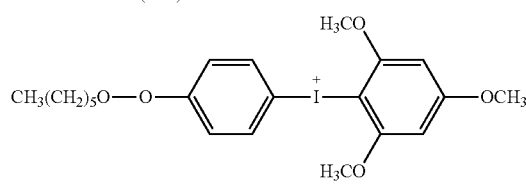
PF$_6^-$　ClO$_4^-$
(I-28)　(I-29)
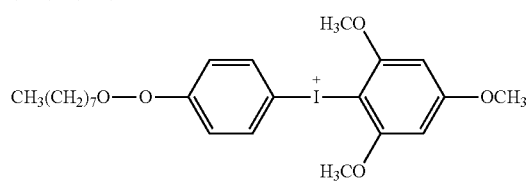
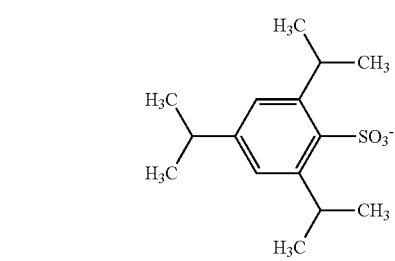
(I-30)
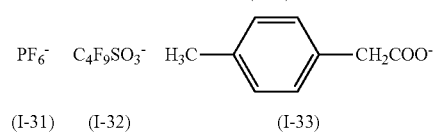
PF$_6^-$　C$_4$F$_9$SO$_3^-$
(I-31)　(I-32)　(I-33)

-continued
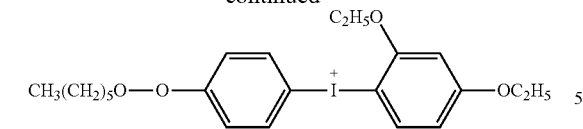
(I-34)  (I-35)  (I-36)
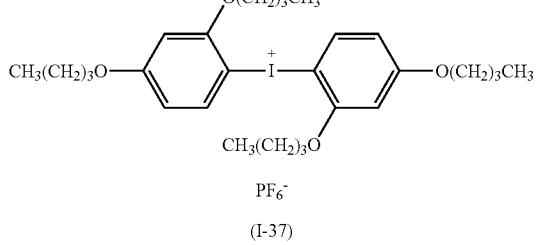
(I-37)
(I-38)
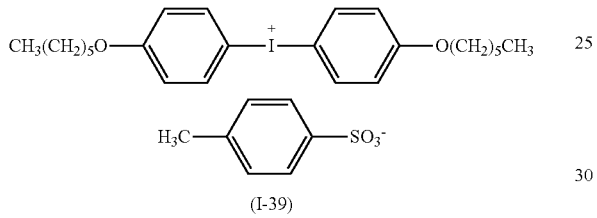
(I-39)
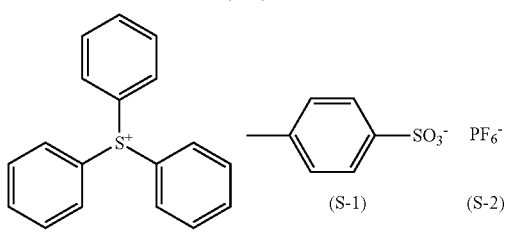
(S-1)  (S-2)
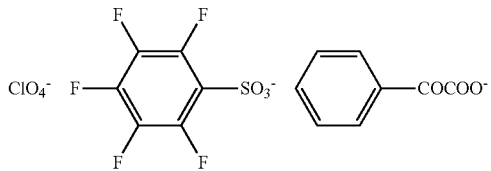
(S-3)  (S-4)  (S-5)
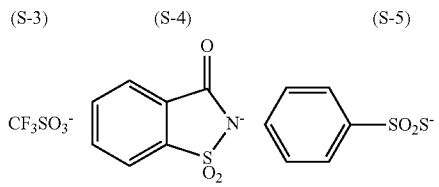
(S-6)  (S-7)  (S-8)
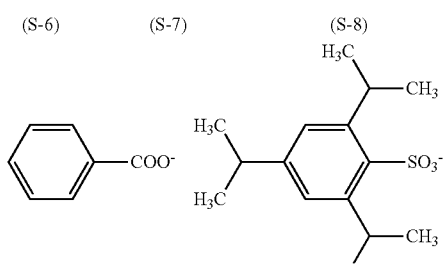
(S-9)  (S-10)
-continued
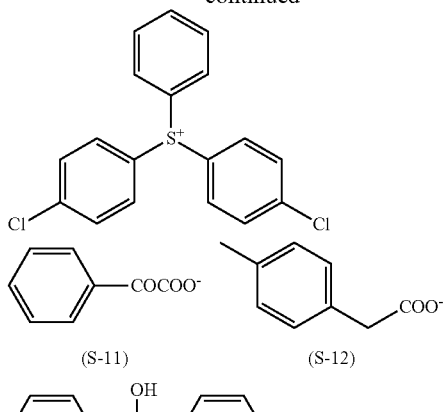
(S-11)  (S-12)
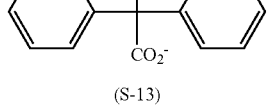
(S-13)
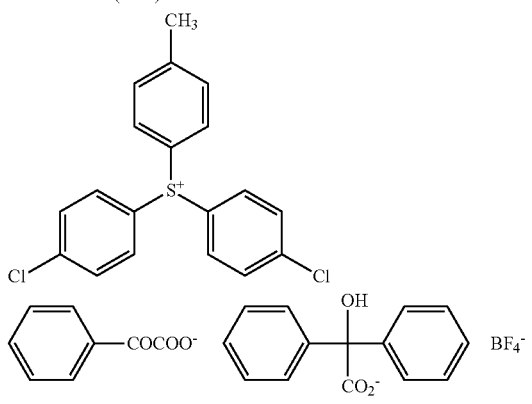
(S-14)  (S-15)  (S-16)
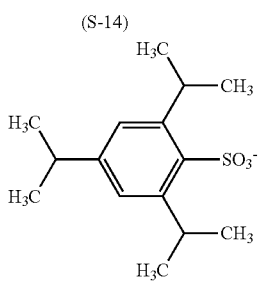
(S-17)
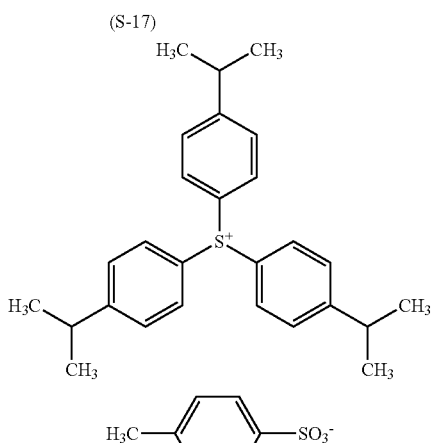
(S-18)

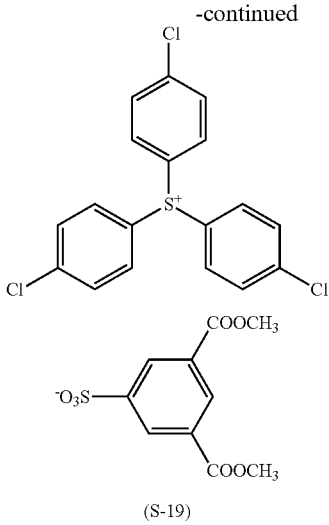

(S-19)

The radical polymerization initiator (B) is not limited to the preceding, but, considered from the perspectives of reactivity and stability, is more preferably an organic halogen compound (a) and particularly the triazine-type initiators encompassed therein, an oxime ester compound (j), and the diazonium salts, iodonium salts, and sulfonium salts encompassed by the onium salt compounds (k). Among these radical polymerization initiators, onium salts having an inorganic anion as the counterion, for example, $PF_6-$ or $BF_4-$, are preferred from the standpoint of improving the inspectability of the printed out image in combination with an infrared absorber. In addition, diaryliodonium is preferred as the onium salt due to the excellent color development this provides.

A single one of these radical polymerization initiators (B) may be used or a combination of two or more may be used.

This radical polymerization initiator (B) can be added preferably at 0.1 to 50 mass %, more preferably 0.5 to 30 mass %, and particularly preferably 0.8 to 20 mass %, in each case based on the total solids fraction comprising the image recording layer. An excellent sensitivity and an excellent resistance to scumming in the nonimage areas during printing are obtained in the cited range.

The radical polymerization initiator (B) may be incorporated in the same layer with other components or may be incorporated in the image recording layer and/or in a separately disposed layer adjacent thereto.

<The Polymerizable Compound (C)>

The image recording layer of the lithographic printing plate precursor of the present invention may contain a polymerizable compound in addition to the previously described polymerizable monomer that has a sulfonamide group and at least two ethylenically unsaturated groups.

The mixing ratio between the sulfonamide-containing monomer of the present invention and this other polymerizable compound, expressed on a mass basis, is preferably 100:0 to 10:90, more preferably 100:0 to 20:80, and most preferably 100:0 to 25:75.

This polymerizable compound is an addition-polymerizable compound that has at least one ethylenically unsaturated double bond and is selected from compounds that have at least one and preferably at least two ethylenically unsaturated bonds. This group of compounds is widely known in the pertinent industrial field, and these can be used in the present invention without particular limitation. These compounds have, for example, the following chemical configurations: monomer, prepolymer (i.e., dimer, trimer, and oligomer), mixtures of the preceding, (co)polymers of the preceding, and so forth.

Examples of the monomers and their copolymers are unsaturated carboxylic acids (for example, acrylic acid, methacrylic acid, itaconic acid, crotonic acid, isocrotonic acid, maleic acid, and so forth) and their esters and amides, preferably esters between an unsaturated carboxylic acid and an aliphatic polyhydric alcohol compound and amides between an unsaturated carboxylic acid and an aliphatic polyvalent amine compound. Also suitable for use are the addition reaction products from a monofunctional or multifunctional isocyanate or epoxide and an unsaturated carboxylic acid ester or amide that has a nucleophilic substituent such as, for example, the hydroxyl group, amino group, mercapto group, and so forth, and the dehydration condensation reaction products from a monofunctional or multifunctional carboxylic acid and an unsaturated carboxylic acid ester or amide that has a nucleophilic substituent such as, for example, the hydroxyl group, amino group, mercapto group, and so forth. Also suitable are the addition reaction products from a monofunctional or multifunctional alcohol, amine, or thiol and an unsaturated carboxylic acid ester or amide that has an electrophilic substituent such as, for example, the isocyanate group, epoxy group, and so forth, and substitution reaction products from a monofunctional or multifunctional alcohol, amine, or thiol and an unsaturated carboxylic acid ester or amide that has a leaving group such as, for example, a halogen group, tosyloxy group, and so forth. Another set of usable examples is provided by the group of compounds generated by replacing the unsaturated carboxylic acid cited above with, for example, an unsaturated phosphonic acid, styrene, a vinyl ether, and so forth.

The following are specific examples of monomers that are esters between an aliphatic polyhydric alcohol compound and an unsaturated carboxylic acid: acrylate esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, and so forth;

Examples of methacrylate esters are tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, h is [p-(methacryloxyethoxy)phenyl]dimethylmethane, and so forth;

Examples of itaconate esters are ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, and so forth.

Examples of crotonate esters are ethylene glycol dicrotonate, tetramethylene glycol dicrotonate, pentaerythritol dicrotonate, sorbitol tetradicrotonate, and so forth.

Examples of isocrotonate esters are ethylene glycol diisocrotonate, pentaerythritol diisocrotonate, sorbitol tetraisocrotonate, and so forth.

Examples of maleate esters are ethylene glycol dimaleate, triethylene glycol dimaleate, pentaerythritol dimaleate, sorbitol tetramaleate, and so forth.

Examples of other suitable esters are the aliphatic alcohol-based esters described in Japanese Patent Publication No. Sho 51-47334 and Japanese Patent Application Publication No. Sho 57-196231; esters having an aromatic skeleton as described in Japanese Patent Application Publication Nos. Sho 59-5240, Sho 59-5241, and Hei 2-226149; and the amino group-containing esters described in Japanese Patent Application Publication No. Hei 1-165613. In addition, the previously described ester monomers can also be used in the form of mixtures.

The following are specific examples of monomers that are amides between an aliphatic polyvalent amine compound and an unsaturated carboxylic acid: methylenebisacrylamide, methylenebismethacrylamide, 1,6-hexamethylenebisacrylamide, 1,6-hexamethylenebismethacrylamide, diethylenetriamine trisacrylamide, xylylenebisacrylamide, xylylenebismethacrylamide, and so forth. Other examples of preferred amide-type monomers are those having a cyclohexylene structure as described in Japanese Patent Publication No. Sho 54-21726.

Also suitable are urethane-type addition-polymerizable compounds produced using the addition reaction between isocyanate and the hydroxyl group; a specific example here is the vinyl urethane compound containing at least two polymerizable vinyl groups in each molecule, as described in Japanese Patent Publication No. Sho 48-41708, that is generated by the addition of a hydroxyl-functional vinyl monomer represented by general formula (2) below to a polyisocyanate compound that contains at least two isocyanate groups in each molecule

$CH_2=C(R^4)COOCH_2CH(R^5)OH$      general formula (2)

(wherein $R^4$ and $R^5$ each represent H or $CH_3$).

The following are also suitable: the urethane acrylates as described in Japanese Patent Application Publication No. Sho 51-37193 and Japanese Patent Publication Nos. Hei 2-32293 and Hei 2-16765 and the urethane compounds having an ethylene oxide-type skeleton as described in Japanese Patent Publication Nos. Sho 58-49860, Sho 56-17654, Sho 62-39417, and Sho 62-39418. In addition, a photopolymerizable composition that exhibits a very good photosensitive speed can be obtained by using the addition-polymerizable compounds having an amino structure or sulfide structure in the molecule that are described in Japanese Patent Application Publication Nos. Sho 63-277653, Sho 63-260909, and Hei 1-105238.

Other examples are multifunctional acrylates and methacrylates, for example, the polyester acrylates as described in each of Japanese Patent Application Publication No. Sho 48-64183 and Japanese Patent Publication Nos. Sho 49-43191 and Sho 52-30490 and epoxy acrylates as provided by the reaction of an epoxy resin with acrylic acid or methacrylic acid. Other examples are the special unsaturated compounds described in Japanese Patent Publication Nos. Sho 46-43946, Hei 1-40337, and Hei 1-40336 and the vinylphosphonic acid-type compounds described in Japanese Patent Application Publication No. Hei 2-25493. Structures containing a perfluoroalkyl group as described in Japanese Patent Application Publication No. Sho 61-22048 are suitably used in some cases. Also usable are the compounds introduced as photocurable monomers and oligomers in the *Journal of the Adhesion Society of Japan*, Volume 20, Number 7, pages 300 to 308 (1984).

The specifics of how these addition-polymerizable compounds are used, for example, their structure, whether a single one or a combination is used, the quantity of addition, and so forth, can be freely established in conformity with the properties designed for the final lithographic printing plate precursor. Selection can be made, for example, based on the following considerations.

Based on a consideration of the sensitivity, a structure is preferred that has a large unsaturated group content per molecule, and difunctional and above is preferred in many cases. In addition, trifunctional and above is preferred for the purpose of raising the strength of the image areas, that is, the cured film. It may also be effective to adjust both the sensitivity and strength by using combinations of compounds that have different numbers of functionalities different polymerizable groups (for example, acrylate esters, methacrylate esters, styrenic compounds, vinyl ether-type compounds).

The selection of the addition-polymerizable compound and its method of use are also important factors for the compatibility and dispersibility with respect to the other components (for example, binder polymer, radical polymerization initiator, colorant, and so forth) in the image recording layer. For example, it may be possible to improve the compatibility by the use of two or more compounds in combination and/or by the use of a low-purity compound. Moreover, it may be possible to select a particular structure with the goal of improving the adhesiveness with, inter alia, a protective layer, infra, and/or the support.

In the present invention, the total quantity of use in the image recording layer of the previously described polymerizable monomer that has a sulfonamide group and at least two ethylenically unsaturated groups and the polymerizable compound (C) that encompasses the optional other polymerizable monomer, is preferably in the range from 5 to 80 mass % and more preferably 25 to 75 mass %, in each case with reference to the nonvolatile components in the image recording layer.

In addition to the preceding, within the context of the use strategy for the addition-polymerizable compound, a suitable structure, composition, and quantity of addition can be freely selected based on a consideration of, for example, the magnitude of polymerization inhibition by oxygen, the resolution, the fogging behavior, the change in refractive index, the surface tackiness, and so forth. Depending on the circumstances, a layer structure-coating method such as undercoating and/or overcoating may also be implemented.

The image recording layer of the present invention may optionally incorporate the components described in the following.

<The Hydrophobing Precursor (D)>

The hydrophobing precursor in the present invention can be, for example, a finely divided particulate that, upon the application of heat, can convert the image recording layer to hydrophobicity. This finely divided particulate is preferably at least one particulate selected from finely divided hydrophobic thermoplastic polymer particulates and finely divided thermally reactive polymer particulates.

Preferred hydrophobic thermoplastic polymer fine particles used for the image recording layer can be exemplified by the hydrophobic thermoplastic fine particles described in Research Disclosure No. 33303 of January, 1992, Japanese Patent Application Publication Nos. Hei 9-123387, 9-131850, 9-171249, and 9-171250, and European Patent Specification No. 931,647.

The polymer constituting such a polymer fine particle can be specifically exemplified by homopolymers, copolymers, and mixtures thereof, from monomers such as ethylene, styrene, vinyl chloride, methyl acrylate, ethyl acrylate, methyl methacrylate, ethyl methacrylate, vinylidene chloride, acrylonitrile and vinylcarbazole. More preferred thereamong are polystyrene and polymethyl methacrylate.

The average particle size of the finely divided hydrophobic thermoplastic polymer particulate used in the present invention is preferably 0.01 to 2.0 μm.

Emulsion polymerization methods and suspension polymerization methods are examples of methods for synthesizing a finely divided hydrophobic thermoplastic polymer particulate having the above-indicated particle size and usable as the hydrophobing precursor. Another example is a dissolution/dispersion method in which these compounds are dissolved in a non-water-soluble organic solvent; this is mixed and emulsified with an aqueous solution that contains a dispersing agent; and heat is applied and solidification into a finely divided particulate form is performed while driving off the organic solvent.

The finely divided thermally reactive polymer particulate usable as a hydrophobing precursor in the present invention can be exemplified by finely divided thermosetting polymer particulates and finely divided, thermally reactive group-containing polymer particulates; these form a hydrophobing region by crosslinking due to a heat-induced reaction and by functional group changes that occur at this time.

The thermosetting polymer can be exemplified by phenolic skeleton-type resins, urea resins (for example, as provided by converting urea or a urea derivative such as methoxymethylated urea into a resin using an aldehyde such as formaldehyde), melamine resins (for example, as provided by converting melamine or a melamine derivative into a resin using an aldehyde such as formaldehyde), alkyd resins, unsaturated polyester resins, polyurethane resins, and epoxy resins. Particularly preferred thereamong are phenolic skeleton-type resins, melamine resins, urea resins, and epoxy resins.

Suitable phenolic skeleton-type resins can be exemplified by phenolic resins as provided by converting, for example, phenol or cresol, into a resin using an aldehyde such as formaldehyde, and by hydroxystyrene resins and the polymers and copolymers of a methacrylamide or acrylamide or methacrylate or acrylate that has a phenolic skeleton, e.g., N-(p-hydroxyphenyl)methacrylamide, p-hydroxyphenyl methacrylate, and so forth.

The average particle size of the finely divided thermosetting polymer particulate used in the present invention is preferably 0.01 to 2.0 μm.

The finely divided thermosetting polymer particulate under consideration is readily obtained by known dissolution/dispersion methods, but can also be produced by generating a finely divided particulate form during synthesis of the thermosetting polymer. The method of producing the finely divided thermosetting polymer particulate is not limited to the preceding and any known method can be used as appropriate.

The thermally reactive group in the finely divided, thermally reactive group-containing polymer particulate that may be used in the present invention may be a functional group that participates in any reaction that forms a chemical bond, but is suitably, for example, an ethylenically unsaturated group, which participates in a radical polymerization reaction (for example, the acryloyl group, methacryloyl group, vinyl group, or allyl group); a cationically polymerizable group (for example, the vinyl group and vinyloxy group); the addition-reactive isocyanate group, blocked isocyanate group, epoxy group, and vinyloxy group and the active hydrogen-containing functional groups that are reaction partners for the preceding (for example, the amino group, hydroxyl group, and carboxyl group); the condensation-reactive carboxyl group and the hydroxyl group and amino group that are reaction partners therefor; or an acid anhydride, which participates in a ring-opening addition reaction, and the amino group or hydroxyl group that are reaction partners therefor.

The introduction of these functional groups into the finely divided polymer particulate may be carried out during polymerization or may be carried out using a post-polymerization polymer reaction.

In the case of introduction during polymerization, preferably emulsion polymerization or suspension polymerization is carried out on a monomer that contains a functional group as described above. This monomer containing a functional group as described above can be specifically exemplified by allyl methacrylate, allyl acrylate, vinyl methacrylate, vinyl acrylate, 2-(vinyloxy)ethyl methacrylate, p-vinyloxystyrene, p-{2-(vinyloxy)ethyl}styrene, glycidyl methacrylate, glycidyl acrylate, 2-isocyanatoethyl methacrylate and the blocked isocyanate provided by blocking this with, for example, an alcohol, 2-isocyanatoethyl acrylate and the blocked isocyanate provided by blocking this with, for example, an alcohol, 2-aminoethyl methacrylate, 2-aminoethyl acrylate, 2-hydroxyethyl methacrylate, 2-hydroxyethyl acrylate, acrylic acid, methacrylic acid, maleic anhydride, difunctional acrylates, and difunctional methacrylates, but this monomer is not limited to the preceding.

The present invention can also use a copolymer from a monomer as described above and a monomer copolymerizable therewith but lacking a thermally reactive group. The copolymerizable monomer lacking a thermally reactive group can be exemplified by styrene, alkyl acrylate, alkyl methacrylate, acrylonitrile, and vinyl acetate, but there is no limitation to these and any monomer lacking a thermally reactive group can be used.

The polymer reaction used when introduction of the thermally reactive group is performed post-polymerization can be exemplified by the polymer reactions described in WO 96/34316.

Among the finely divided, thermally reactive group-containing polymer particulates described above, in a preferred embodiment thereof the finely divided polymer particles coalesce with each other under the action of heat, while in a particularly preferred embodiment thereof they have a hydrophilic surface and disperse in water. The contact angle (water droplet in air) for the film produced by applying only the finely divided polymer particles and drying at a temperature below the coalescence temperature is preferably less than the contact angle (water droplet in air) for the film produced by drying at a temperature above the coalescence temperature. Hydrophilicity may be imparted to the surface of the finely divided polymer particulate by adsorbing a hydrophilic polymer or oligomer, e.g., polyvinyl alcohol or polyethylene glycol, or a hydrophilic low molecular weight compound to the surface of the finely divided polymer particles. However, the method of hydrophilicizing the surface is not limited to the preceding.

The coalescence temperature for the finely divided, thermally reactive group-containing polymer particulate under consideration is preferably at least 70° C. and, when the timewise stability is taken into consideration, is more preferably at least 100° C. The average particle size of the finely divided polymer particles is preferably 0.01 to 2.0 μm and more preferably is 0.05 to 2.0 µm, while 0.1 to 1.0 µm is most suitable in particular. An excellent resolution and an excellent timewise stability are obtained in this range.

The content of the hydrophobing precursor is preferably in the range from 5 to 90 mass % as the solids fraction concentration, and the strength of the image region can be improved by addition in this range.

<The Binder Polymer (E)>

A polymer binder may be used in the image recording layer in the present invention in order to improve the film strength of the image recording layer. The heretofore known binder polymers may be used without limitation for the binder polymer used in the present invention, and film-forming polymers are preferred. Examples of such binder polymers are acrylic resins, polyvinyl acetal resins, polyurethane resins, polyurea resins, polyimide resins, polyamide resins, epoxy resins, methacrylic resins, polystyrene resins, novolac-type phenolic resins, polyester resins, synthetic rubbers, and natural rubbers.

The binder polymer may be crosslinkable in order to improve the film strength of the image areas. A crosslinkable functional group, e.g., an ethylenically unsaturated bond, may be introduced into the main chain of the polymer or in side chain position on the polymer in order to impart crosslinkability to the binder polymer. The crosslinkable functional group may be introduced by copolymerization.

Examples of polymers that have ethylenically unsaturated bonds in the molecular main chain are poly-1,4-butadiene, poly-1,4-isoprene, and so forth.

Examples of polymers that have ethylenically unsaturated bonds in side chain position on the molecule are polymers of an ester or amide of acrylic acid or methacrylic acid wherein the ester or amide residue (R in —COOR or CONHR) contains an ethylenically unsaturated bond.

This ethylenically unsaturated bond-containing residue (the above-referenced R) can be exemplified by —$(CH_2)_n$CR$^1$=CR$^2$R$^3$, —$(CH_2O)_n$CH$_2$CR$^1$=CR$^2$R$^3$, —$(CH_2CH_2O)_n$CH$_2$CR$^1$=CR$^2$R$^3$, —$(CH_2)_n$NH—CO—O—CH$_2$CR$^1$=CR$^2$R$^3$, —$(CH_2)_n$—O—CO—CR$^1$=CR$^2$R$^3$, and —$(CH_2CH_2O)_2$—X (in the formulas, R$^1$ to R$^3$ each represent the hydrogen atom, a halogen atom, $C_{1-20}$ alkyl, aryl, alkoxy, or aryloxy, wherein R$^1$ may be bonded with R$^2$ or R$^3$ to form a ring; n is an integer from 1 to 10; and X represents a dicyclopentadienyl residue).

The residue in the ester can be specifically exemplified by —CH$_2$CH=CH$_2$ (described in Japanese Patent Publication No. Hei 7-21633), —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$NHCOO—CH$_2$CH=CH$_2$, and —CH$_2$CH$_2$O—X (X in the formula represents a dicyclopentadienyl residue).

The amide residue can be specifically exemplified by —CH$_2$CH=CH$_2$, —CH$_2$CH$_2$—Y (Y in the formula represents a cyclohexene residue), and —CH$_2$CH$_2$—OCO—CH=CH$_2$.

The crosslinkable binder polymer cures, for example, by the addition of a free radical (polymerization-initiating radical or the propagating radical in the polymerization process of a polymerizable compound) to the crosslinkable functional group in the crosslinkable binder polymer and the occurrence of addition polymerization between polymers, either directly or through a polymer chain from the polymerizable compound, resulting in the formation of crosslinks between polymer molecules. Or, an atom in the polymer (for example, a hydrogen atom on a carbon atom adjacent to the functional crosslinking group) is abstracted by a free radical to produce polymer radicals and these bond to each other to bring about curing by the formation of crosslinks between polymer molecules.

The crosslinkable group content in the binder polymer (content of the radically polymerizable unsaturated double bonds as determined by iodine titration) is preferably 0.1 to 10.0 mmol, more preferably 1.0 to 7.0 mmol, and most preferably 2.0 to 5.5 mmol, in each case per 1 g of the binder polymer. An excellent sensitivity and an excellent storage stability are obtained in the cited range.

Viewed from the perspective of the developability of the nonphotoexposed regions of the image recording layer, the binder polymer preferably also contains a hydrophilic group in order to improve the solubility or dispersibility of the nonphotoexposed regions in the fountain solution. As a consequence, the co-use of a crosslinking group and a hydrophilic group is also effectively employed in the present invention.

With regard to the hydrophilic group, suitable binder polymers contain a hydrophilic group such as, for example, the hydroxyl group, the carboxyl group, a carboxylate group, an alkyleneoxy group (e.g., ethyleneoxy, hydroxyethyl, polyoxyethyl, propyleneoxy, hydroxypropyl, polyoxypropyl, and so forth), the amino group, aminoethyl, aminopropyl, the ammonium group, an amide group, carboxymethyl, the sulfo group, a phosphate group, a carboxylic acid group, and so forth. The binder polymer preferably has an ethyleneoxy group or hydroxyl group or ester group or amide group or carboxylic acid group and most preferably contains an ethyleneoxy group, polyoxyethyl group, or carboxylic acid group.

The presence of a carboxylic acid group is preferred in the case of an alkaline-developing printing plate, while the presence of an alkyleneoxy group and particularly the ethyleneoxy group or polyoxyethyl group is preferred in the case of an on-press-developable printing plate.

The following are specific examples: gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate that has a degree of hydrolysis of at least 60 mol % and preferably at least 80 mol %, polyvinyl formal, polyvinyl butyral, polyvinylpyrrolidone, homopolymers and copolymers of acrylamide, homopolymers and copolymers of methacrylamide, homopolymers and copolymers of N-methylolacrylamide, polyvinylpyrrolidone, alcohol-soluble nylon, polyethers between 2,2-bis(4-hydroxyphenyl)propane and epichlorohydrin, and so forth.

A polymer that contains a solvent-resistance functional group can also be suitably used as the binder polymer. The solvent-resistance functional group can be exemplified by the sulfonamide group, the cyano group, and the maleimide group and is preferably the sulfonamide group or maleimide group and is more preferably the sulfonamide group. The sulfonamide group-containing binder can be exemplified by polymers that have the following structure (I) and/or (II). The proportion of the (I) and/or (II) structure in the sulfonamide group-containing polymer is preferably at least 5 mol %, more preferably at least 10 mol %, and most preferably at least 15 mol %. There are no particular limitations on the component copolymerized with structure (I) and/or (II), but this component preferably has an ethylene oxide chain or an ethylenically unsaturated group or a long-chain alkyl group in side chain position.

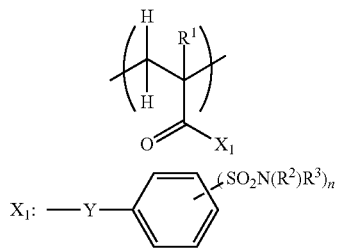

(I)

$X_1$: —Y—<benzene ring with $SO_2N(R^2)R^3)_n$>

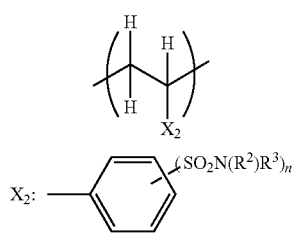

(II)

$X_2$: —<benzene ring with $SO_2N(R^2)R^3)_n$> or $X^1$: —Y—SO$_2$N(R$^2$)(R$^3$)

R$^1$ in the preceding formula represents hydrogen or C$_{1-10}$ alkyl, alkoxymethyl, alkyl ester-substituted methyl, or α-alkoxymethyl. R$^1$ is preferably the hydrogen atom or a methyl group. R$^2$ and R$^3$ in the preceding formulas each represent hydrogen or C$_{1-10}$ alkyl, phenyl, pyridyl, pyrimidyl, alkyl-substituted pyrimidyl, or thiophenyl, wherein the alkyl may be substituted by the hydroxyl group or an amino group and may also incorporate an ether bond, ester bond, or ureido bond. R$^2$ and R$^3$ are each preferably hydrogen or methyl or alkyl-substituted pyrimidyl. n is 1 to 3.

Y in the preceding formulas is a trivalent to decavalent group composed of nonmetal atoms and, for example, is composed of at least one element selected from 1 to 60 carbon atoms, 0 to 10 nitrogen atoms, 0 to 50 oxygen atoms, 1 to 100 hydrogen atoms, and 0 to 20 sulfur atoms. Y can be specifically exemplified by a group composed of a single one of the following structures or a combination of a plurality of the following structures. Y is particularly preferably a group that contains —O—, —NH—, or —O— and —NH—.

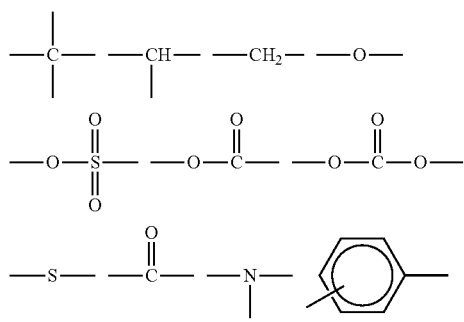

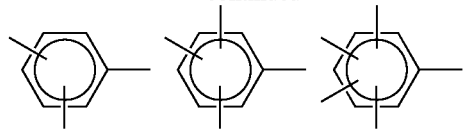

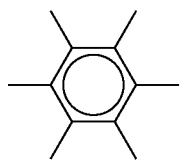

polyvalent naphthalene, polyvalent anthracene

There are no particular limitations on the cyano group-containing binder polymer other than that the cyano group must be present, and the cyano group-containing binder polymer can be exemplified by polymers that contain the following structure (III) and/or structure (IV).

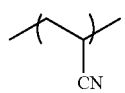

(III)

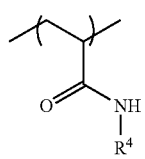

(IV)

R$^4$ in the preceding formula represents, for example,

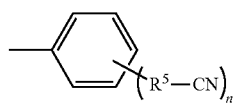

and R$^5$ in the preceding formula represents, for example, a single bond or an oxyalkylene group (—OC$_m$H$_{2m}$— wherein m=2 to 18 and preferably 2 to 4) and n is 1 to 5 and preferably 1 to 2.

The proportion of structure (III) and/or (IV) in the cyano group-containing binder polymer is preferably at least 5 mol %, more preferably at least 10 mol %, and most preferably at least 15 mol %, and structure (III) and/or (IV) may be 100 mol %.

There are no particular limitations on the component copolymerized with structure (III) and/or (IV) in the cyano group-containing polymer, but this component preferably has an ethylene oxide chain or an ethylenically unsaturated group or a long-chain alkyl group.

There are no particular limitations on the maleimide group-containing binder polymer other than that a maleimide-derived cyclic structure must be present, and the maleimide group-containing binder polymer can be exemplified by polymers that contain the following structure (V).

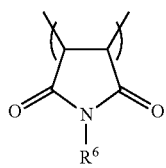

(V)

$R^6$ represents a possibly substituted phenyl group or $C_{1-10}$ alkyl group (the substituent can be exemplified by the sulfonamide group and hydroxyl group).

The proportion of structure (V) in the maleimide group-containing polymer is preferably at least 5 mol %, more preferably at least 10 mol %, and most preferably at least 15 mol %, and structure (V) may be 100 mol %.

There are no particular limitations on the component copolymerized with structure (V) in the maleimide group-containing binder polymer, but this component preferably has an ethylene oxide chain or an ethylenically unsaturated group or a long-chain alkyl group.

Specific examples of the binder polymer are provided below, but the binder polymer used is not limited to these.

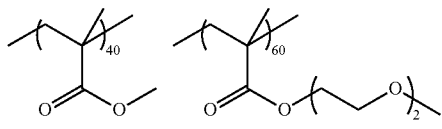

(B1)

Mw = 67000

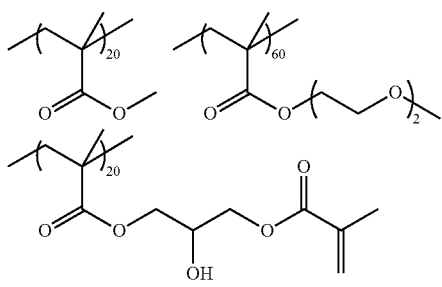

(B-2)

Mw = 55000

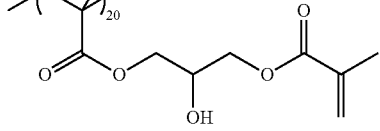

(B-3)

Mw = 84000

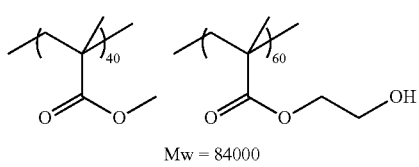

(B-4)

Mw = 65000

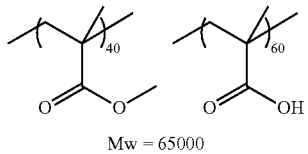

(B-5)

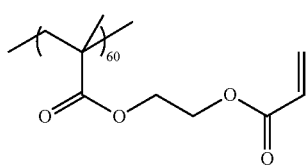

Mw = 100000

(B-6)

Mw = 100000

(B-7)

Mw = 80000

(B-8)

Mw = 40000

(B-9)

Mw = 80000

(B-10)
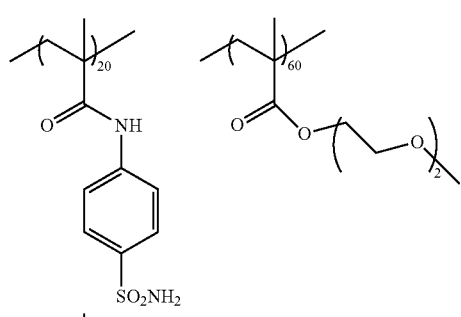
Mw = 77000
(B-11)
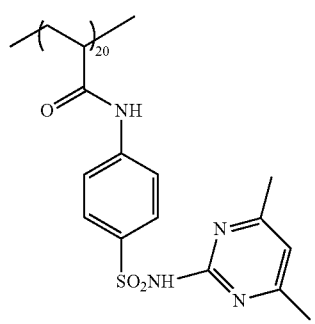
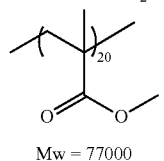
Mw = 84000
(B-12)
Mw = 77000
(B-13)
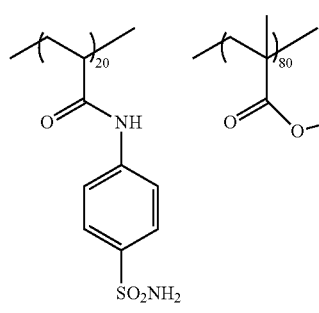
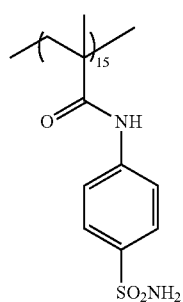
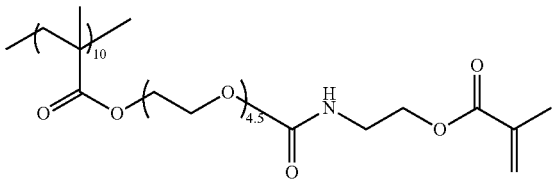
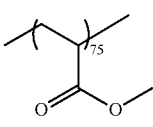
Mw = 65000
(B-14)
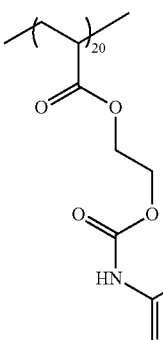
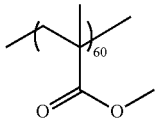
Mw = 54000
(B-15)
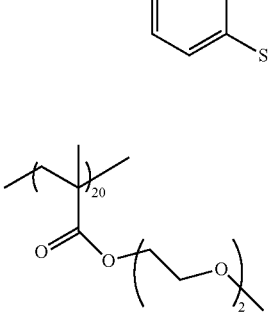
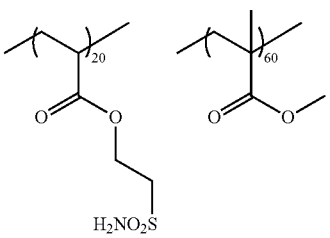
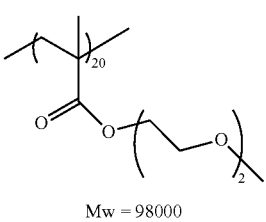
Mw = 98000

-continued
(B-16)
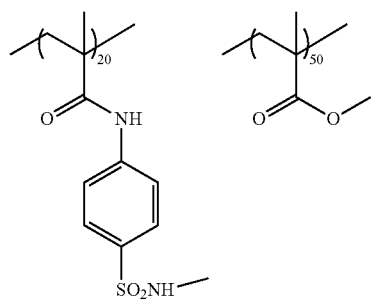
Mw = 94000
(B-17)
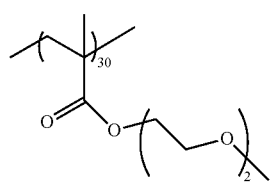
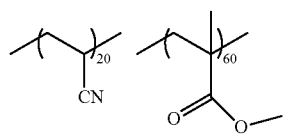
Mw = 67000
(B-18)
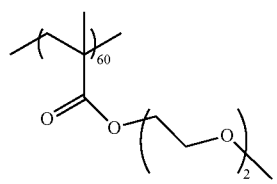
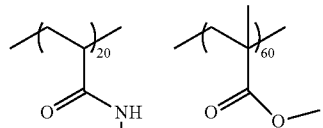
Mw = 32000
-continued
(B-19)
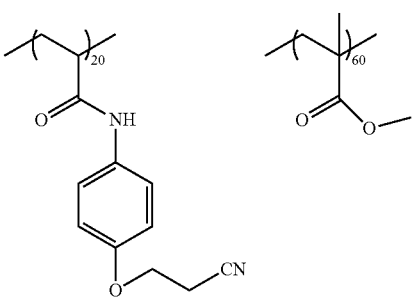
Mw = 77000
(B-20)
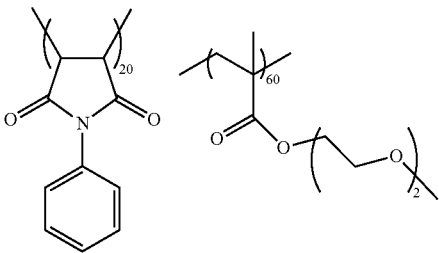
Mw = 54000
(B-21)
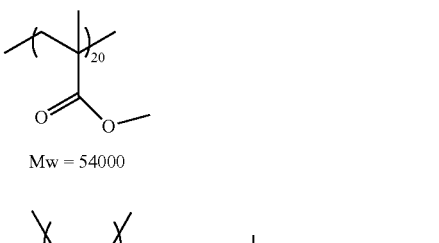
Mw = 72000
(B-22)
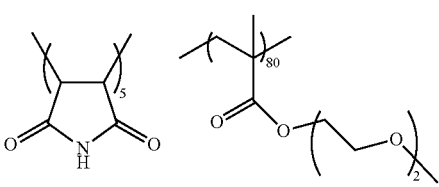

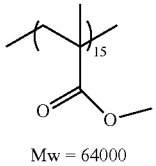

Mw = 64000

The binder polymer has a mass-average molar mass preferably of at least 5000 and more preferably of 10,000 to 300,000 and has a number-average molar mass preferably of at least 1000 and more preferably of 2000 to 250,000. The polydispersity (mass-average molar mass/number-average molar mass) is preferably 1.1 to 10.

The binder polymer may be acquired by purchase of a commercially available product or may be acquired by synthesis by a known method.

The binder polymer content is 5 to 90 mass % and preferably 5 to 80 mass % and more preferably 10 to 70 mass %, in each case with reference to the total solids fraction of the image recording layer. An excellent strength for the image area and an excellent image formability are obtained in this range.

The polymerizable compound (C) and the binder polymer (E) are preferably used in the present invention in quantities that provide a mass ratio of 0.4/1 to 1.8/1. 0.7/1 to 1.5/1 is more preferred. The ability to improve the on-press developability or gum developability while maintaining the printing durability unchanged, which is an effect of the present invention, is significantly manifested in the specified range.

<Microcapsule and/or Microgel>

Viewed from the perspective of obtaining an excellent on-press developability, the image recording layer in the present invention preferably takes the form of an embodiment that contains microcapsules and/or a microgel. This is an embodiment in which the previously described constituent components (A) to (C) of the image recording layer and any other constituent components, infra, are incorporated in microcapsules and/or a microgel.

The microcapsule used by the present invention can be, for example, a microcapsule that incorporates all or a portion of the constituent components (the previously described components (A) to (C)) of the image recording layer, as described in Japanese Patent Application Publication Nos. 2001-277740 and 2001-277742. Constituent components of the image recording layer can also be present outside the microcapsules. In a preferred embodiment of a microcapsule-containing image recording layer, the hydrophobic constituent components are incorporated in microcapsules while the hydrophilic constituent components are present outside the microcapsules. These correspond to the hydrophobing precursor (D).

On the other hand, the image recording layer in the present invention may take the form of an embodiment that contains crosslinked resin particles, i.e., a microgel. This microgel can contain a portion of the previously described (A) to (C) within the microgel and/or on its surface. In particular, an embodiment that employs a microgel made reactive by disposing the polymerizable compound (C) on its surface is particularly preferred from the standpoints of the image-forming sensitivity and printing durability.

Known methods can be employed to microcapsulate the constituent components of the image recording layer or to formulate these components as a microgel.

The microcapsule production method can be exemplified by the following, but is not limited to the following: the use of coacervation as described in U.S. Pat. Nos. 2,800,457 and 2,800,458; interfacial polymerization as described in U.S. Pat. No. 3,287,154 and Japanese Patent Publication Nos. Sho 38-19574 and Sho 42-446; polymer precipitation as described in U.S. Pat. Nos. 3,418,250 and 3,660,304; the use of an isocyanate polyol wall material as described in U.S. Pat. No. 3,796,669; the use of an isocyanate wall material as described in U.S. Pat. No. 3,914,511; the use of a urea/formaldehyde-type or urea/formaldehyde/resorcinol-type wall-forming material as described in U.S. Pat. Nos. 4,001,140, 4,087,376, and 4,089,802; the use of a melamine-formaldehyde resin or hydroxycellulose wall material as described in U.S. Pat. No. 4,025,445; in situ polymerization of monomer as described in Japanese Patent Publication Nos. Sho 36-9163 and Sho 51-9079; spray drying as described in Great Britain Patent No. 930422 and U.S. Pat. No. 3,111,407; and electrolytic dispersion and cooling as described in Great Britain Patent Nos. 952807 and 967074.

A preferred microcapsule wall for use in the present invention has three-dimensional crosslinking and is solvent swellable. From this standpoint, the microcapsule wall material is preferably polyurea, polyurethane, polyester, polycarbonate, polyamide, or a mixture of the preceding, with polyurea and polyurethane being particularly preferred. In addition, a compound having a crosslinkable functional group (e.g., an ethylenically unsaturated bond) capable of introduction into the binder polymer may be introduced into the microcapsule wall.

The microgel production method can be the interfacial polymerization-based granulation described in Japanese Patent Publication Nos. Sho 38-19574 and Sho 42-446 or granulation based on nonaqueous dispersion polymerization as described in Japanese Patent Application Publication No. Hei 5-61214. However, there is no limitation to these methods.

The known microcapsule production methods described above can be used for the aforementioned interfacial polymerization-based method.

A preferred microgel for use in the present invention is granulated using interfacial polymerization and has three-dimensional crosslinking. From this standpoint, the material used is preferably polyurea, polyurethane, polyester, polycarbonate, polyamide, or a mixture of the preceding, with polyurea and polyurethane being particularly preferred.

The average particle size of the microcapsule or microgel is preferably from 0.01 to 3.0 µm, more preferably from 0.05 to 2.0 µm, and particularly preferably from 0.10 to 1.0 µm. Good resolution and good timewise stability are obtained within the cited range.

<Other Components>

The image recording layer of the present invention may contain other components on an optional basis.

The other components that may constitute the image recording layer in the present invention are described in the following.

(1) Surfactants

A surfactant may be used in the image recording layer of the present invention in order to improve the coating planarity.

The surfactant can be a nonionic surfactant, anionic surfactant, cationic surfactant, amphoteric surfactant, or fluorosurfactant, among which a fluorosurfactant is preferred.

The fluorosurfactant can be, for example, a fluorosurfactant that contains a perfluoroalkyl group in the molecule. Such fluorosurfactants can be exemplified by anionic fluorosurfactants such as perfluoroalkylcarboxylate salts, perfluoroalkylsulfonate salts, perfluoroalkyl phosphate esters, and so forth; amphoteric fluorosurfactants such as perfluoroalkylbetaines and so forth; cationic fluorosurfactants such as perfluoroalkyltrimethylammonium salts and so forth; and nonionic fluorosurfactants such as perfluoroalkylamine oxides, perfluoroalkyl/ethylene oxide adducts, oligomers that contain both a perfluoroalkyl group and a hydrophilic group, oligomers that contain both a perfluoroalkyl group and an oleophilic group, oligomers that contain a perfluoroalkyl group and a hydrophilic group and an oleophilic group, urethanes that contain both a perfluoroalkyl group and an oleophilic group, and so forth. Also suitable are the fluorosurfactants described in Japanese Patent Application Publication Nos. Sho 62-170950, Sho 62-226143, and Sho 60-168144.

A single surfactant may be used or a combination of two or more surfactants may be used.

The surfactant content is preferably 0.001 to 10 mass % and more preferably 0.01 to 5 mass %, in each case with reference to the total solids fraction in the image recording layer.

(2) Colorants

A dye that absorbs strongly in the visible light region can be used as an image colorant in the image recording layer of the present invention. Specific examples are Oil Yellow #101, Oil Yellow #103, Oil Pink #312, Oil Green BG, Oil Blue BOS, Oil Blue #603, Oil Black BY, Oil Black BS, and Oil Black T-505 (the preceding are products of Orient Chemical Industries, Ltd.), as well as Victoria Pure Blue, Crystal Violet (CI-42555), Methyl Violet (CI-42535), Ethyl Violet, Rhodamine B (CI 145170B), Malachite Green (CI-42000), Methylene Blue (CI-52015), and the dyes described in Japanese Patent Application Publication No. Sho 62-293247. Also suitable for use are pigments such as phthalocyanine pigments, azo pigments, carbon black, titanium oxide, and so forth.

The addition of these colorants is preferred because their use facilitates discrimination of the image areas from the nonimage areas after image formation.

The quantity of addition is 0.01 to 10 mass % with reference to the total solids fraction of the image recording layer.

(3) Print-Out Agents

A compound that changes color under the action of acid or radicals can be added to the image recording layer of the present invention in order to produce a print-out image.

Various dyes, for example, diphenylmethane types, triphenylmethane types, thiazine types, oxazine types, xanthene types, anthraquinone types, iminoquinone types, azo types, and azomethine types, are effectively used as this compound.

Specific examples are as follows: dyes such as Brilliant Green, Ethyl Violet, Methyl Green, Crystal Violet, Basic Fuchsin, Methyl Violet 2B, Quinaldine Red, Rose Bengal, Methanyl Yellow, Thymol Sulfophthalein, Xylenol Blue, Methyl Orange, Paramethyl Red, Congo Red, Benzopurpurin 4B, a-Naphthyl Red, Nile Blue 2B, Nile Blue A, Methyl Violet, Malachite Green, Parafuchsin, Victoria Pure Blue BOH (Hodogaya Chemical Co., Ltd.), Oil Blue #603 (Orient Chemical Industries, Ltd.), Oil Pink #312 (Orient Chemical Industries, Ltd.), Oil Red 5B (Orient Chemical Industries, Ltd.), Oil Scarlet #308 (Orient Chemical Industries, Ltd.), Oil Red OG (Orient Chemical Industries, Ltd.), Oil Red RR (Orient Chemical Industries, Ltd.), Oil Green #502 (Orient Chemical Industries, Ltd.), Spiron Red BEH Special (Hodogaya Chemical Co., Ltd.), m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethypaminophenyliminonaphthoquinone, 1-phenyl-3-methyl-4-p-diethylaminophenylimino-5-pyrazolone, and 1-β-naphthyl-4-p-diethylaminophenylimino-5-pyrazolone; also, leuco dyes such as p,p',p"-hexamethyltriaminotriphenylmethane (Leuco Crystal Violet) and Pergascript Blue SRB (Ciba Geigy Ltd.).

In addition to the preceding, the leuco dyes known as materials for heat-sensitive paper and pressure-sensitive paper are also suitably used. Specific examples are as follows: Crystal Violet lactone, Malachite Green lactone, benzoyl leuco Methylene Blue, 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N—N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-azaphthalide, and 3-(4-diethylaminophenyl)-3-(1-ethyl-2-methylindol-3-yl)phthalide.

A suitable quantity of addition for the dye that undergoes acid- or radical-induced color change is preferably 0.01 to 10 mass % with reference to the solids fraction in the image recording layer.

(4) Polymerization Inhibitors

A small amount of a thermal polymerization inhibitor is preferably added to the image recording layer in the present invention in order to prevent unwanted thermal polymerization of the polymerizable compound (C) during production or storage of the image recording layer.

Suitable examples of the thermal polymerization inhibitor are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitroso-N-phenylhydroxylamine/aluminum salt.

The quantity of addition for the thermal polymerization inhibitor is preferably approximately 0.01 mass % to approximately 5 mass % with reference to the total solids fraction of the image recording layer.

(5) Higher Fatty Acid Derivatives and so Forth

In order to prevent oxygen-mediated inhibition of the polymerization, for example, a higher fatty acid or derivative thereof, such as behenic acid or behenamide, may be added to the image recording layer of the present invention; this becomes partitioned to the surface of the image recording layer in the drying process that follows coating.

The quantity of addition of the higher fatty acid derivative is preferably approximately 0.1 mass % to approximately 10 mass % with reference to the total solids fraction of the image recording layer.

(6) Plasticizers

The image recording layer in the present invention may contain a plasticizer in order to improve the on-press developability.

Suitable examples of the plasticizer are as follows: phthalate esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, diallyl phthalate, and so forth; glycol esters such as dimethyl glycol phthalate, ethyl phthalyl ethyl glycolate, methyl phthalyl ethyl glycolate, butyl phthalyl butyl glycolate, triethylene glycol dicaprylate, and so forth; phosphate esters such as tricresyl phosphate, triphenyl phosphate, and so forth; esters of dibasic aliphatic acids such as diisobutyl adipate, dioctyl adipate, dimethyl sebacate, dibutyl sebacate, dioctyl azelate, dibutyl maleate, and so forth; and also polyglycidyl methacrylate, triethyl citrate, glycerol triacetate, and butyl laurate.

The plasticizer content is preferably no more than approximately 30 mass % with respect to the total solids fraction in the image recording layer.

(7) Finely Divided Inorganic Particles

The image recording layer in the present invention may contain finely divided inorganic particles in order to improve the cured film strength and improve the on-press develop ability.

Suitable examples of the finely divided inorganic particles are silica, alumina, magnesium oxide, titanium oxide, magnesium carbonate, calcium alginate, and mixtures of the preceding. These can be used to strengthen the film and, through surface roughening, to reinforce the interfacial adhesion.

The finely divided inorganic particles preferably have an average particle size of 5 nm to 10 µm and more preferably 0.5 µm to 3 µm. Within the cited range, the finely divided inorganic particles can be stably dispersed in the image recording layer and can satisfactorily maintain the film strength of the image recording layer and can also form nonimage areas that exhibit an excellent hydrophilicity and thus are resistant to scumming during printing.

The finely divided inorganic particles under consideration can be easily acquired as commercial products, e.g., as a colloidal dispersion of silica.

The content of the finely divided inorganic particles is preferably not more than 40 mass % and more preferably not more than 30 mass %, in each case with reference to the total solids fraction of the image recording layer.

(8) Low Molecular Weight Hydrophilic Compounds

The image recording layer in the present invention may also contain a low molecular weight hydrophilic compound in order to improve the on-press developability or gum developability without degrading the printing durability.

The low molecular weight hydrophilic compound can be exemplified by water-soluble organic compounds, e.g., glycols such as ethylene glycol, diethylene glycol, triethylene glycol, propylene glycol, dipropylene glycol, tripropylene glycol, and so forth, as well as ether and ester derivatives of the preceding; polyhydroxy compounds such as glycerol, pentaerythritol, tris(2-hydroxyethyl)isocyanurate, and so forth; organic amines such as triethanolamine, diethanolamine, monoethanolamine, and so forth, as well as their salts; organosulfonic acids such as alkylsulfonic acids, toluenesulfonic acid, benzenesulfonic acid, and so forth, as well as their salts; organosulfamic acids such as alkylsulfamic acids and so forth, as well as their salts; organosulfuric acids such as alkylsulfuric acids, alkyl ether sulfuric acids and so forth, as well as their salts; organophosphonic acids such as phenylphosphonic acid and so forth, as well as their salts; and organic carboxylic acids such as tartaric acid, oxalic acid, citric acid, malic acid, lactic acid, gluconic acid, amino acids, and so forth, as well as their salts.

Among the preceding, the use is preferred of a salt of an organosulfur acid, e.g., the sodium salt or lithium salt of an organosulfonic acid, an organosulfamic acid, or an organosulfuric acid.

Examples of specific organosulfonate salt compounds are sodium normal-butylsulfonate, sodium isobutylsulfonate, sodium sec-butylsulfonate, sodium tert-butylsulfonate, sodium normal-pentylsulfonate, sodium 1-ethylpropylsulfonate, sodium normal-hexylsulfonate, sodium 1,2-dimethylpropylsulfonate, sodium 2-ethylbutylsulfonate, sodium 2-ethylhexylsulfonate, sodium cyclohexylsulfonate, sodium normal-heptylsulfonate, sodium normal-octylsulfonate, sodium tert-octylsulfonate, sodium normal-nonylsulfonate, sodium allylsulfonate, sodium 2-methylallylsulfonate, sodium 4-[2-(2-butyloxyethoxy) ethoxy]butane-1-sulfonate, sodium 4-[2-(2-hexyloxyethoxy)ethoxy]butane-1-sulfonate, sodium 4-{2-[2-(2-ethyl)hexyloxyethoxy]ethoxy}butane-1-sulfonate, sodium 4-[2-(2-decyloxyethoxy)ethoxy]butane-1-sulfonate, sodium 4-{2-[2(2-butyloxyethoxy)ethoxy]ethoxy}butane-1-sulfonate, sodium 4-[2-{2-[2-(2-ethyl)hexyloxyethoxy]ethoxy}ethoxy]butane-1-sulfonate, sodium benzenesulfonate, sodium p-toluenesulfonate, sodium p-hydroxybenzenesulfonate, sodium p-styrenesulfonate, sodium dimethyl 5-sulfoisophthalate, disodium 1,3-benzenedisulfonate, trisodium 1,3,5-benzenetrisulfonate, sodium p-chlorobenzenesulfonate, sodium 3,4-dichlorobenzenesulfonate, sodium 1-naphthylsulfonate, sodium 2-naphthylsulfonate, sodium 4-hydroxynaphthylsulfonate, disodium 1,5-naphthalenedisulfonate, disodium 2,6-naphthalenedisulfonate, trisodium 1,3,6-naphthalenetrisulfonate, and the salts of the preceding obtained by exchange with lithium.

Specific organosulfamate salt compounds are sodium normal-butylsulfamate, sodium isobutylsulfamate, sodium tert-butylsulfamate, sodium normal-pentylsulfamate, sodium 1-ethylpropylsulfamate, sodium normal-hexylsulfamate, sodium 1,2-dimethylpropylsulfamate, sodium 2-ethylbutylsulfamate, sodium cyclohexylsulfamate, and the salts of the preceding obtained by exchange with lithium.

The hydrophobic moiety has a small structure in these compounds and as a consequence these compounds have almost no surface-active action and can be clearly distinguished from the previously cited surfactants that are used with good effect, such as the long-chain alkylsulfonate salts and long-chain alkylbenzenesulfonate salts.

Compounds represented by the following general formula (3) are preferably used in particular as the organosulfate salt.

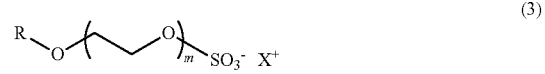
(3)

In general formula (3), R represents alkyl, alkenyl, alkynyl, aryl, or a heterocyclic group; m represents an integer from 1 to 4; and X represents sodium, potassium, or lithium.

Preferred examples of R are straight chain, branched, and cyclic $C_{1-12}$ alkyl, $C_{1-12}$ alkenyl, $C_{1-12}$ alkynyl, and aryl that has no more than 20 carbons. These groups may also have a substituent or substituents. Substituents that may be introduced in this case can be exemplified by straight chain, branched, and cyclic $C_{1-12}$ alkyl, $C_{1-12}$ alkenyl, alkynyl, halogen, and aryl that has no more than 20 carbons.

Preferred examples of compounds represented by general formula (3) are as follows: sodium oxyethylene 2-ethylhexyl ether sulfate, sodium dioxyethylene 2-ethylhexyl ether sulfate, potassium dioxyethylene 2-ethylhexyl ether sulfate, lithium dioxyethylene 2-ethylhexyl ether sulfate, sodium trioxyethylene 2-ethylhexyl ether sulfate, sodium tetraoxyethylene 2-ethylhexyl ether sulfate, sodium dioxyethylene hexyl ether sulfate, sodium dioxyethylene octyl ether sulfate, and sodium dioxyethylene lauryl ether sulfate. The compounds most preferred among the preceding are sodium dioxyethylene 2-ethylhexyl ether sulfate, potassium dioxyethylene 2-ethylhexyl ether sulfate, and lithium dioxyethylene 2-ethylhexyl ether sulfate.

The quantity of addition of the low molecular weight hydrophilic compound to the image recording layer is preferably at least 0.5 mass % to no more than 20 mass % of the total solids fraction of the image recording layer, more preferably at least 1 mass % to no more than 10 mass % of the total solids fraction of the image recording layer, and even more preferably at least 2 mass % to no more than 8 mass % of the total solids fraction of the image recording layer. An excellent on-press developability and an excellent printing durability are obtained in the cited range.

A single one of these compounds may be used or a combination of two or more may be used.

(9) Oleosensitizers

An oleosensitizer, e.g., a phosphonium compound, low molecular weight nitrogenous compound, or ammonium group-containing polymer, can be used in the image recording layer in order to improve the receptivity in those instances where an inorganic layer compound is present in the protective layer, infra. Different species may be used in combination as the oleosensitizer.

These compounds function as a surface coating agent (oleosensitizer) for the inorganic layer compound and prevent the inorganic layer compound from lowering the receptivity during the course of printing.

Suitable phosphonium compounds can be exemplified by compounds represented by the following general formula (4) as described in Japanese Patent Application Publication No. 2006-297907 and compounds represented by the following general formula (5) as described in Japanese Patent Application Publication No. 2007-50660.

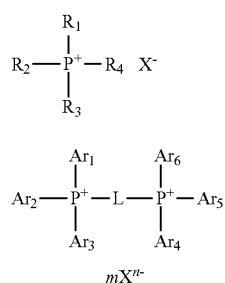

$R_1$ to $R_4$ in general formula (4) each independently represent possibly substituted alkyl, alkenyl, alkynyl, cycloalkyl, alkoxy, aryl, aryloxy, alkylthio, or a heterocyclic group or the hydrogen atom. At least two of $R_1$ to $R_4$ may be bonded to each other to form a ring. X— represents a counteranion.

In general formula (5), $Ar_1$ to $Ar_6$ each independently represent aryl or a heterocyclic group; L represents a divalent linking group; X represents an n-valent counteranion; n represents an integer with a value of 1 to 3; and m represents a number that satisfies n×m=2. Preferred examples of the aryl here are phenyl, naphthyl, tolyl, xylyl, fluorophenyl, chlorophenyl, bromophenyl, methoxyphenyl, ethoxyphenyl, dimethoxyphenyl, methoxycarbonylphenyl, dimethylaminophenyl, and so forth.

The heterocyclic group can be exemplified by pyridyl, quinolyl, pyrimidinyl, thienyl, furyl, and so forth. L represents a divalent linking group. The number of carbons in the linking group is preferably 6 to 15, and more preferably this is a $C_{6-12}$ linking group. X— represents a counteranion, wherein preferred counteranions are halogen anions such as Cl—, Br—, and I—, the sulfonate anion, carboxylate anions, sulfate ester anions, $PF_6$—, $BF_4$—, and the perchlorate anion. Particularly preferred thereamong are halogen anions such as Cl—, Br—, and I—, the sulfonate anion, and carboxylate anions.

The following are specific examples of phosphonium compounds represented by the above cited general formula (4) or (5).

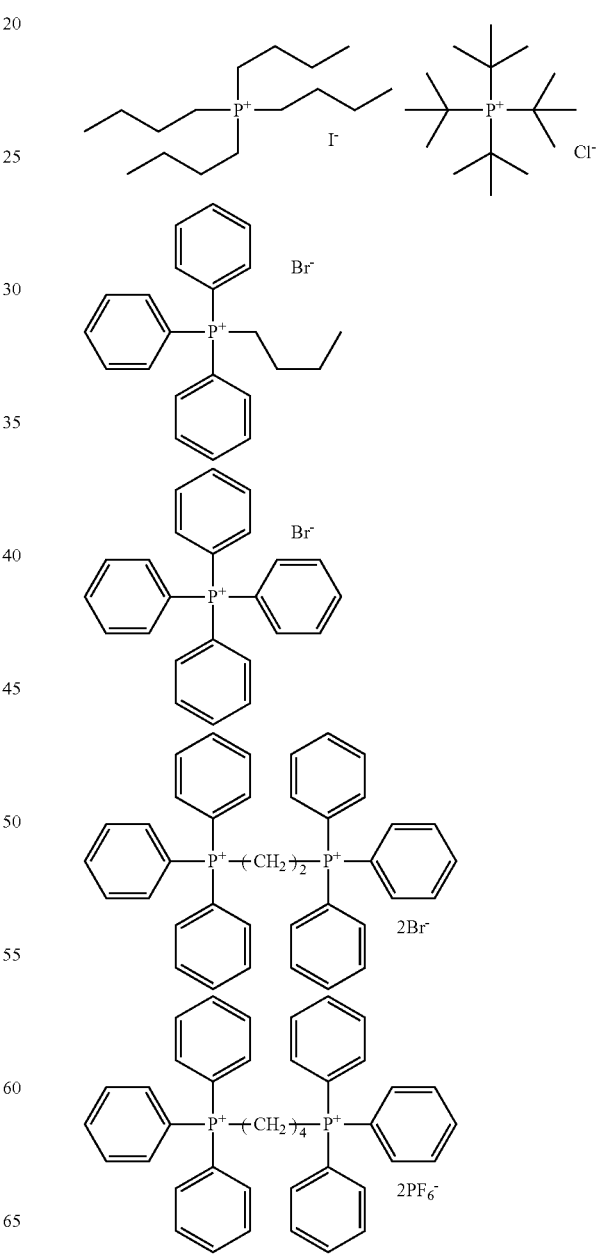

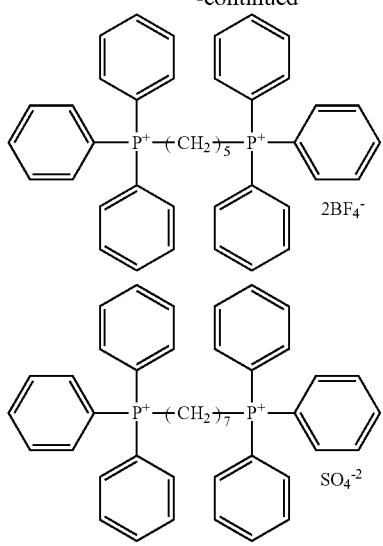

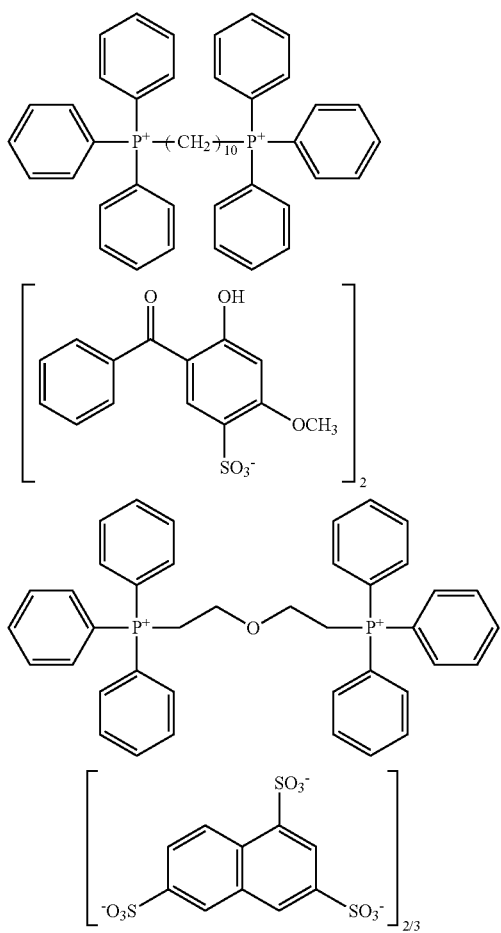

In addition to the phosphonium compounds described above, the following low molecular weight nitrogenous compounds are examples of oleosensitizers suitable for use in the present invention. Compounds having the structure shown in general formula (6) below are examples of preferred low molecular weight nitrogenous compounds.

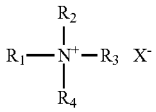
(6)

$R_1$ to $R_4$ in the formula each independently represent alkyl, alkenyl, alkynyl, cycloalkyl, alkoxy, aryl, aralkyl, or a heterocyclic group, in each case substituted or unsubstituted, or the hydrogen atom. At least two of $R_1$ to $R_4$ may be bonded to each other with the formation of a ring. X— is an anion and represents $PF_6$—, $BF_4$—, or an organosulfonate anion having a substituent selected from alkyl, alkenyl, alkynyl, cycloalkyl, alkoxy, aryl, aralkyl, and heterocyclic groups.

Thus, the low molecular weight nitrogenous compound used by the present invention can be an amine salt in which at least one of $R_1$ to $R_4$ is the hydrogen atom or a quaternary ammonium salt in which none of $R_1$ to $R_4$ are the hydrogen atom. Other acceptable structures are the imidazolinium salts represented by the following general formula (7), benzoimidazolinium salts represented by the following general formula (8), pyridinium salts represented by the following general formula (9), and quinolinium salts represented by the following general formula (10).

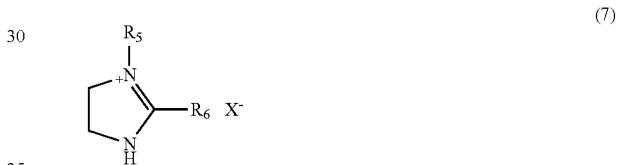
(7)

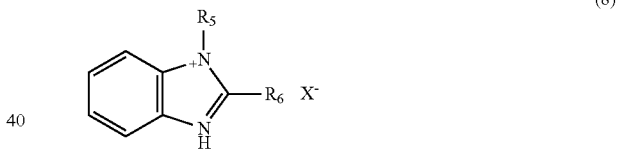
(8)

(9)

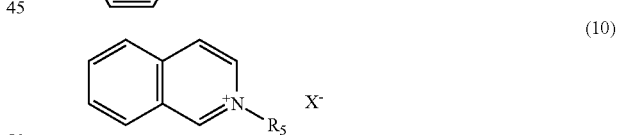
(10)

$R_5$ and $R_6$ in the preceding formulas represent alkyl, alkenyl, alkynyl, cycloalkyl, alkoxy, aryl, aralkyl, or a heterocyclic group, in each case substituted or unsubstituted, or the hydrogen atom. X— is an anion and is defined as for X— in the previously cited general formula (6).

The use is preferred among the preceding of quaternary ammonium salts and pyridinium salts. Specific examples of these are as follows.

(A-1)

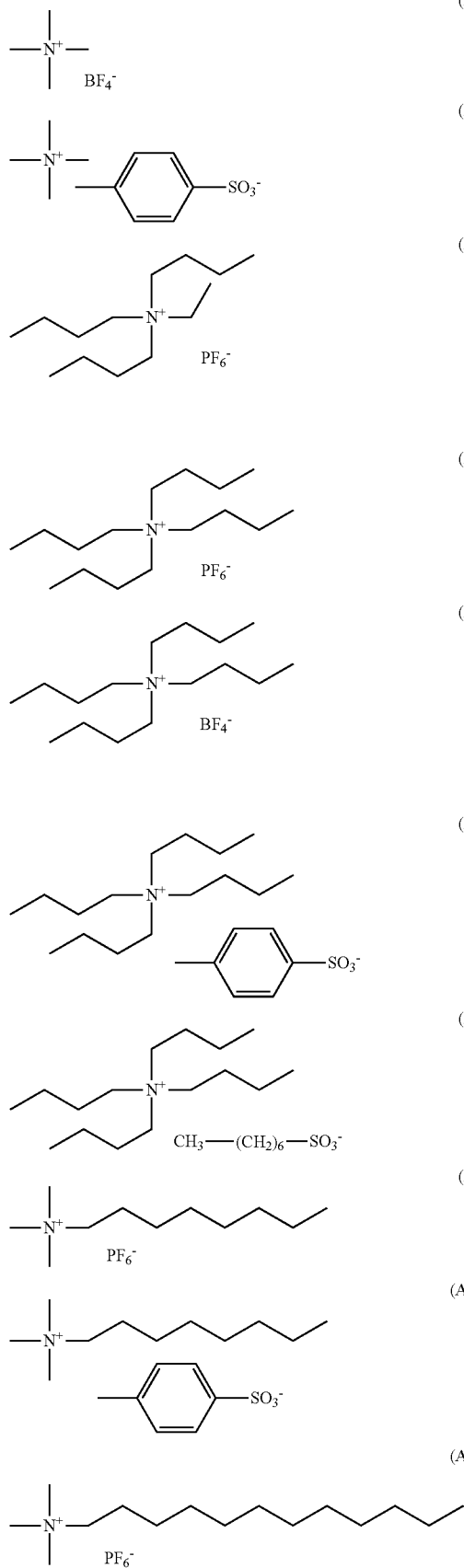
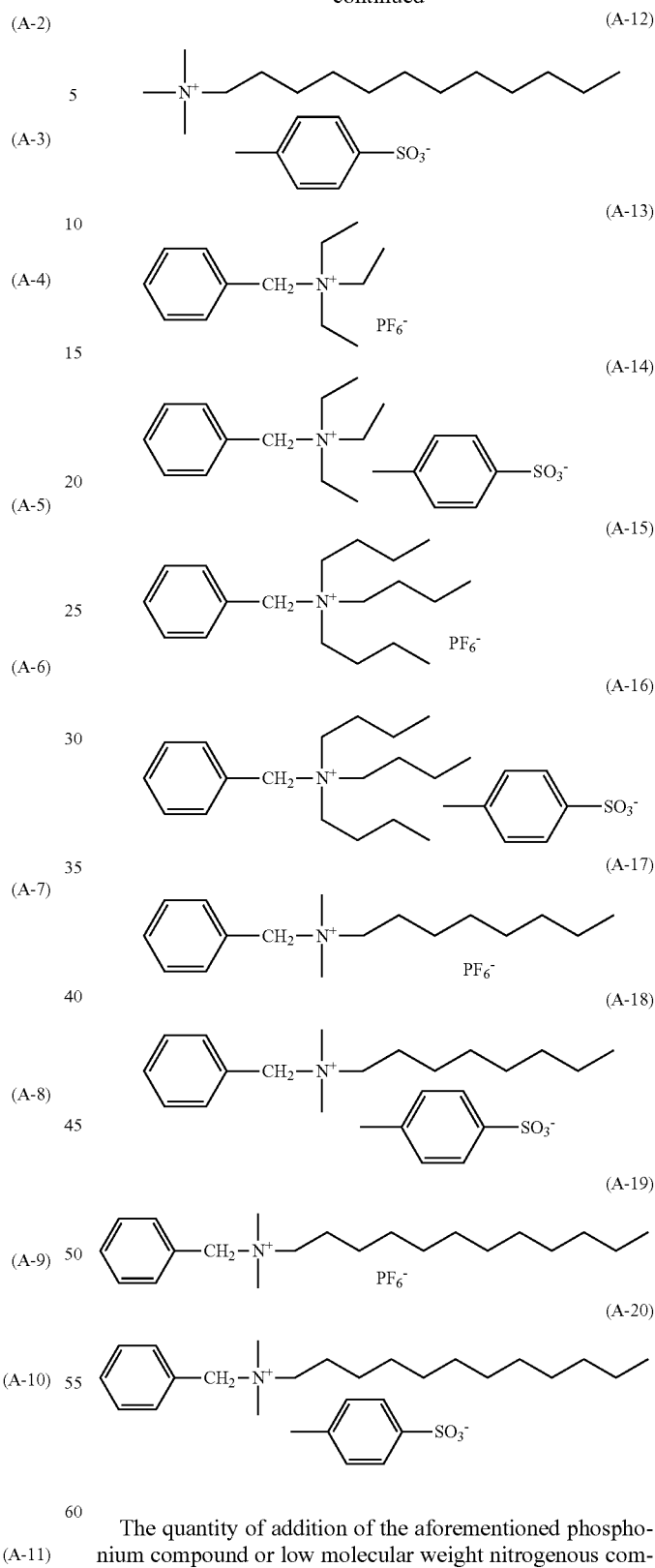

The quantity of addition of the aforementioned phosphonium compound or low molecular weight nitrogenous compound to the image recording layer is preferably 0.01 to 20 mass %, more preferably 0.05 to 10 mass %, and most preferably 0.1 to 5 mass %, in each case with reference to the solids fraction of the image recording layer. A good ink receptivity during printing is obtained within these ranges.

The ammonium group-containing polymers shown below are also suitable for the oleosensitizer used in the present invention. While the ammonium group-containing polymer need only have the ammonium group in its structure, polymers that contain the structures shown by the following general formula (11) and general formula (12) as repeat units are preferred.

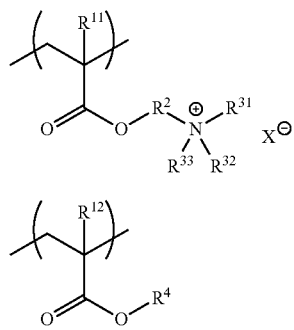

In the formulas, $R^{11}$ and $R^{12}$ each independently represent the hydrogen atom or methyl; $R^2$ represents a divalent linking group such as possibly substituted alkylene and possibly substituted alkyleneoxy; $R^{31}$, $R^{32}$, and $R^{33}$ each independently represent $C_{1-10}$ alkyl or aralkyl; X— represents an organic or inorganic anion, such as F—, Cl—, Br—, I—, a possibly substituted benzenesulfonate anion, the methyl sulfate anion, the ethyl sulfate anion, the propyl sulfate anion, a possibly branched butyl sulfate anion, a possibly branched amyl sulfate anion, $PF_6$—, $BF_4$—, $B(C_6F_6)_4$—, and so forth; $R^4$ represents $C_{1-21}$ alkyl, aralkyl, aryl, —$(C_2H_4O)_n$—$R^5$, or $(C_3H_6O)_n$—$R^5$; $R^5$ represents the hydrogen atom, methyl, or ethyl; and n is 1 or 2.

This ammonium salt-containing polymer contains at least one species of the structural unit represented by general formula (11) and at least one species of the structural unit represented by general formula (12), but may contain two or more species of either structural unit and may contain two or more species of both structural units. There is no limitation on the ratio between the two structural units, but 5:95 to 80:20 is particularly preferred. This polymer may contain other copolymer components within a range that can retain the effects of the present invention.

This ammonium salt-containing polymer has a value for the reduced specific viscosity (measured as described below, unit: cSt/g/mL) preferably in the range from 5 to 120, more preferably in the range from 10 to 110, and particularly preferably in the range from 15 to 100.

<Method of Measuring the Reduced Specific Viscosity>

3.33 g of the 30 mass % polymer solution (1 g as the solids fraction) is weighed into a 20 mL volumetric flask and the flask is brought to volume with N-methylpyrrolidone. This solution is introduced into a Ubbelohde reduced viscosity capillary tube (viscometer constant=0.010 cSt/s); the time required for downflow is measured at 30° C.; and the calculation is performed by the usual method using (kinematic viscosity=viscometer constant×the time (s) required for the fluid to pass through the capillary tube).

The content of the ammonium salt-containing polymer is preferably 0.0005 mass % to 30.0 mass %, more preferably 0.001 mass % to 20.0 mass %, and most preferably 0.002 mass % to 15.0 mass %, in each case with reference to the total solids fraction of the image recording layer. An excellent receptivity is obtained in the cited range. The ammonium salt-containing polymer may additionally be present in the protective layer.

Specific examples of the ammonium salt-containing polymer are provided below.

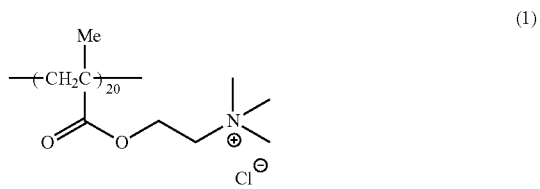

(1)

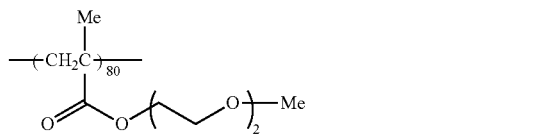

(2)

(3)

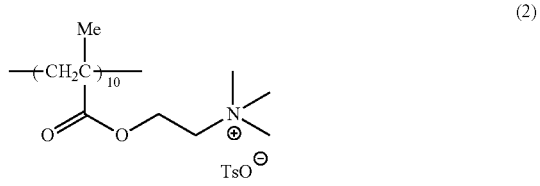

(4)

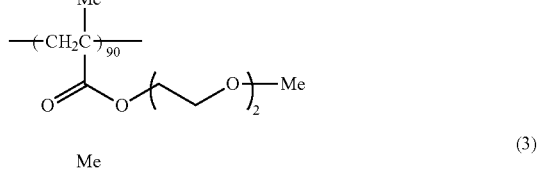

(5)

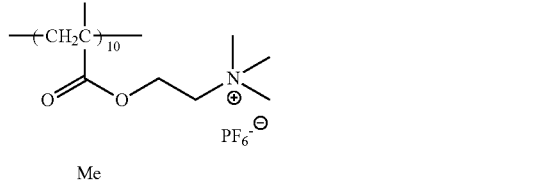

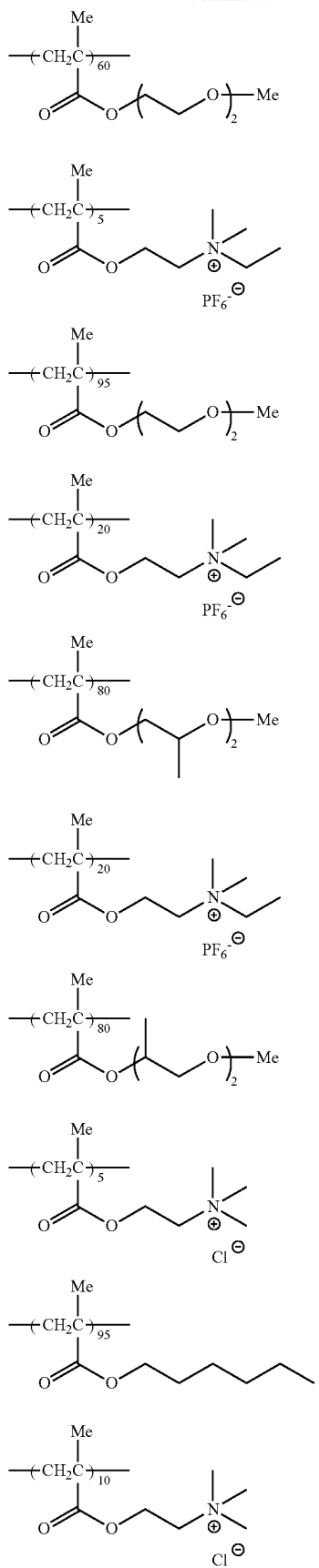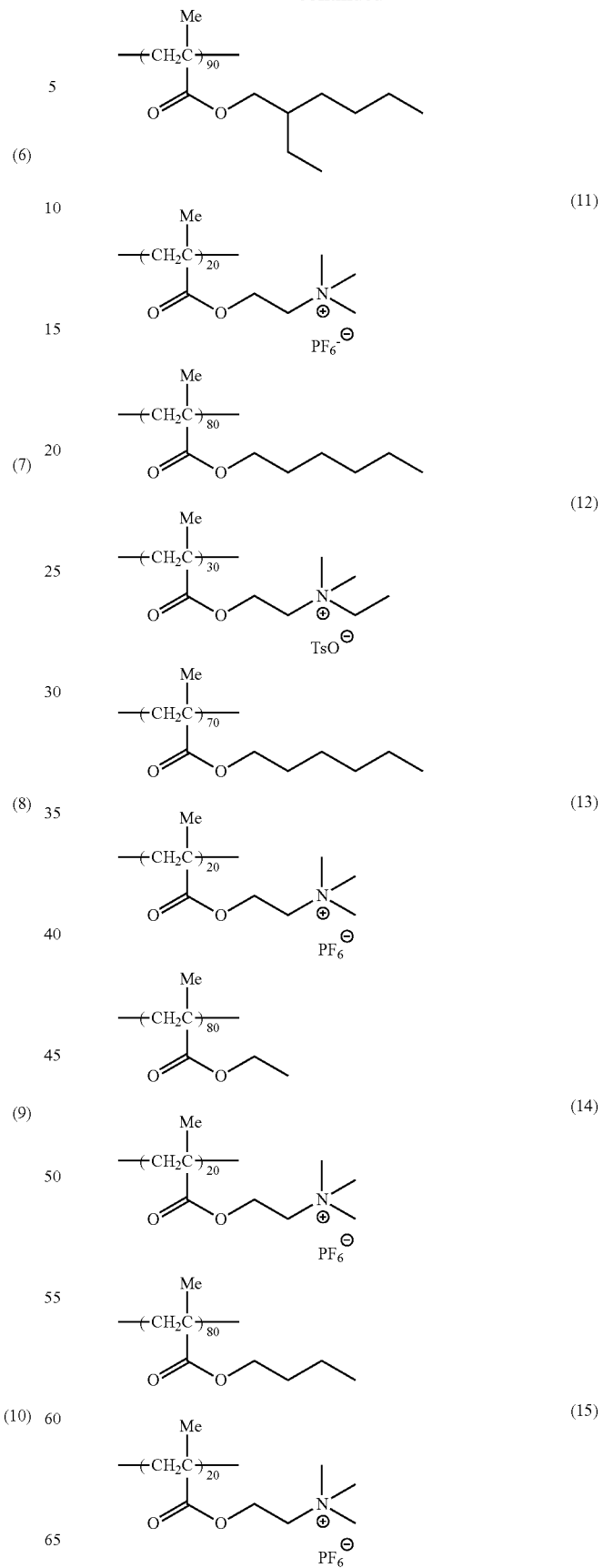

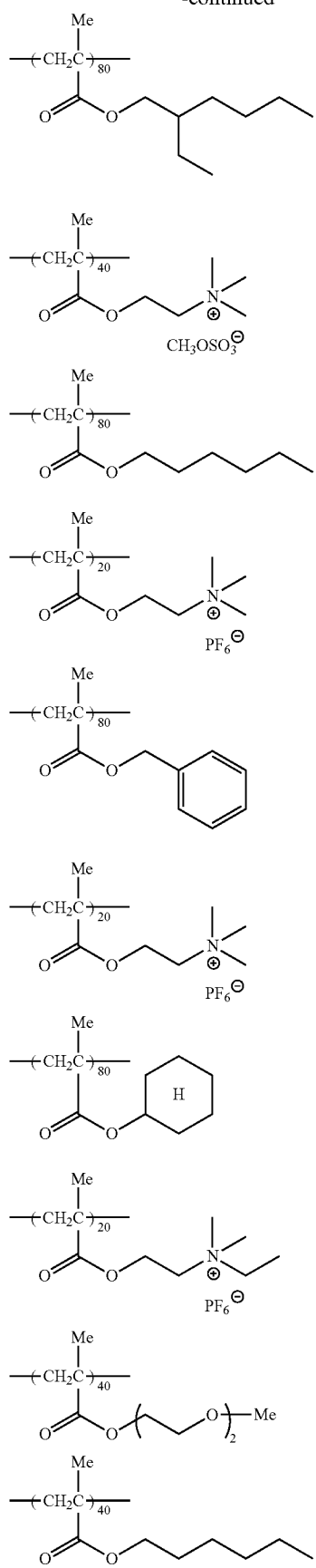
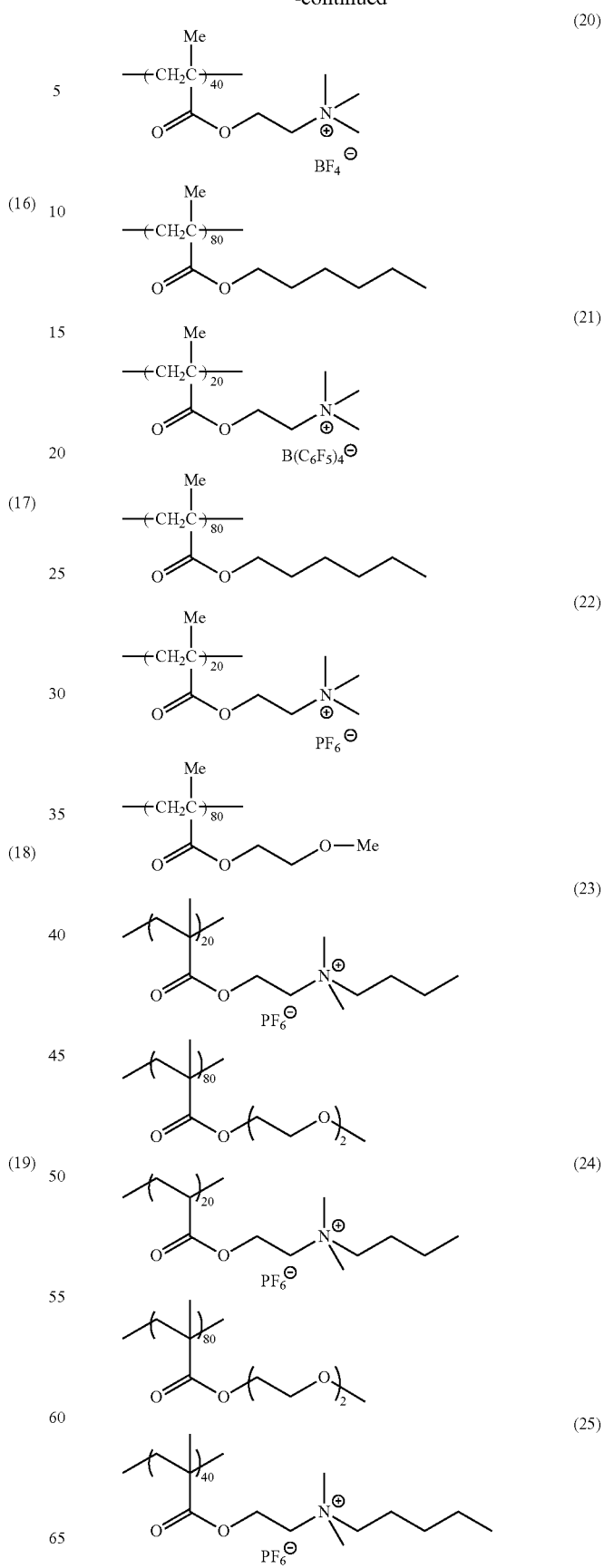

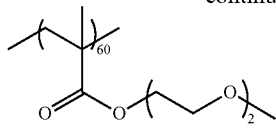

<Formation of the Image Recording Layer>

The image recording layer of the present invention is formed by dissolving or dispersing the required components as described above in solvent to form a coating fluid; coating this coating fluid on a support; and drying.

The solvent used here can be exemplified by ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, water, and so forth, but the solvent is not limited to the preceding. A single one of these solvents or a mixture of these solvents may be used. The solids concentration in the coating fluid is preferably 1 to 50 mass %.

The image recording layer of the present invention may also be formed as an image recording layer with a multilayer structure by preparing a plurality of coating fluids in which the same or different components (=the components described above) are dispersed or dissolved in the same solvent or different solvents and by carrying out coating and drying a plurality of times.

The application rate (solids fraction) for the image recording layer on the support that is obtained after coating and drying will vary with the application, but 0.3 to 3.0 g/m$^2$ is generally preferred. An excellent sensitivity is obtained in the cited range, as are excellent film properties for the image recording layer.

A variety of methods can be used for the coating method. Examples are bar coater coating, spin coating, spray coating, curtain coating, dip coating, air knife coating, blade coating, roll coating, and so forth.

The Undercoat Layer

The lithographic printing plate precursor may as necessary be provided with an undercoat layer (also called an intermediate layer or interlayer) between the image recording layer and the support.

This undercoat layer facilitates delamination of the image recording layer from the support in the nonphotoexposed areas and thereby improves the developability. In addition, when photoexposure is carried out with an infrared laser, the undercoat layer functions as a heat insulating layer; as a consequence, the heat generated by photoexposure is prevented from diffusing to the support and is thereby efficiently utilized, accruing the advantage of supporting an increase in the sensitivity.

Preferred compounds for forming the undercoat layer can be specifically exemplified by silane coupling agents that contain an addition-polymerizable ethylenic double bond reactive group, as described in Japanese Patent Application Publication No. Hei 10-282679, and phosphorus compounds that contain an ethylenic double bond reactive group, as described in Japanese Patent Application Publication No. Hei 2-304441.

Compounds most preferred for forming the undercoat layer can be exemplified by polymer resins that contain an adsorptive group, hydrophilic group, and crosslinking group. These polymer resins are preferably obtained by the copolymerization of adsorptive group-containing monomer, hydrophilic group-containing monomer, and crosslinking group-containing monomer.

The polymer resin for undercoat layer formation preferably contains a group that adsorbs to the surface of the hydrophilic support.

The presence/absence of adsorptivity to the surface of the hydrophilic support can be determined, for example, by the following method.

A coating solution is prepared by dissolving the test compound in a good solvent and this coating solution is coated and dried on the support so as to provide a post-drying coating rate of 30 mg/m$^2$. The support coated with the test compound is then thoroughly rinsed with the good solvent, and the residual quantity of the test compound that has not been removed by rinsing is subsequently measured in order to determine the quantity adsorbed to the support. Measurement of this residual quantity can be carried out by a direct determination of the residual quantity of the compound, or the quantity of the test compound that has dissolved in the rinse solution can be determined and used to calculate the residual quantity. Determination of the compound can be carried out, for example, by x-ray fluorescence measurements, reflection absorption spectroscopic measurements, liquid chromatographic measurement, and so forth. A compound that is adsorptive to the support will have a residue of at least 1 mg/m$^2$ even when the cited rinsing treatment is carried out.

The group adsorptive to the surface of the hydrophilic support is a functional group that can produce a chemical bond (for example, an ionic bond, hydrogen bond, coordination bond, or a bond due to intermolecular forces) with a substance (for example, a metal or metal oxide) or a functional group (for example, the hydroxyl group) present at the surface of the hydrophilic support. The adsorptive group is preferably an acid group or a cationic group.

The acid group preferably has an acid dissociation constant (pKa) no greater than 7. Examples of the acid group are the phenolic hydroxyl group, the carboxyl group, —SO$_3$H, —OSO$_3$H, —PO$_3$H$_2$, —OPO$_3$H$_2$, —CONHSO$_2$—, —SO$_2$NHSO$_2$, and —COCH$_2$COCH$_3$. Particularly preferred among the preceding are —OPO$_3$H$_2$ and PO$_3$H$_2$. This acid group may also be a metal salt.

The cationic group is preferably an onium group. Examples of onium groups are ammonium, phosphonium, arsonium, stibonium, oxonium, sulfonium, selenonium, stannonium, and iodonium. Preferred thereamong are ammonium, phosphonium, and sulfonium. Ammonium and phosphonium are more preferred, and ammonium is most preferred.

Compounds represented by the following general formula (U1) and general formula (U2) are particularly preferred examples of adsorptive group-containing monomers for use in the synthesis of polymer resins preferred for the compound for forming the undercoat layer.

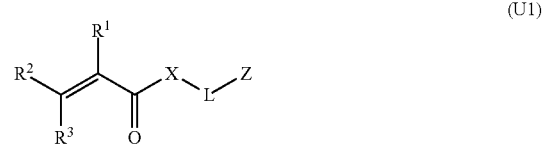

(U1)

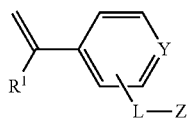
(U2)

$R^1$, $R^2$, and $R^3$ in general formulas (U1) and (U2) are each independently the hydrogen atom, a halogen atom, or $C_{1-6}$ alkyl.

$R^1$, $R^2$, and $R^3$ are each independently preferably the hydrogen atom or $C_{1-6}$ alkyl, more preferably the hydrogen atom or $C_{1-3}$ alkyl, and most preferably the hydrogen atom or methyl group. $R^2$ and $R^3$ are particularly preferably the hydrogen atom.

Z is a functional group that adsorbs to the surface of the hydrophilic support, and this adsorptive functional group is in accordance with the preceding description.

L in general formulas (U1) and (U2) is a single bond or a divalent linking group.

L is preferably a divalent aliphatic group (alkylene, substituted alkylene, alkenylene, substituted alkenylene, alkynylene, substituted alkynylene), divalent aromatic group (arylene, substituted arylene), or divalent heterocyclic group, or a combination of the preceding with the oxygen atom (—O—), sulfur atom (—S—), imino (—NH—), substituted imino (—NR— wherein R is an aliphatic group, aromatic group, or heterocyclic group), or carbonyl (—CO—).

The aforementioned divalent aliphatic group may have a cyclic structure or a branched structure. The number of carbons in the divalent aliphatic group is preferably 1 to 20, more preferably 1 to 15, and most preferably 1 to 10. A saturated aliphatic group is more preferred for the divalent aliphatic group than an unsaturated aliphatic group. The divalent aliphatic group may bear a substituent, and this substituent can be exemplified by halogen atoms, the hydroxyl group, aromatic groups, and heterocyclic groups.

The number of carbons in the aforementioned divalent aromatic group is preferably 6 to 20, more preferably 6 to 15, and most preferably 6 to 10. The divalent aromatic group may bear a substituent, and this substituent can be exemplified by halogen atoms, the hydroxyl group, aliphatic groups, aromatic groups, and heterocyclic groups.

The aforementioned divalent heterocyclic group preferably has a five-membered ring or six-membered ring for its heterocyclic ring. In addition, this heterocyclic ring may be condensed with an aliphatic ring, aromatic ring, or another heterocyclic ring. The divalent heterocyclic group may bear a substituent, and this substituent can be exemplified by halogen atoms, the hydroxyl group, the oxo group (═O), the thioxo group (═S), the imino group (═NH), substituted imino (═N—R wherein R is an aliphatic group, aromatic group, or heterocyclic group), aliphatic groups, aromatic groups, and heterocyclic groups.

L in the present invention is preferably a divalent linking group that contains a plurality of polyoxyalkylene structures. The polyoxyalkylene structure is more preferably a polyoxyethylene structure. In other words, L preferably contains —$(OCH_2CH_2)_n$— (n is an integer with a value of at least 2).

X in general formula (U1) is the oxygen atom (—O—) or imino (—NH—). X is more preferably the oxygen atom.

Y in general formula (U2) is the carbon atom or nitrogen atom. In those instances where Y=nitrogen atom and L is connected to Y and a quaternary pyridinium group is thereby created, such a group is itself adsorptive and Z then becomes unnecessary and may be a hydrogen atom.

Examples of representative compounds with general formula (U1) or (U2) are provided below.

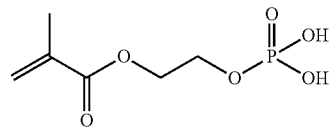

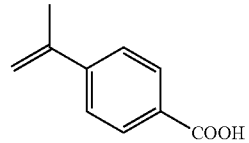

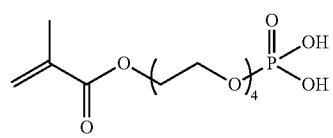

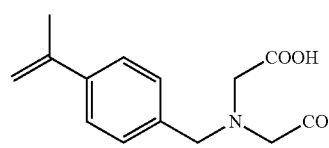

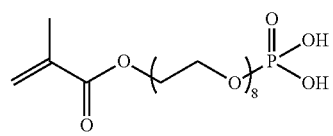

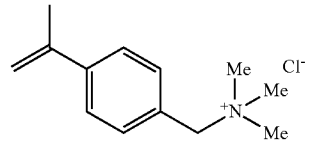

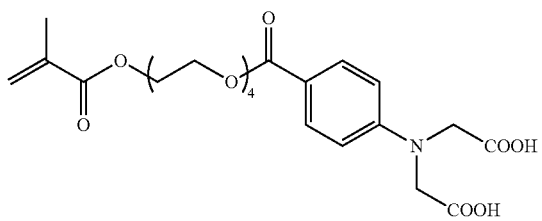

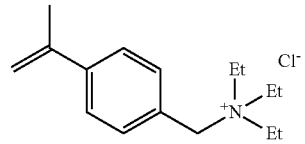

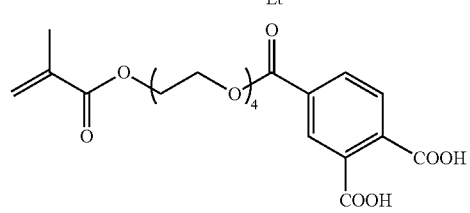

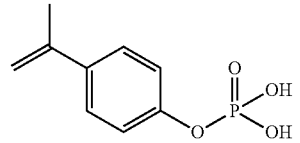

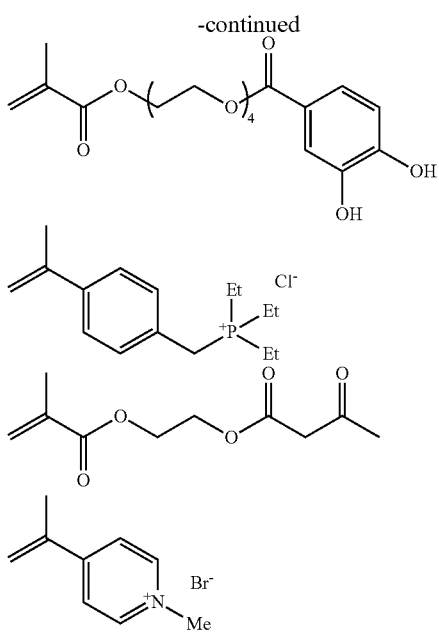

Polymer resins suitable for use as the compound for undercoat layer formation preferably contain a hydrophilic group. Suitable examples of this hydrophilic group are the hydroxyl group, carboxyl group, carboxylate group, hydroxyethyl, polyoxyethyl, hydroxypropyl, polyoxypropyl, the amino group, aminoethyl, aminopropyl, the ammonium group, amide groups, carboxymethyl, the sulfo group, the phosphate group, and so forth. The highly hydrophilic sulfo group is preferred among the preceding.

The following are specific examples of sulfo group-containing monomers: the sodium and amine salts of methallyloxybenzenesulfonic acid, allyloxybenzenesulfonic acid, allylsulfonic acid, vinylsulfonic acid, p-styrenesulfonic acid, methallylsulfonic acid, acrylamide-t-butylsulfonic acid, 2-acrylamide-2-methylpropanesulfonic acid, and (3-acryloyloxypropyl)butylsulfonic acid. Sodium 2-acrylamido-2-methylpropanesulfonate is preferred among the preceding for its hydrophilicity and handling during synthesis.

These monomers are well suited for use in the synthesis of polymer resins preferred for use as the compound for undercoat layer formation.

The polymer resin used to form the undercoat layer in the present invention preferably has a crosslinking group. An improved adhesion with the image areas is provided by the crosslinking group. In order to endow the polymer resin used to form the undercoat layer with the ability to crosslink, a crosslinking functional group, e.g., an ethylenically unsaturated bond, may be introduced into side chain position on the polymer, and/or the crosslinking functional group may be introduced by forming a salt structure with a compound that has an ethylenically unsaturated bond and a substituent that carries a charge opposite that of a polar substituent in the polymer resin.

Polymer compounds having an ethylenically unsaturated bend in side chain position on the molecule can be exemplified by polymer compounds that are polymers of an ester or amide of acrylic acid or methacrylic acid wherein the residue in the ester or amide (R in —COOR or —CONHR) contains an ethylenically unsaturated bond.

This ethylenically unsaturated bond-containing residue (the above-referenced R) can be exemplified by —$(CH_2)_n$CR$^1$=CR$^2$R$^3$, —$(CH_2O)_n$CH$_2$CR$^1$=CR$^2$R$^3$, —$(CH_2CH_2O)_n$CH$_2$CR$^1$=CR$^2$R$^3$, —$(CH_2)_n$NH—CO—O—CH$_2$CR$^1$=CR$^2$R$^3$, —$(CH_2)_n$—O—CO—CR$^1$=CR$^2$R$^3$, and —$(CH_2CH_2O)_2$—X (in the formulas, R$^1$ to R$^3$ each represent the hydrogen atom, a halogen atom, C$_{1-20}$ alkyl, aryl, alkoxy, or aryloxy, wherein R$^1$ may be bonded with R$^2$ or R$^3$ to form a ring; n is an integer from 1 to 10; and X represents a dicyclopentadienyl residue).

The residue in the ester can be specifically exemplified by —CH$_2$CH=CH$_2$ (described in Japanese Patent Publication No. Hei 7-21633), —CH$_2$CH$_2$O—CH$_2$CH=CH$_2$, —CH$_2$C(CH$_3$)=CH$_2$, —CH$_2$CH=CH—C$_6$H$_5$, —CH$_2$CH$_2$OCOCH=CH—C$_6$H$_5$, —CH$_2$CH$_2$NHCOO—CH$_2$CH=CH$_2$, and —CH$_2$CH$_2$O—X (X in the formula represents a dicyclopentadienyl residue).

The residue in the amide can be specifically exemplified by —CH$_2$CH=CH$_2$, —CH$_2$CH$_2$O—Y (Y in the formula represents a cyclohexene residue), and —CH$_2$CH$_2$OCO—CH=CH$_2$.

The crosslinking group-containing monomer for the polymer resin used for the undercoat layer is preferably an ester or amide of acrylic acid or methacrylic acid that contains a crosslinking group as described above.

The content of the crosslinking group in the polymer resin used for the undercoat layer (content of radical polymerizable unsaturated double bonds by iodine titrimetry) is, per 1 g of the polymer resin, preferably 0.1 to 10.0 mmol, more preferably 1.0 to 7.0 mmol, and most preferably 2.0 to 5.5 mmol. An excellent storage stability and the combination of an excellent sensitivity with an excellent scumming resistance are obtained in this range.

The polymer resin for undercoat layer formation has a mass-average molar mass preferably of at least 5000 and more preferably of 10,000 to 300,000 and has a number-average molar mass preferably of at least 1000 and more preferably of 2000 to 250,000. The polydispersity (mass-average molar mass/number-average molar mass) is preferably 1.1 to 10.

The polymer resin for undercoat layer formation may be a random polymer, block polymer, graft polymer, and so forth, wherein a random polymer is preferred.

A single polymer resin for undercoat layer formation may be used or a mixture of two or more may be used.

In order to prevent scumming during elapsed time as the unexposed plate, the undercoat layer of the present invention can contain a secondary or tertiary amine and/or a polymerization inhibitor. The secondary and tertiary amines can be exemplified by imidazole, 4-dimethylaminopyridine, 4-dimethylaminobenzaldehyde, tris(2-hydroxy-1-methyl)amine, 1,4-diazabicyclo[2,2,2]octane (DABCO), 1,5,7-triazabicyclo[4,4,0]deca-5-ene, 1,8-diazabicyclo[5,4,0]undeca-7-ene, 1,10-phenanthroline, 1,8-bis(dimethylamino)naphthalene, 4,4'-bis(dimethylamino)biphenyl, diphenylamine, 1,3-diphenylguanidine, 4-phenylpyridine, N,N'-ethylenebis(2,2,5,5-tetramethylpyrrolidine), and so forth.

Known thermal polymerization inhibitors can be used as the polymerization inhibitor. Preferred polymerization inhibitors thereamong are compounds selected from the group consisting of phenolic hydroxyl-containing compounds, quinone compounds, N-oxide compounds, piperidine-1-oxyl free radical compounds, pyrrolidine-1-oxyl free radical compounds, N-nitrosophenylhydroxylamines, diazonium compounds, cationic dyes, sulfide group-containing compounds, nitro group-containing compounds, and transition metal compounds such as FeCl$_3$, CuCl$_2$, and so forth. Quinone compounds are particularly suitable among the preceding compounds. The quinone compounds can be specifically exemplified by 1,4-benzoquinone, 2,3,5,6-tetrahydroxy-1,4-benzoquinone, 2,5-dihydroxy-1,4-benzoquinone, chloranyl, 2,3-dichloro-5,6-dicyano-1,4-benzoquinone, naphthoquinone, 2-fluoro-1,4-naphthoquinone, 2-hydroxyethyl-1,4-naphthoquinone, anthraquinone, 1,2,4-trihydroxyanthraquinone, 2,6-dihydroxyanthraquinone, and so forth.

The quantity of addition of these compounds to the undercoat layer is preferably 10 to 90 mass %, more preferably 20 to 80 mass %, and most preferably 30 to 70 mass %, in each case with reference to the components constituting the undercoat layer.

Compounds that have (i) an amino group or a functional group capable of inhibiting polymerization and (ii) a group that interacts with the surface of an aluminum support can also be used as compounds effective for the aforementioned scumming prevention. The group that interacts with the surface of an aluminum support is exemplified by trialkoxysilyl and onium groups and by acid groups selected from the phenolic hydroxyl group, the carboxyl group, $-SO_3H$, $-OSO_3H$, $-PO_3H_2$, $-OPO_3H_2$, $-CONHSO_2-$, $-SO_2NHSO_2-$, and $COCH_2CO-$ as well as their metal salts.

The following are examples of compounds that have an amino group and a group that interacts with the surface of an aluminum support: salts between an acid and 1,4-diazabicyclo[2,2,2]octane, compounds that contain at least one 4-aza-1-azoniabicyclo[2,2,2]octane structure (e.g., 1-methyl-4-aza-1-azoniabicyclo[2,2,2]octane p-toluenesulfonate), ethylenediaminetetraacetic acid, hydroxyethylethylenediaminetriacetic acid, dihydroxyethylethylenediaminediacetic acid, 1,3-propanediaminetetraacetic acid, diethylenetriaminepentaacetic acid, triethylenetetraaminehexaacetic acid, hydroxyethyliminodiacetic acid, and so forth. The following are examples of compounds that have a functional group capable of inhibiting polymerization and a group that interacts with the surface of an aluminum support: 2-trimethoxysilylpropylthio-1,4-benzoquinone, 2,5-bis(trimethoxysilylpropylthio)-1,4-benzoquinone, 2-carboxyanthraquinone, 2-trimethylammonioanthraquinone chloride, and so forth.

The coating solution for undercoat layer formation is obtained by dissolving the aforementioned polymer resin for undercoat formation and the necessary additives in an organic solvent (for example, methanol, ethanol, acetone, methyl ethyl ketone, and so forth) and/or water. The coating solution for undercoat layer formation may also contain an infrared absorber.

Various known methods can be used to coat the support with the coating solution for undercoat layer formation. Examples of these methods are coating with a bar coater, spin coating, spray coating, curtain coating, dip coating, air knife coating, blade coating, roll coating, and so forth.

The coating rate (solids fraction) for the undercoat layer is preferably 0.1 to 100 mg/m$^2$ and more preferably 1 to 30 mg/m$^2$.

The Support

The support used for the lithographic printing plate precursor of the present invention is a dimensionally stable sheet or plate but is not otherwise particularly limited. The support can be exemplified by paper, plastic-laminated paper (the plastic can be exemplified by polyethylene, polypropylene, polystyrene, and so forth), metal plate or sheet (e.g., aluminum, zinc, copper, and so forth), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, and so forth), and paper or plastic film on which any of the aforementioned metals has been laminated or vapor-deposited. The support is preferably a polyester film or an aluminum sheet. Aluminum sheet is preferred therebetween for its excellent dimensional stability and relatively low cost.

The aluminum sheet is a pure aluminum sheet, an alloy plate containing aluminum as its main component along with microamounts of heteroelements, or plastic laminated with a thin film of aluminum or an aluminum alloy. Heteroelements that may be present in the aluminum alloy can be exemplified by silicon, iron, manganese, copper, magnesium, chromium, zinc, bismuth, nickel, titanium, and so forth. The heteroelement content in the alloy is preferably no more than 10 mass %. Although a pure aluminum sheet is preferred in the present invention, the production of absolutely pure aluminum is problematic from the standpoint of refining technology, and the aluminum sheet may therefore contain trace amounts of heteroelements. The aluminum sheet is not limited with regard to composition, and any aluminum sheet of material in the public domain can be used as appropriate.

The thickness of the support is preferably from 0.1 to 0.6 mm and more preferably from 0.15 to 0.4 mm.

Prior to its use, the aluminum sheet is preferably subjected to a surface treatment such as a roughening treatment or an anodic oxidation treatment. Securing adhesion between the image recording layer and the support and securing an improved hydrophilicity are facilitated by the implementation of a surface treatment. Prior to executing a roughening treatment on the aluminum sheet, the aluminum sheet may as desired be submitted to a degreasing treatment with, for example, surfactant, organic solvent, aqueous base solution, and so forth, in order to remove rolling oil from the surface.

Various methods can be employed to roughen the surface of the aluminum sheet, for example, mechanical surface roughening, electrochemical surface roughening (roughening by electrochemical dissolution of the surface), and chemical surface roughening (roughening by selective chemical dissolution of the surface).

Known methods, such as ball grinding, brush grinding, blast grinding, and buff grinding, can be used as the method for carrying out mechanical surface roughening. A transfer method can also be used in which elevations and depressions are transferred in the aluminum rolling stage using a roll provided with elevations and depressions.

Electrochemical roughening can be carried out, for example, using alternating current or direct current in an electrolytic bath that contains an acid such as hydrochloric acid or nitric acid. Another example is a method that uses a mixed acid as described in Japanese Patent Application Publication No. Sho 54-63902.

The surface-roughened aluminum sheet may optionally be subjected to an alkali etching treatment using an aqueous solution of potassium hydroxide, sodium hydroxide, and so forth, followed by neutralization and then as desired an anodic oxidation treatment in order to improve the abrasion resistance.

The various electrolytes that can bring about the formation of a porous oxide film can be used as the electrolyte employed for anodic oxidation of the aluminum sheet. Sulfuric acid, hydrochloric acid, oxalic acid, chromic acid, or a mixed acid of the preceding is typically used. The concentration of these electrolytes is determined as appropriate in accordance with the type of electrolyte.

The anodic oxidation conditions vary as a function of the electrolyte used and thus cannot be unconditionally specified; however, the following are generally preferred: electrolyte concentration=1 to 80 mass % solution, bath temperature=5 to 70° C., current density=5 to 60 A/dm$^2$, voltage=1 to 100 V, electrolysis time=10 seconds to 5 minutes. The quantity of anodic-oxidation film formation is preferably from 1.0 to 5.0 g/m$^2$ and more preferably is from 1.5 to 4.0 g/m$^2$. An excellent printing durability and an excellent resistance to damage in the nonimage areas of the lithographic printing plate are obtained in the cited range.

After surface treatment as described above, the anodic oxidation film-bearing substrate may be used as such as the support employed by the present invention; however, a treatment selected as appropriate from the following may be carried out in order to further improve the adhesion with the overlying layer, hydrophilicity, scumming resistance, and heat insulating performance: treatment to widen or seal the micropores in the anodic oxidation film, as described in Japanese Patent Application Publication Nos. 2001-253181 and 2001-322365, and a surface hydrophilicization treatment comprising immersion in an aqueous solution containing a hydrophilic compound. The widening treatment and sealing treatment are of course not limited to the descriptions in these citations and may be carried out by any heretofore known method. For example, sealing can also be carried out by steam sealing, treatment with fluorozirconic acid alone, treatment with sodium fluoride, and steam sealing with the addition of lithium chloride.

There are no particular limitations on the sealing treatment used in the present invention, and the heretofore known methods can be used, among which sealing using an aqueous solution containing an inorganic fluorine compound, sealing with steam, and sealing with hot water are preferred. Each of these is described in greater detail below.

<1> Sealing Using an Aqueous Solution Containing an Inorganic Fluorine Compound

Metal fluorides are preferred examples of the inorganic fluorine compound used in sealing using an aqueous solution containing an inorganic fluorine compound.

Specific examples are sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid, and ammonium fluorophosphate. Preferred thereamong are sodium fluorozirconate, sodium fluorotitanate, fluorozirconic acid, and fluorotitanic acid.

Considered in terms of achieving a satisfactory sealing of the micropores in the anodic oxidation film, the concentration of the inorganic fluorine compound in the aqueous solution is preferably at least 0.01 mass % and more preferably is at least 0.05 mass %, but from the standpoint of the scumming resistance is preferably no more than 1 mass % and more preferably is no more than 0.5 mass %.

The aqueous solution containing the inorganic fluorine compound preferably also contains a phosphate salt compound. When this phosphate salt compound is present, the surface of the anodic oxidation film exhibits an increased hydrophilicity, which results in an improved on-press developability and an improved scumming resistance.

The phosphate salts of metals such as the alkali metals and alkaline-earth metals are examples of suitable phosphate salt compounds.

Specific examples are zinc phosphate, aluminum phosphate, ammonium phosphate, diammonium hydrogen phosphate, ammonium dihydrogen phosphate, monoammonium phosphate, monopotassium phosphate, monosodium phosphate, potassium dihydrogen phosphate, dipotassium hydrogen phosphate, calcium phosphate, sodium ammonium hydrogen phosphate, magnesium hydrogen phosphate, magnesium phosphate, ferrous phosphate, ferric phosphate, sodium dihydrogen phosphate, sodium phosphate, disodium hydrogen phosphate, lead phosphate, diammonium phosphate, calcium dihydrogen phosphate, lithium phosphate, phosphotungstic acid, ammonium phosphotungstate, sodium phosphotungstate, ammonium phosphomolybdate, sodium phosphomolybdate, sodium phosphite, sodium tripolyphosphate, and sodium pyrophosphate. Preferred thereamong are sodium dihydrogen phosphate, disodium hydrogen phosphate, potassium dihydrogen phosphate, and dipotassium hydrogen phosphate.

There are no particular limitations on the combination of the inorganic fluorine compound and phosphate salt compound, but the aqueous solution preferably contains at least sodium fluorozirconate as the inorganic fluorine compound and at least sodium dihydrogen phosphate as the phosphate salt compound.

Considered in terms of increasing the on-press developability and scumming resistance, the concentration of the phosphate salt compound in the aqueous solution is preferably at least 0.01 mass % and more preferably is at least 0.1 mass %, but from a solubility standpoint is preferably no more than 20 mass % and more preferably is no more than 5 mass %.

While the proportion of each compound in the aqueous solution is not particularly limited, the mass ratio between the inorganic fluorine compound and the phosphate salt compound is preferably from 1/200 to 10/1 and is more preferably from 1/30 to 2/1.

The temperature of the aqueous solution is preferably at least 20° C. and more preferably at least 40° C. and preferably no more than 100° C. and more preferably no more than 80° C.

The pH of the aqueous solution is preferably at least 1 and more preferably at least 2 and preferably no more than 11 and more preferably no more than 5.

The method of carrying out sealing with the aqueous solution containing an inorganic fluorine compound is not particularly limited and, for example, immersion or spraying can be used. One of these may be used once or a plurality of times, or two or more may be used in combination.

Immersion is preferred among the preceding. When treatment is carried out by immersion, the treatment time is preferably at least 1 second and more preferably is at least 3 seconds and is preferably no more than 100 seconds and more preferably no more than 20 seconds.

<2> Steam Sealing

Steam sealing can be exemplified by methods in which the anodic oxidation film is continuously or discontinuously brought into contact with ambient pressure or pressurized water vapor.

The steam temperature is preferably at least 80° C. and more preferably is at least 95° C. and preferably is no more than 105° C.

The steam pressure is preferably from (atmospheric pressure−50 mmAq) to (atmospheric pressure+300 mmAq) (from $1.008 \times 10^5$ to $1.043 \times 10^5$ Pa).

The duration of steam contact is preferably at least 1 second and more preferably at least 3 seconds and preferably no more than 100 seconds and more preferably no more than 20 seconds.

<3> Sealing with Hot Water

The hot water sealing treatment can be exemplified by methods in which the aluminum sheet bearing an anodic oxidation film is immersed in hot water.

The hot water may contain an inorganic salt (for example, a phosphate) or an organic salt.

The temperature of the hot water is preferably at least 80° C. and more preferably is at least 95° C. and is preferably no more than 100° C.

The duration of immersion in the hot water is preferably at least 1 second and more preferably is at least 3 seconds and preferably is not more than 100 seconds and more preferably is not more than 20 seconds.

The hydrophilicizing treatment cited above can employ the alkali metal silicate method described in U.S. Pat. Nos. 2,714,066, 3,181,461, 3,280,734, and 3,902,734. In this method, the support is treated with an aqueous solution of, for example, sodium silicate, by immersion or electrolytic treatment. Other methods are, for example, treatment with potassium fluorozirconate as described in Japanese Patent Publication No. Sho 36-22063, and treatment with polyvinylphosphonic acid as described in U.S. Pat. Nos. 3,276,868, 4,153,461, and 4,689,272.

In those instances where a support that exhibits an inadequate surface hydrophilicity (for example, polyester film) is employed as the support in the present invention, a hydrophilic layer is desirably applied in order to impart hydrophilicity to the surface. This hydrophilic layer is preferably a hydrophilic layer, as described in Japanese Patent Application Publication No. 2001-199175, formed by the application of a coating bath that contains a colloid of an oxide or hydroxide of at least one element selected from beryllium, magnesium, aluminum, silicon, titanium, boron, germanium, tin, zirconium, iron, vanadium, antimony, and transition metals; a hydrophilic layer, as described in Japanese Patent Application Publication No. 2002-79772, that has an organic hydrophilic matrix obtained by the crosslinking or pseudo-crosslinking of an organic hydrophilic polymer; a hydrophilic layer that has an inorganic hydrophilic matrix obtained by a sol-gel conversion comprising the hydrolysis and condensation reactions of a polyalkoxysilane, titanate, zirconate, or aluminate; or a hydrophilic layer comprising an inorganic thin layer that has a metal oxide-containing surface. Preferred among the preceding is a hydrophilic layer formed by the application of a coating bath that contains a colloid of an oxide or hydroxide of silicon.

Also in those instances where, for example, a polyester film is employed as the support in the present invention, an antistatic layer is preferably disposed on the hydrophilic layer side of the support, or on the opposite side, or on both sides. The disposition of an antistatic layer between the support and a hydrophilic layer also contributes to improving the adhesion with the hydrophilic layer. A polymer layer having finely divided metal oxide particles or a matting agent dispersed therein, as described in Japanese Patent Application Publication No. 2002-79772, may be used as the antistatic layer.

The center-line average roughness of the support is preferably from 0.10 to 1.2 μm. A good adhesion to the image recording layer, good printing durability, and good scumming resistance are obtained in this range.

<The Protective Layer>

A protective layer (an overcoat layer) is preferably provided on the image recording layer in the lithographic printing plate precursor of the present invention.

In addition to its function of blocking oxygen and thereby preventing reactions that inhibit image formation, the protective layer functions to prevent damage to the image recording layer and to prevent ablation during photoexposure with a high intensity laser.

The components that constitute the protective layer are described in the following.

The photoexposure of lithographic printing plates is generally carried out in the air. Low molecular weight compounds present in the air, such as oxygen and basic substances, can inhibit the photoexposure-induced image-forming reactions in the image recording layer. The protective layer prevents these low molecular weight compounds (e.g., oxygen and basic substances) from mixing into the image recording layer and as a result prevents reactions that would inhibit image formation in the air. Thus, the characteristics desired for the protective layer are the ability to reduce the permeability of the low molecular weight compounds (e.g., oxygen), an excellent transmittance for the light used for photoexposure, an excellent adhesion to the image recording layer, and the ability to be easily removed in the on-press development treatment process following photoexposure. Protective layers having such characteristics are described in, for example, U.S. Pat. No. 3,458,311 and Japanese Patent Publication No. Sho 55-49729.

The material used for the protective layer is suitably selected from water-soluble polymers and water-insoluble polymers. Specific examples are water-soluble polymers, e.g., polyvinyl alcohol, modified polyvinyl alcohol, polyvinylpyrrolidone, polyvinylimidazole, polyacrylic acid, polyacrylamide, the partial saponification products of polyvinyl acetate, ethylene-vinyl alcohol copolymers, water-soluble cellulose derivatives, gelatin, starch derivatives, gum arabic, and so forth, as well as polymers such as polyvinylidene chloride, poly(meth)acrylonitrile, polysulfone, polyvinyl chloride, polyethylene, polycarbonate, polystyrene, polyamide, cellophane, and so forth.

These polymers may as necessary also be used in combinations of two or more.

Water-soluble polymer compounds that exhibit an excellent crystallinity are relatively useful materials among the materials listed above. Preferred specific examples are polyvinyl alcohol, polyvinylpyrrolidone, polyvinylimidazole, water-soluble acrylic resins, e.g., polyacrylic acid, gelatin, gum arabic, and so forth. In terms of being coatable using water as the solvent and being easy to remove by the fountain solution during printing, polyvinyl alcohol, polyvinylpyrrolidone, and polyvinylimidazole are preferred among the preceding. Among these latter polymers, polyvinyl alcohol (PVA) provides the best results with respect to the basic characteristics, i.e., oxygen-barrier performance and removability during development.

Polyvinyl alcohols that can be used for the protective layer may be partially substituted with an ester, ether, or acetal as long as the unsubstituted vinyl alcohol unit is present in substantially the amount that provides the necessary water solubility. Other copolymer components may be present to some degree under the same conditions. For example, the use is also preferred of polyvinyl alcohols with various degrees of polymerization that randomly contain any of various hydrophilic modified sites, such as anion-modified sites that have been modified with an anion (e.g., the carboxyl group or sulfo group), cation-modified sites that have been modified with a cation (e.g., an amino group or ammonium group), silanol-modified sites, thiol-modified sites, and so forth, and polyvinyl alcohols with various degrees of polymerization that have various modified sites at the polymer chain terminals, e.g., the aforementioned anion-modified sites, the aforementioned cation-modified sites, silanol-modified sites, and thiol-modified sites as well as alkoxyl-modified sites, sulfide-modified sites, ester-modified sites between the vinyl alcohol and various type of organic acids, ester-modified sites between the aforementioned anion-modified site and, for example, an alcohol, epoxy-modified sites, and so forth.

These modified polyvinyl alcohols are preferably compounds that have been from 71 to 100 mol % hydrolyzed and that have a degree of polymerization in the range from 300 to 2,400. Specific examples are PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 (from Kuraray Co., Ltd.).

The following are additional examples of modified polyvinyl alcohols: KL-318, KL-118, KM-618, KM-118, and SK-5102, which each have anion-modified sites; C-313, C-118, and CM-318, which each have cation-modified sites; M-205 and M-115, which each have terminal thiol-modified sites; MP-103, MP-203, MP-102, and MP-202, which each have terminal sulfide-modified sites; HL-12E and HL-1203, which have terminal ester (higher aliphatic acid)-modified sites; and R-1130, R-2105, and R-2130, which each have reactive silane-modified sites.

The protective layer also preferably contains an inorganic layer compound, that is, a plate-shaped inorganic compound that has a layer structure. The co-use of such an inorganic layer compound can provide an additional increase in the oxygen-blocking performance, can further improve the film strength of the protective layer, can improve the resistance to damage, and can impart a mat character to the specific protective layer.

The inorganic layer compound can be exemplified by the mica group, for example, synthetic micas and natural micas with the following general formula

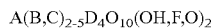

(wherein A represents any of Li, K, Na, Ca, Mg, and organic cations; B and C represent any of Fe(II), Fe(III), Mn, Al, Mg, and V; and D represents Si or Al), and by talc as represented by the formula $3MgO.4SiO.H_2O$, taeniolite, montmorillonite, saponite, hectorite, and zirconium phosphate.

Among the mica compounds, the natural micas are exemplified by muscovite, paragonite, phlogopite, biotite, and lepidolite. The synthetic micas can be exemplified by non-swellable micas, e.g., fluorophlogopite $KMg_3(AlSi_3O_{10})F_2$ and potassium tetrasilicic mica $KMg_{2.5}(Si_4O_{10})F_2$, and swellable micas, for example, Na tetrasilicic mica $NaMg_{2.5}(Si_4O_{10})F_2$, Na or Li taeniolite $(Na,Li)Mg_2Li(Si_4O_{10})F_2$, and montmorillonite series Na or Li hectorite $(Na,Li)_{1/8}Mg_{2/5}Li_{1/8}(Si_4O_{10})F_2$. Synthetic smectites are also useful.

Among the mica compounds described above, fluorine-containing swellable micas that are synthetic layer compounds are particularly useful. Thus, swellable clay minerals, e.g., mica, montmorillonite, saponite, hectorite, and bentonite, have a layer structure comprising a unit crystal lattice layer having a thickness from about 10 to about 15 Å, and metal atom substitution within the lattice is much greater than in other clay minerals. As a result, a positive charge deficiency is produced in the lattice layer, and cations such as $Li^+$, $Na^+$, $Ca^{2+}$, and $Mg^{2+}$ and organic cations (e.g., amine salts, quaternary ammonium salts, phosphonium salts, sulfonium salts, and so forth) are adsorbed between the layers to compensate for this deficiency. These layer compounds are swollen by water. When shear is applied in the swollen state, cleavage readily occurs and a stable sol is formed in water. Bentonite and swellable synthetic micas strongly exhibit this tendency and are useful in the present invention; use of the swellable synthetic micas is particularly preferred from the standpoint of ease of acquisition and consistency in quality.

The layer compounds have a plate shape: with regard to thickness, thinner is more desirable from the standpoint of controlling diffusion; with regard to the size of the flat side, larger is more desirable as long as neither the smoothness of the coated surface nor the transmission of the active light are impaired. The aspect ratio is therefore at least 20, preferably at least 100, and particularly preferably at least 200. Here, the aspect ratio is the ratio of the long diameter to the thickness of the particle, and can be measured, for example, from the projection yielded by a photomicrograph of the particle. A larger aspect ratio provides a greater effect.

With regard to the particle size of the layer compound, its average long diameter is from 0.3 to 20 µm, preferably from 0.5 to 10 µm, and particularly preferably from 1 to 5 µm. The inhibition of oxygen and moisture permeation is inadequate at a particle size smaller than 0.3 µm and an adequate effect therefore cannot be evidenced. When the particle size is larger than 20 µm, the dispersion stability in the coating fluid is inadequate and coating cannot be carried out in a stable manner. The average thickness of the particles is no more than 0.1 µm, preferably no more than 0.05 µm, and particularly preferably no more than 0.01 µm. For example, among the inorganic layer compounds, the swellable synthetic micas, taken as representative compounds, have a thickness from 1 to 50 nm and a face size from about 1 to about 20 µm.

The coated film strength can be improved and the permeation of oxygen and moisture can be effectively prevented when the protective layer contains the high aspect ratio inorganic layer compound particles described above. As a consequence, impairment of the protective layer due, for example, to deformation, can be prevented, and an excellent storage stability—including no decline in the image-forming performance of the lithographic printing plate precursor due to humidity changes—is obtained even for long-term storage under high humidity conditions.

Examples of general dispersing methods are provided below for those instances in which a layer compound is used in the protective layer.

First, from 5 to 10 mass parts of a swellable layer compound, which was provided as a preferred layer compound among the previously described layer compounds, is added to 100 mass parts water. After thorough mixing into the water and swelling, the mixture is transferred to a disperser and dispersion is carried out. The disperser used here can be exemplified by mills that carry out dispersion by the direct application of mechanical force, high-speed stirring-type dispersers that generate high shear forces, and dispersers that apply high intensity ultrasonic energy. Specific examples are ball mills, sand grinder mills, viscomills, colloid mills, homogenizers, dissolvers, Polytrons, homomixers, homoblenders, Kady mills, the Jet Agitor, capillary emulsifying devices, liquid sirens, piezoelectric-type ultrasonic generators, and emulsifying devices equipped with a Polman whistle. The dispersion, containing 5 to 10 mass % of the inorganic layer compound dispersed by the previously described method, has a high viscosity or is a gel and exhibits an extremely good storage stability.

To prepare a coating fluid for protective layer formation using this dispersion, the dispersion is preferably diluted with water and thoroughly stirred and then blended with the binder solution.

The content of the inorganic layer compound in the protective layer is preferably from 5/1 to 1/100 as the mass ratio with respect to the amount of binder used in the protective layer. When a plurality of inorganic layer compounds are used in combination, it is again preferred that the total quantity of these inorganic layer compounds satisfy this mass ratio.

With regard to other additions for the protective layer, for example, flexibility can be provided by the addition of glycerol, dipropylene glycol, propionamide, cyclohexanediol, sorbitol, and so forth, in an amount corresponding to several mass % with respect to the aforementioned water-soluble or water-insoluble polymer. In addition, known additives, such as a water-soluble (meth)acrylic-type polymer or a water-soluble plasticizer, can be added in order to improve the properties of the film.

The protective layer is formed in the present invention using the coating fluid for protective layer formation as described below, and known additives may be added to this coating fluid in order to improve the adhesion with the image recording layer and the timewise stability of the coating fluid.

Thus, an anionic surfactant, nonionic surfactant, cationic surfactant, or fluorosurfactant and specifically an anionic surfactant such as a sodium alkyl sulfate or sodium alkylsulfonate, an amphoteric surfactant such as an alkylaminocarboxylic acid salt or alkylaminodicarboxylic acid salt, or a nonionic surfactant such as a polyoxyethylene alkylphenyl ether may be added to the coating fluid for protective layer formation in order to improve the coating characteristics. The amount of addition of these surfactants is 0.1 to 100 mass % with respect to the aforementioned water-soluble or water-insoluble polymer.

With regard to achieving an excellent adhesion with the image areas, Japanese Patent Application Publication No. Sho 49-70702 and Great Britain Patent Specification No. 1,303,578 A teach that a satisfactory adhesion is obtained by mixing 20 to 60 mass % of, for example, an acrylic emulsion or a water-insoluble vinylpyrrolidone-vinyl acetate copolymer, into a hydrophilic polymer comprising mainly polyvinyl alcohol and layering this on the image recording layer. Any of these known technologies may be used in the present invention.

In addition, an oleosensitizer, such as the previously described low molecular weight nitrogenous compounds and ammonium salt-containing polymers, may also be added to the protective layer. This addition provides an additional improvement in the receptivity. When an oleosensitizer is added to the protective layer, the quantity of oleosensitizer addition is preferably in the range from 0.5 to 30 mass %.

The protective layer may also be provided with other functionalities. For example, the safelight fitness can be improved without causing a decline in sensitivity by adding a colorant (e.g., a water-soluble dye) that exhibits an excellent transmittance for the infrared radiation used in photoexposure and that can efficiently absorb light at other wavelengths. In addition, finely divided spherical inorganic particles, as are added to the image recording layer as previously described, may be incorporated for the purpose of controlling the slipperiness of the outermost surface of the lithographic printing plate precursor. Suitable examples of these finely divided inorganic particles are silica, alumina, magnesium oxide, titanium oxide, magnesium carbonate, calcium alginate, and mixtures of the preceding. The finely divided inorganic particles preferably have an average particle size of 5 nm to 10 μm and more preferably 50 nm to 3 μm. The finely divided inorganic particles under consideration can be easily acquired as commercial products, e.g., as a colloidal dispersion of silica.

The content of the finely divided inorganic particles is preferably no more than 40 mass % and more preferably no more than 20 mass %, in each case with reference to the total solids fraction of the protective layer.

The protective layer is formed by dispersing or dissolving the previously described protective layer components in solvent and applying the thusly prepared coating fluid for protective layer formation on the image recording layer and drying.

The solvent used for coating can be selected as appropriate in relation to the binder, wherein the use of distilled water or purified water is preferred when a water-soluble polymer is used.

The method for applying the protective layer is not particularly limited and known methods, e.g., the methods described in U.S. Pat. No. 3,458,311 and Japanese Patent Publication No. Sho 55-49729, can be used.

Specifically, for example, blade coating, air knife coating, gravure coating, roll coating, spray coating, dip coating, or bar coating may be used to form the protective layer.

The coating rate for the protective layer is preferably in the range from 0.01 to 10 g/m$^2$, more preferably in the range from 0.02 to 3 g/m$^2$, and most preferably in the range from 0.02 to 1 g/m$^2$, in each case as the coating rate after drying.

The Backcoat Layer

After a surface treatment has been carried out on the support or after an undercoat layer, supra, has been formed on the support, a backcoat layer may as necessary be disposed on the back side of the support.

Preferred examples of the backcoat layer are the coating layer comprising an organic polymer compound as described in Japanese Patent Application Publication No. Hei 5-45885, and the coating layer comprising a metal oxide obtained by the hydrolysis and polycondensation of an organometal compound or inorganic metal compound as described in Japanese Patent Application Publication No. Hei 6-35174. In particular, the use of alkoxy compounds of silicon, e.g., $Si(OCH_3)_4$, $Si(OC_2H_5)_4$, $Si(OC_3H_7)_4$, $Si(OC_4H_9)_4$, and so forth, is preferred because these starting materials can be easily and inexpensively acquired.

[Platemaking Methods]
Alkaline Development Methods

Alkaline development methods are methods that produce a lithographic printing plate through a two-fluid, two-bath platemaking method. In alkaline development methods, a step of imagewise photoexposure of the lithographic printing plate precursor is performed, and after this photoexposure the photosensitive layer of the lithographic printing plate precursor is left intact in the image regions while the unwanted photosensitive layer outside these regions is removed by dissolution with an alkaline developing solution or an organic solvent, thereby exposing the surface of the hydrophilic support and forming the nonimage regions. This is followed by application of a gum solution. With regard to the pH range for the alkaline developing solution, developing solutions up to pH 13.5 can generally be used.

One issue has been to make such a development process simpler and more convenient, and a gum development procedure, in which development is performed using the gum solution, can simplify the process by virtue of being a one-fluid, one-bath method.

On-Press Development Methods

On-press development methods are characterized by a step in which the lithographic printing plate precursor is imagewise photoexposed and by a printing step in which printing is carried out—without executing any development treatment—by feeding oil-based ink and a water-based component to the lithographic printing plate precursor post-photoexposure, wherein the nonphotoexposed areas of the lithographic printing plate precursor are removed during the course of the printing step. First, imagewise photoexposure may be carried out with the lithographic printing plate precursor mounted in the press, or the lithographic printing plate precursor may be mounted in the press after photoexposure. On-press development is thereafter carried out in the initial stage of printing with the press by supplying printing ink and fountain solution and carrying out printing in the described state. The image recording layer in the nonphotoexposed areas is thus removed and accompanying this the surface of the hydrophilic support is exposed and becomes receptive to the fountain solution and printing can proceed.

A more detailed description follows.

A laser is preferred for the light source used for imagewise photoexposure in the present invention. The laser used in the present invention is not particularly limited, but solid-state lasers and semiconductor lasers that emit infrared radiation at a wavelength of 760 to 1,200 nm are suitable examples.

In the case of an infrared laser, the output is preferably at least 100 mW; the exposure time per pixel is preferably no more than 20 microseconds; and the quantity of irradiated energy is preferably from 10 to 300 mJ/cm$^2$. The use of a multibeam laser device is preferred for the laser in order to shorten the photoexposure time.

The photoexposed lithographic printing plate precursor is mounted on the plate cylinder of the press. When the press is equipped with a laser photoexposure unit, imagewise photoexposure is performed after the lithographic printing plate precursor has been mounted on the plate cylinder of the press.

When, after the lithographic printing plate precursor has been imagewise photoexposed with an infrared laser, and without going through a development processing step (e.g., a wet development processing step), printing is performed by feeding fountain solution and printing ink, the image recording layer cured by photoexposure in the photoexposed regions of the image recording layer forms a printing ink receptive area that exhibits an oleophilic surface. On the other hand, in the nonphotoexposed areas, the uncured image recording layer is removed by dissolution or dispersion by the supplied fountain solution and/or printing ink, causing exposure of the hydrophilic surface in these areas. As a result, the fountain solution adheres to the exposed hydrophilic surfaces while the printing ink is taken up by the image recording layer in the photoexposed regions and printing is initiated.

The fountain solution or printing ink may be fed to the plate surface first, but the printing ink is preferably fed first from the standpoint of preventing contamination of the fountain solution by the image recording layer components that have been removed. The fountain solution and printing ink used here can be selected from the fountain solutions and printing inks employed for ordinary lithographic printing.

Proceeding in this manner, the lithographic printing plate precursor may be subjected to on-press development on an offset press and then directly used for long-run printing.

Gum Development Methods

After imagewise photoexposure, the nonimage areas in the image recording layer may be removed using a gum solution. The gum solution used here is also known as a gum developing solution. After removal of the nonimage areas of the image recording layer with the gum solution, the resulting plate may then be used for printing.

In the present invention, this gum solution denotes an aqueous solution that contains a hydrophilic resin. The presence of this hydrophilic resin makes it possible to protect the hydrophilic support that has been exposed by removal of the nonimage areas of the image recording layer and to protect the image areas.

Gum arabic, which generally has a strong desensitizing action, is frequently used in the gum solution, and an approximately 0.1 to 20% aqueous gum arabic solution is often used as the gum solution. Besides gum arabic, various water-soluble resins can also be used as the desensitizer. Preferred examples in this regard are dextrin, sterabic, stractan, alginate salts, polyacrylate salts, hydroxyethyl cellulose, polyvinylpyrrolidone, polyacrylamide, methyl cellulose, hydroxypropyl cellulose, hydroxymethyl cellulose, carboxyalkyl cellulose salts, and the water-soluble polysaccharides extracted from soy bean curd lees. Pullulan, pullulan derivatives, and polyvinyl alcohol are also preferred.

The following are preferred modified starch derivatives: roasted starches such as British gum; enzyme-modified dextrins such as enzymatically produced dextrin and Schardinger dextrin; oxidized starches represented by solubilized starch; pregelatinized starches such as modified pregelatinized starch and unmodified pregelatinized starch; esterified starches such as starch phosphate, fatty starch esters, starch sulfate, starch nitrate, starch xanthate, and starch carbamate; etherized starches such as carboxyalkyl starch, hydroxyalkyl starch, sulfoalkyl starch, cyanoethyl starch, allyl starch, benzyl starch, carbamylethyl starch, and dialkylamino starch; crosslinked starches such as methylol-crosslinked starch, hydroxyalkyl-crosslinked starch, phosphate-crosslinked starch, and dicarboxylic acid-crosslinked starch; and graft copolymerized starches such as starch/polyacrylamide copolymers, starch/polyacrylic acid copolymers, starch/polyvinyl acetate copolymers, starch/polyacrylonitrile copolymers, cationic starch/polyacrylate ester copolymers, cationic starch/vinyl polymer copolymers, starch/polystyrene/maleic acid copolymers, starch/polyethylene oxide copolymers, and starch/polypropylene copolymers.

The following are preferred natural polymer compounds: starches such as sweet potato starch, potato starch, tapioca starch, wheat starch, and corn starch; natural polymer compounds obtained from seaweed, such as carrageenan, laminaran, mannan derived from seaweed, funori, Irish moss, agar, and sodium alginate; plant mucilages such as tororoaoi mucilage, mannan, quince seed mucilage, pectin, tragacanth gum, karaya gum, xanthine gum, guar bean gum, locust bean gum, carob gum, and benzoin gum; microbial mucilages such as homopolysaccharides, e.g., dextran, glucan, and levan, and heteropolysaccharides, e.g., succinoglucan and xanthan gum; and proteins such as glue, gelatin, casein, and collagen.

Two or more of these water-soluble polymers may be used in combination. The water-soluble polymer content in the gum solution is preferably 1 to 50 mass % and more preferably is 3 to 30 mass %.

In addition to the water-soluble resin described above, the gum solution used by the present invention may contain a pH adjuster, surfactant, preservative, antimold, oleophilic substance, wetting agent, chelating agent, defoamer, and so forth.

The pH value of the gum solution may be in the range from the acidic region into the alkaline region and generally can be from pH 5.0 to 13.5. An embodiment therewithin uses the pH range of 8.5 to 10.8.

A buffer may be added to the gum solution as a pH adjuster, and, for example, an alkaline buffer such as a carbonate-bicarbonate system can be used.

In addition, a mineral acid, organic acid, or inorganic salt may generally be added to the gum solution in order to adjust the pH. The quantity of addition is 0.01 to 2 mass %. The mineral acid can be exemplified by nitric acid, sulfuric acid, phosphoric acid, metaphosphoric acid, and so forth. The organic acid can be exemplified by acetic acid, oxalic acid, malonic acid, p-toluenesulfonic acid, levulinic acid, phytic acid, organophosphonic acids, and amino acids such as glycine, α-alanine, and β-alanine. The inorganic salt can be exemplified by magnesium nitrate, primary sodium phosphate, secondary sodium phosphate, nickel sulfate, sodium hexametaphosphate, sodium tripolyphosphate, and so forth. At least one mineral acid, organic acid, or inorganic salt can be used or two or more may be used in combination. In addition, a base such as sodium hydroxide may also be used to adjust the pH of the gum solution.

The surfactant in the gum solution can be an anionic surfactant, cationic surfactant, amphoteric surfactant, or nonionic surfactant. The anionic surfactant can be exemplified by fatty acid salts, abietic acid salts, hydroxyalkanesulfonic acid salts, alkanesulfonic acid salts, α-olefinsulfonic acid salts, dialkyl sulfosuccinate salts, alkyldiphenyl ether disulfonic acid salts, straight-chain alkylbenzenesulfonic acid salts, branched alkylbenzenesulfonic acid salts, alkylnaphthalenesulfonic acid salts, alkylphenoxy polyoxyethylenepropylsulfonic acid salts, polyoxyethylene alkylsulfophenyl ether salts, sodium N-methyl-N-oleyltaurate, N-alkylsulfosuccinic acid monoamide disodium salts, petroleum sulfonic acid salts, sulfated castor oil, sulfated beef tallow oil, salts of sulfate esters of alkyl esters of fatty acids, salts of alkyl sulfates, salts of sulfate esters of polyoxyethylene alkyl ethers, salts of sulfate esters of fatty acid monoglycerides, salts of sulfate esters of polyoxyethylene alkylphenyl ethers, salts of sulfate esters of polyoxyethylene styrylphenyl ethers, salts of alkyl phosphates, salts of phosphate esters of polyoxyethylene alkyl ethers, salts of phosphate esters of polyoxyethylene alkylphenyl ethers, partially saponified styrene/maleic anhydride copolymers, partially saponified olefin/maleic anhydride copolymers, and naphthalenesulfonate/formalin condensates. The use is particularly preferred among the preceding of dialkyl sulfosuccinate salts, salts of alkyl sulfates, alkylnaphthalenesulfonic acid salts, α-olefinsulfonic acid salts, and alkyldiphenyl ether disulfonic acid salts.

Alkylamine salts, quaternary ammonium salts, and so forth, can be used as the cationic surfactant.

Alkylcarboxybetaines, alkylimidazolines, alkylaminocarboxylic acids, and so forth, can be used as the amphoteric surfactant.

The nonionic surfactant can be exemplified by polyoxyethylene alkyl ethers, polyoxyethylene alkylphenyl ethers, polyoxyethylene polystyrylphenyl ethers, polyoxyethylene-polyoxypropylene alkyl ethers, glycerol/fatty acid partial esters, sorbitan/fatty acid partial esters, pentaerythritol/fatty acid partial esters, propylene glycol/fatty acid monoesters, sucrose/fatty acid partial esters, polyoxyethylene sorbitan/fatty acid partial esters, polyoxyethylene sorbitol/fatty acid partial esters, polyethylene glycol/fatty acid esters, polyglycerol/fatty acid partial esters, polyoxyethylenated castor oil, polyoxyethylene glycerol/fatty acid partial esters, fatty acid diethanolamides, N,N-bis-2-hydroxyalkylamines, polyoxyethylene alkylamines, triethanolamine/fatty acid esters, trialkylamine oxides, polypropylene glycol with a molecular weight of 200 to 5000, polyoxyethylene or polyoxypropylene adducts on trimethylolpropane or glycerol or sorbitol, acetylene glycol, and so forth. Fluorine-type and silicon-type nonionic surfactants can also be similarly used.

Two or more of these surfactants can be used in combination. There are no particular limitations on the quantity of use; however, with regard to the preferred range, 0.01 to 20 mass % based on the total mass of the gum solution is suitable while 0.05 to 10 mass % based on the total mass of the gum solution is preferred.

The preservative can be the known substances used in the wood processing, food, drug, cosmetic, and agrochemical sectors. The known preservatives can be used, for example, quaternary ammonium salts, monohydric phenol derivatives, dihydric phenol derivatives, polyhydric phenol derivatives, imidazole derivatives, pyrazolopyrimidine derivatives, monohydric naphthol, carbonates, sulfone derivatives, organotin compounds, cyclopentane derivatives, phenyl derivatives, phenol ether derivatives, phenol ester derivatives, hydroxylamine derivatives, nitrile derivatives, naphthalenes, pyrrole derivatives, quinoline derivatives, benzothiazole derivatives, secondary amines, 1,3,5-triazine derivatives, thiadiazole derivatives, anilide derivatives, pyrrole derivatives, halogen derivatives, dihydric alcohol derivatives, dithiol derivatives, cyanic acid derivatives, thiocarbamate derivatives, diamine derivatives, isothiazole derivatives, monohydric alcohols, saturated aldehydes, unsaturated monocarboxylic acids, saturated ethers, unsaturated ethers, lactones, amino acid derivatives, hydantoin, cyanuric acid derivatives, guanidine derivatives, pyridine derivatives, saturated monocarboxylic acids, benzenecarboxylic acid derivatives, hydroxycarboxylic acid derivatives, biphenyl, hydroxamic acid derivatives, aromatic alcohols, halophenol derivatives, benzenecarboxylic acid derivatives, mercaptocarboxylic acid derivatives, quaternary ammonium salt derivatives, triphenylmethane derivatives, hinokithiol, furan derivatives, benzofuran derivatives, acridine derivatives, isoquinoline derivatives, arsine derivatives, thiocarbamic acid derivatives, phosphate esters, halobenzene derivatives, quinone derivatives, benzenesulfonic acid derivatives, monoamine derivatives, organophosphate esters, piperazine derivatives, phenazine derivatives, pyrimidine derivatives, thiophanate derivatives, imidazoline derivatives, isoxazole derivatives, ammonium salt derivatives, and so forth. The following are particularly preferred preservatives: the salts of pyridinethiol-1-oxide, salicylic acid and its salts, 1,3,5-trishydroxyethylhexahydro-s-triazine, 1,3,5-trishydroxymethylhexahydro-s-triazine, 1,2-benzisothiazolin-3-one, 5-chloro-2-methyl-4-isothiazolin-3-one, and 2-bromo-2-nitro-1,3-propanediol. The preferred quantity of addition is a quantity that provides a stable efficacy with respect to bacteria, mold, yeast, and so forth, and while this will vary with the species of bacteria, mold, or yeast, the range of 0.01 to 4 mass % with respect to the gum solution at the time of use is preferred. The combined use of two or more preservatives in order to be efficacious against various mold and bacteria is preferred.

An oleophilic substance may also be present in the gum solution. Preferred oleophilic substances include, for example, castor oil and $C_{5-25}$ organic carboxylic acids such as oleic acid, lanolic acid, valeric acid, nonanoic acid, caprylic acid, myristic acid, palmitic acid, and so forth. A single oleophilic substance can be used or two or more can be used in combination. The content of the oleophilic substance in the gum solution is in the range from 0.005 to 10 mass % and more preferably in the range from 0.05 to 5 mass %, in each case with respect to the total mass of the gum solution.

In addition, the wetting agent that can be added as necessary to the gum solution is, for example, glycerol, ethylene glycol, propylene glycol, triethylene glycol, butylene glycol, hexylene glycol, diethylene glycol, dipropylene glycol, glycerol, trimethylolpropane, diglycerol, and so forth. A single one of these wetting agents may be used or two or more may be used in combination. The preferred quantity of use of these wetting agents is 0.1 to 5 mass %.

A chelating compound may also be added to the gum solution. Gum solutions are typically sold as concentrates, which are diluted at the time of use with, for example, tap water or well water, and then used. The calcium ion and so forth present in this tap water or well water used for dilution has a negative effect on printing and functions to facilitate scumming on the printed material; these problems can be dealt with by the addition of a chelating compound. Preferred chelating compounds are, for example, ethylenediaminetetraacetic acid and its potassium and sodium salts; diethylenetriaminepentaacetic and its potassium and sodium salts; triethylenetetraaminehexaacetic acid and its potassium and sodium salts; hydroxyethylethylenediaminetriacetic acid and its potassium and sodium salts; nitrilotriacetic acid and its sodium salt; and organophosphonic acids and phosphonoalkanetricarboxylic acids, e.g., 1-hydroxyethane-1,1-diphosphonic acid and its potassium and sodium salts, aminotri (methylenephosphonic acid) and its potassium and sodium salts, and so forth. In addition to the sodium and potassium salts, the salts of these chelating agents with organic amines are also effective. A chelating agent is selected that is stable in the gum solution composition and that does not impair the printing characteristics. The quantity of addition is suitably 0.001 to 1.0 mass % with reference to the gum solution at the time of use.

A defoamer can also be added to the gum solution, and silicone defoamers are particularly preferred. Among these defoamers, either of an emulsion/dispersion type or a solubilizing type can be used. A range of 0.001 to 1.0 mass % with respect to the gum solution at the time of use is optimal.

Water is the component that balances out the gum solution. From a transportation standpoint, the gum solution advantageously is made as a concentrate having a smaller water content than at the time of use and is diluted with water at the time of use. The concentration in such cases is desirably a concentration that does not result in separation or precipitation of the components. The gum solution may be prepared as an emulsion/dispersion type wherein organic solvent is used as the oil phase thereof, and, using the assistance of a surfactant as described above, may be formulated as a solubilizing type (emulsion type).

The organic solvent preferably is an organic solvent that has a solubility in water at 20° C. of no more than 5 mass % and a boiling point of at least 160° C. A plasticizer with a solidification point no greater than 15° C. and a boiling point at 1 atmosphere of at least 300° C. is incorporated, for example, a phthalate diester such as dibutyl phthalate, diheptyl phthalate, di-n-octyl phthalate, di(2-ethylhexyl)phthalate, dinonyl phthalate, didecyl phthalate, dilauryl phthalate, butyl benzyl phthalate, and so forth; an ester of an aliphatic dibasic acid, such as dioctyl adipate, butyl glycol adipate, dioctyl azelate, dibutyl sebacate, di(2-ethylhexyl)sebacate, dioctyl sebacate, and so forth; an epoxidized triglyceride such as epoxidized soy oil and so forth; a phosphate ester such as tricresyl phosphate, trioctyl phosphate, trischloroethyl phosphate, and so forth; or a benzoate ester such as benzyl benzoate and so forth.

In addition, the alcohol system can be exemplified by 2-octanol, 2-ethylhexanol, nonanol, n-decanol, undecanol, n-dodecanol, trimethylnonyl alcohol, tetradecanol, benzyl alcohol, and so forth. The glycol system can be exemplified by ethylene glycol isoamyl ether, ethylene glycol monophenyl ether, ethylene glycol benzyl ether, ethylene glycol hexyl ether, octylene glycol, and so forth.

Odor is a particular consideration when selecting the preceding compounds. The preferred range for the quantity of use of these solvents is 0.1 to 5 mass % of the plate surface protectant and the more preferred range is 0.5 to 3 mass %. A single solvent can be used or two or more can be used in combination.

The gum solution used by the present invention is produced by bringing the aqueous phase to a temperature of 40° C.±5° C.; slowly dripping the prepared oil phase into the aqueous phase while stirring at high speed; and, after thorough stirring, carrying out emulsification and dispersion by passage through a pressure-type homogenizer.

In the platemaking method of the present invention, the step of removing the nonimage areas of the image recording layer using the previously described gum solution can be followed as appropriate by a water rinse step and/or a subsequent additional step of desensitizing the nonimage areas using the gum solution.

The gum development process of the present invention can be suitably carried out using an automatic processor that is provided with a rubbing member and a means of supplying, inter alia, the gum solution. An example of an automatic processor is the automatic processor described in Japanese Patent Application Publication No. 2006-235227, which after imaging carries out a rubbing process while transporting the lithographic printing plate precursor. A particularly preferred automatic processor in this sphere uses a rotating brush roll as the rubbing member.

A rotating brush roll preferred for use in the present invention can be selected as appropriate based on considerations of preventing damage to the image areas, the rigidity of the support in the lithographic printing plate precursor, and so forth.

This rotating brush roll can be a known rotating brush roll in which brush elements are attached to a plastic or metal roll. Examples of usable rotating brush rolls are described in Japanese Patent Application Publication Nos. Sho 58-159533 and Hei 3-100554 and in Japanese Utility Model Publication No. Sho 62-167253, which describes a brush roll in which a metal or plastic channel-shaped member having brush elements implanted therein in a row configuration is wound without gaps and in a radiating manner on a core comprising a plastic or metal roll.

A plastic fiber (for example, a synthetic fiber of, for example, a polyester such as polyethylene terephthalate, polybutylene terephthalate, and so forth; a polyamide such as nylon 6,6, nylon 6,10, and so forth; a polyacrylic type such as polyacrylonitrile, poly(alkyl(meth)acrylate), and so forth; or a polyolefin such as polypropylene, polystyrene, and so forth) can be used as the brush element. For example, the diameter of the fiber bristle is suitably 20 to 400 µm and a bristle length of 5 to 30 mm can be suitably used.

The outer diameter of the rotating brush roll is preferably 30 to 200 mm and the peripheral velocity at the brush tip that rubs the plate surface is preferably 0.1 to 5 msec.

The direction of rotation of the rotating brush roll used in the present invention may be the same direction as the direction of transport of the lithographic printing plate precursor of the present invention or may be the direction opposite from the direction of transport of the lithographic printing plate precursor of the present invention. However, in a preferred embodiment for the use of at least two rotating brush rolls, as in the automatic processor shown as an example in FIG. 1, at least one rotating brush roll rotates in the same direction and at least one rotating brush roll rotates in the opposite direction. This serves to provide an even more secure and reliable removal of the image recording layer in the nonimage areas. Rocking the rotating brush roll along the axis of rotation of the brush roll is also effective.

The temperature of the gum solution used for gum development in the present invention and the temperature of the rinse water in subsequent steps can be freely selected independently from one another, but are preferably 10° C. to 50° C.

A drying step may be provided at any point after gum development in the gum development method of the present invention. The drying step is generally carried out by the application of a dry air current with a freely selected temperature after most of the processing solution has been removed by a roller nip.

EXAMPLES

The present invention is described in detail by the examples provided below, but the present invention is not limited to these examples.

Examples 1 to 19 and Comparative Examples 1 to 2

1. Preparation of the Lithographic Printing Plate Precursor (1) Preparation of Support The rolling oil was removed from the surface of 0.3 mm-thick aluminum sheet (JIS A 1050) by a degreasing treatment for 30 seconds at 50° C. using 10 mass % aqueous sodium aluminate solution. After this, the aluminum surface was grained using three implanted nylon brushes with a bristle diameter of 0.3 mm and an aqueous suspension (specific gravity=1.1 g/cm$^3$) of pumice having a median diameter of 25 μm; this was followed by a thorough rinse with water. This sheet was etched by dipping for 9 seconds in a 45° C. 25 mass % aqueous sodium hydroxide solution followed by a water rinse and then dipping for 20 seconds in 20 mass % nitric acid at 60° C. followed by a water rinse. The resulting amount of etching of the grained surface was approximately 3 g/m$^2$.

A continuous electrochemical roughening treatment was then carried out using 60-Hz AC voltage. The electrolytic solution used for this treatment was a 1 mass % aqueous nitric acid solution (containing 0.5 mass % aluminum ion) and the bath temperature was 50° C. The AC power source waveform provided trapezoidal square wave alternating current with a TP (time required for the current value to go from zero to the peak) of 0.8 msec and a duty ratio of 1:1, and the electrochemical roughening was carried out using a carbon electrode as the counterelectrode. Ferrite was used as an auxiliary anode. The current density was 30 A/dm$^2$ at the current peak value, and 5% of the current flowing from the power source was branched to the auxiliary anode.

The quantity of electricity in this nitric acid electrolysis was 175 C/dm$^2$ for the time in which the aluminum sheet was functioning as an anode. This treatment was followed by a water rinse by spraying.

An electrochemical roughening treatment was then carried out by the same method as for the nitric acid electrolysis, but using the following conditions: electrolytic solution=0.5 mass % aqueous hydrochloric acid solution (containing 0.5 mass % aluminum ion), bath temperature=50° C., quantity of electricity=50 C/dm$^2$ for the time in which the aluminum sheet was functioning as an anode. This was followed by a water rinse by spraying.

A 2.5 g/m$^2$ direct-current anodic oxidation film was then disposed on this sheet using a current density of 15 A/dm$^2$ and using 15 mass % sulfuric acid (containing 0.5 mass % aluminum ion) as the electrolytic solution; this was followed by a water rinse and drying.

In order to secure the hydrophilicity in the nonimage regions, a silicate treatment was subsequently performed for 12 seconds at 70° C. using a 2.5 mass % aqueous #3 sodium silicate solution. The Si add-on was 10 mg/m$^2$. This was followed by a water rinse to obtain support (1). The centerline average roughness (Ra) of this substrate was measured at 0.51 μm using a needle with a diameter of 2 μm.

(2) Formation of the Undercoat Layer (1)

An undercoat layer (1) was then provided on the previously described support (1) by the application of the following undercoat fluid (1) so as to give a dry coating weight of 28 mg/m$^2$.

| <Coating fluid (1) for undercoat layer formation> | |
|---|---|
| compound (1) for undercoat layer formation, with the structure given below, Mw 100,000 | 0.18 g |
| hydroxyethyliminodiazetic acid | 0.10 g |
| methanol | 55.24 g |
| water | 6.15 g |

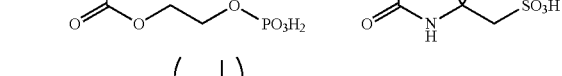
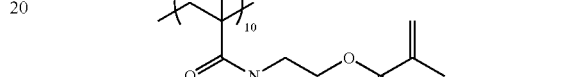

compound(1) for undercoat layer formation (3) Formation of the Image Recording Layer The image recording layer coating fluid (1) with the composition shown below was bar coated on the undercoat layer formed as described above; this was followed by oven drying for 60 seconds at 100° C. to form an image recording layer (1) having a dry coating weight of 1.0 g/m$^2$.

The image recording layer coating fluid (1) was obtained by mixing and stirring the following photosensitive fluid (1) with microgel fluid (1) immediately before application.

| <Photosensitive fluid (1)> | |
|---|---|
| binder polymer (1) (structure given below: component (E)) | 0.024 g |
| infrared absorber (1) (structure given below: component (A)) | 0.030 g |
| radical polymerization initiator (1) (structure given below: component (B)) | 0.162 g |
| polymerizable compound (component (C)) tris(acryloyloxyethyl) isocyanurate (NK Ester A-9300, from Shin-Nakamura Chemical Co., Ltd.) | 0.134 g |
| low molecular weight hydrophilic compound tris(2-hydroxyethyl) isocyanurate | 0.062 g |
| low molecular weight hydrophilic compound (1) (structure given below) | 0.050 g |
| oleosensitizer, phosphonium compound (1) (structure given below) | 0.055 g |
| oleosensitizer benzyldimethyloctylammonium•PF$_6$ salt | 0.018 g |
| polymerizable monomer (indicated in Table 1 below, designation according to the previously provided examples) | 0.058 g |
| fluorosurfactant (1) (structure given below) | 0.008 g |
| methyl ethyl ketone | 1.091 g |
| 1-methoxy-2-propanol | 8.609 g |

| <Microgel fluid (1)> | |
|---|---|
| microgel (1) | 2.640 g |
| distilled water | 2.425 g |

The structures of the above-cited infrared absorber (1), radical polymerization initiator (1), phosphonium compound (1), low molecular weight hydrophilic compound (1), and fluorosurfactant (1) are shown below.

(1)

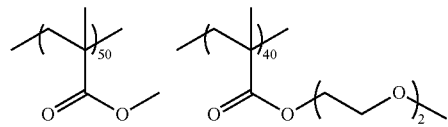

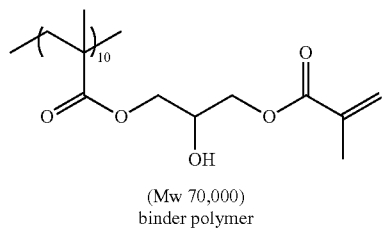

(Mw 70,000)
binder polymer (1)

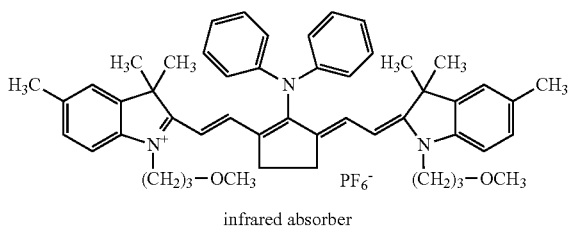

infrared absorber (1)

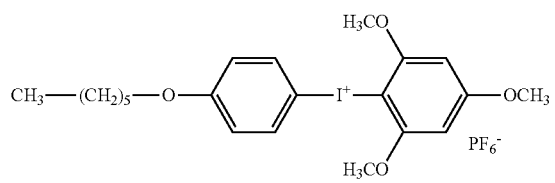

polymerization initiator (1)

—(CH$_2$CH)$_{30}$—
 |
 COOC$_2$H$_4$C$_6$F$_{13}$

—(CH$_2$CH)$_{70}$—
 |
 C—(OC$_2$H$_4$)$_{11}$—(OC$_3$H$_6$)$_{22}$—(OC$_2$H$_4$)$_{11}$—OH
 ‖
 O fluorosurfactant (1)

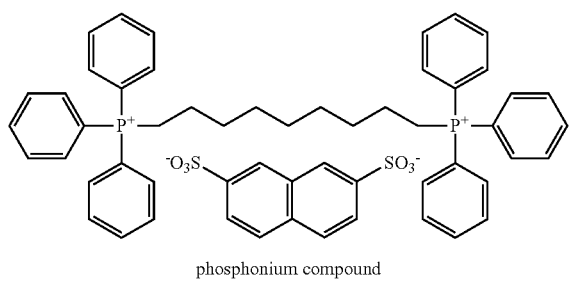

phosphonium compound (1)

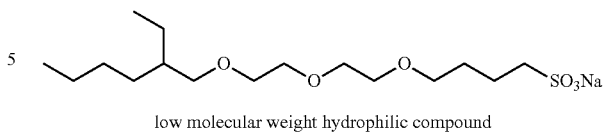

low molecular weight hydrophilic compound

The above-referenced microgel (1) was synthesized as follows.

<Synthesis of Microgel (1)>

An oil phase component was prepared by dissolving the following in 17 g ethyl acetate: 10 g trimethylolpropane/xylene diisocyanate adduct (Mitsui Takeda Chemical Co., Ltd., Takenate D-110N), 3.15 g pentaerythritol triacrylate (component (C), Nippon Kayaku Co., Ltd., SR444), and 0.1 g Paionin A-41C (Takemoto Oil & Fat Co., Ltd.). 40 g of a 4 mass % aqueous solution of PVA-205 was prepared for the aqueous phase component. The oil phase component and aqueous phase component were mixed and were emulsified for 10 minutes at 12,000 rpm using a homogenizer. The resulting emulsion was added to 25 g distilled water and stirring was performed for 30 minutes at room temperature and then for 3 hours at 50° C. The thusly obtained microgel solution was diluted with distilled water to bring the solids concentration to 15 mass %, and this was used as the above-referenced microgel (1). Measurement of the average particle size of the microgel by a light scattering procedure gave an average particle size of 0.2 μm.

(4) Formation of the Protective Layer (1)

The protective layer coating fluid (1) with the composition given below was bar coated on the image recording layer that had been formed as described in the preceding; this was followed by oven drying for 60 seconds at 120° C. to form a protective layer (1) having a dry coating weight of 0.15 g/m².

| <Protective layer coating bath (1)> | |
|---|---|
| inorganic layer compound dispersion (1) | 1.5 g |
| 6 mass % aqueous solution of polyvinyl alcohol (CKS50 from Nippon Synthetic Chemical Industry Co., Ltd., sulfonic acid modified, degree of saponification at least 99 mol %, degree of polymerization = 300) | 0.55 g |
| 6 mass % aqueous solution of polyvinyl alcohol (PVA-405 from Kuraray Co., Ltd., degree of saponification = 81.5 mol %, degree of polymerization = 500) | 0.03 g |
| 1 mass % aqueous solution of surfactant from Nihon Emulsion Co., Ltd. (Emalex 710) | 8.60 g |
| ion-exchanged water | 6.0 g |

(Preparation of the Inorganic Layer Compound Dispersion (1))

6.4 g of the synthetic mica Somashif ME-100 (Co-op Chemical Co., Ltd.) was added to 193.6 g ion-exchanged water, and dispersion was carried out using a homogenizer until the average particle size reached 3 μm (laser scattering method). The aspect ratio of the resulting dispersed particles was at least 100.

2. On-Press Development and Evaluation

The on-press developability, printing durability, and print scumming of the obtained lithographic printing plate precursors were evaluated as described below. The results are shown in Table 1.

(1) On-Press Developability

The resulting lithographic printing plate precursor was photoexposed using a Luxel Platesetter T-6000 μl (Fujifilm Corporation), which was equipped with an infrared semiconductor laser; the conditions were an external drum rotation rate of 1000 rpm, a laser output of 70%, and a resolution of 2400 dpi. Photoexposure was carried out in such a manner that the photoexposed image contained a solid image and the 50% halftone chart of a 20 μm-dot FM screen.

The on-press developability was measured as the number of sheets of printing paper required until on-press development of the nonphotoexposed areas of the image recording layer on the press was completed and ink was not transferred to the nonimage areas. The results are shown in Table 1.

(2) Printing Durability

The obtained photoexposed precursor was installed, without a development process, on the plate cylinder of a Lithrone 26 press from the Komori Corporation. Using a fountain solution of Ecolity-2 (Fujifilm Corporation)/tap water=2/98 (volume ratio) and Best Cure UV-BF-WRO standard black ink (T&K TOKA Company), the fountain solution and ink were supplied followed by printing at a printing speed of 10,000 impressions per hour. To evaluate the printing durability, the printing end point was taken to be the number of sheets when the image density of the printed material had declined 5% from that at the start of printing. The results of the evaluation are shown in Table 1.

(3) Print Scumming

Printing was performed as described above with each lithographic printing plate and blanket scumming in the nonimage areas was visually evaluated after 10,000 impressions. The scumming inhibition behavior was evaluated on a 5 level scale from 1 to 5 with 5 being assigned to the minimum degree of blanket scumming. Using a forcing interval in which the plate was held for 2 days at 60° C., the sample prior to the forcing interval was designated as the pre-forcing interval sample and the sample after application of the forcing interval was designated as the post-forcing interval sample; this was followed by printing and evaluation of the scumming as described above. The results of the evaluation are shown in Table 1.

TABLE 1

| | polymerizable monomer | on-press developability | print scumming pre-forcing interval | print scumming post-forcing interval | printing durability (impressions) |
|---|---|---|---|---|---|
| Ex. 1 | 1-a | 5 | 5 | 5 | 55000 |
| Ex. 2 | 1-b | 6 | 5 | 4 | 42000 |
| Ex. 3 | 2-c | 17 | 5 | 4 | 35000 |
| Ex. 4 | 2-e | 17 | 5 | 4 | 33000 |
| Ex. 5 | 6-a | 18 | 5 | 4 | 34000 |
| Ex. 6 | 3-a | 10 | 5 | 5 | 38000 |
| Ex. 7 | 4-a | 15 | 5 | 5 | 44000 |
| Ex. 8 | 5-a | 10 | 5 | 5 | 45000 |
| Ex. 9 | 6-b | 9 | 5 | 5 | 46000 |
| Ex. 10 | 7-a | 6 | 5 | 5 | 47000 |
| Ex. 11 | 7-b | 10 | 5 | 5 | 49000 |
| Ex. 12 | 7-d | 8 | 5 | 5 | 56000 |
| Ex. 13 | 7-j | 9 | 5 | 5 | 61000 |
| Ex. 14*[1] | 1-a | 5 | 5 | 5 | 68000 |
| Ex. 15*[2] | 1-a | 5 | 5 | 5 | 71000 |
| Ex. 16*[3] | 2-a | 5 | 5 | 5 | 66000 |
| Ex. 17*[4] | 3-a | 5 | 5 | 5 | 65000 |
| Comp. Ex. 1* | x-1 | 40 | 1 | 1 | 22000 |
| Comp. Ex. 2* | x-2 | 12 | 4 | 2 | not more than 5000 |
| Ex. 18*[5] | x-3 | 10 | 5 | 6 | 18000 |
| Ex. 19*[6] | x-4 | 10 | 5 | 5 | not more than 5000 |

*For the image recording layers on the lithographic printing plate precursors used in Comparative Examples 1 and 2, the composition of the previously described photosensitive layer employed, respectively, x-1 as a low molecular weight compound that had a sulfonamide group but lacked a polymerizable group and x-2 as a polymerizable monomer that had a polymerizable group but lacked a sulfonamide group.

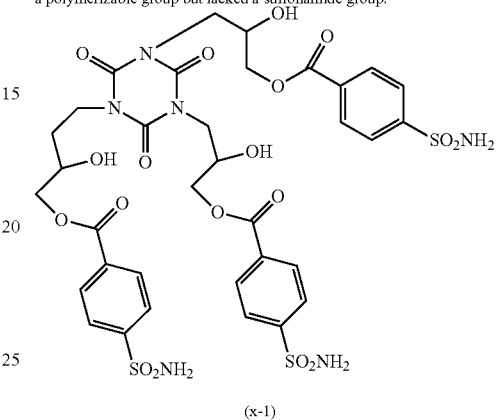

(x-1)

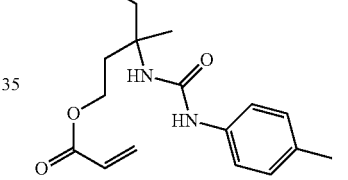

(x-2)

*[1] The previously described (B-10) was used as the binder polymer in Example 14.
*[2] The previously described (B-11) was used as the binder polymer in Example 15.
*[3] The previously described (B-17) was used as the binder polymer in Example 16.
*[4] The previously described (B-20) was used as the binder polymer in Example 17.
*[5],*[6] For the image recording layers on the lithographic printing plate precursors used in Examples 18 and 19, the composition of the previously described photosensitive layer employed, respectively, the alkylsulfonamide group-containing polymerizable monomer x-3 or x-4 as the polymerizable monomer.

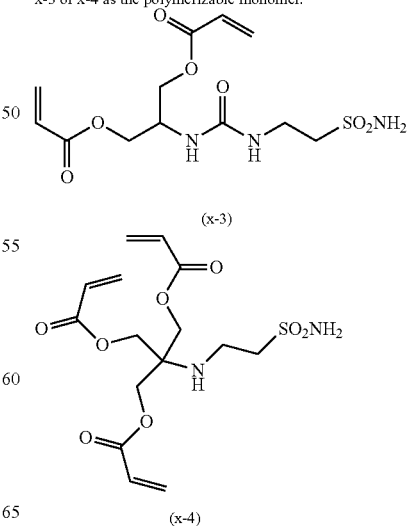

(x-3)

(x-4)

As may be understood from Table 1, the present invention provides a lithographic printing plate precursor and a lithographic printing plate platemaking method that exhibit both an excellent on-press developability and an excellent printing durability.

Examples 20 to 30 and Comparative Examples 3 and 4

Lithographic Printing Plate Precursors and Gum Development

The same lithographic printing plate precursors as used in the previously described Examples 1 to 9, 14, and 16 and Comparative Examples 1 and 2 were photoexposed as described below and subjected to gum development and evaluation as described below.

(1) Gum Developability (Fine Line Reproducibility)

The obtained lithographic printing plate precursor was imagewise photoexposed using a Trendsetter 3244VX (Creo), which was equipped with an infrared semiconductor laser; photoexposure was carried out at an output of 6.4 W, an external drum rotation rate of 150 rpm, and a resolution of 2400 dpi. The photoexposed image contained a solid image and a fine-line image.

Using the automatic developing apparatus shown in FIG. 1, the obtained photoexposed precursor was treated using a step in which the nonimage areas were removed in the development section 14 in the figure, a water rinse step in the water rinse section 16 in the figure, and a desensitizing step in the desensitization processing section 18 in the figure. "FN-6" gum solution (Fujifilm Corporation)/tap water=1/1 was employed for the processing fluid used in the development section and the desensitization processing section. The water used in the water rinse section was circulated using a pump and was re-used after passage through a filter with a mesh of 10 μm.

The photoexposed precursor was mounted on the cylinder of a Speedmaster 52 press (Heidelberg); fountain solution and ink were supplied using a fountain solution of IF102 etching solution from the Fujifilm Corporation/water=3/97 (volume ratio) and Best Cure UV-BF-WRO standard black ink (T&K TOKA Company); and 100 impressions were then printed at a printing speed of 6000 impressions per hour.

As the procedure for evaluating whether removal of the nonimage areas of the image recording layer in the described development process had proceeded in conformity with the desired image, an evaluation was carried out on the basis of the width of the reproduced white fine lines by visually inspecting the printed paper to determine to what white fine line width on the printed paper the photoexposed fine line image (test chart in which the white line thickness (fine line-shaped nonimage areas within the image area) was varied from 10 μm to 50 μm in 2 μm increments) could be reproduced. Thus, a smaller value indicates a better development to a narrower fine line and is the preferred result. These results are shown in Table 2.

(2) Printing Durability

After the fine line reproducibility had been evaluated as described above, printing was continued and the printing durability was evaluated in the same manner as described above for the on-press-developed printing plates. The results are shown in Table 2.

(3) Print Scumming

Printing was performed as described above with each lithographic printing plate and blanket scumming in the nonimage areas was visually evaluated after 10,000 impressions. The scumming inhibition behavior was evaluated on a 5 level scale from 1 to 5 with 5 being assigned to the minimum degree of blanket scumming. Using a forcing interval in which the plate was held for 2 days at 60° C., the sample prior to the forcing interval was designated as the pre-forcing interval sample and the sample after application of the forcing interval was designated as the post-forcing interval sample; this was followed by printing and evaluation of the scumming as described above. The results of the evaluation are shown in Table 2.

TABLE 2

| | polymerizable monomer | gum developability (fine line reproducibility) | print scumming | | printing durability (impressions) |
|---|---|---|---|---|---|
| | | | pre-forcing interval | post-forcing interval | |
| Ex. 20 | 1-a | 10 | 5 | 5 | 60000 |
| Ex. 21 | 1-b | 10 | 5 | 4 | 56000 |
| Ex. 22 | 2-c | 16 | 5 | 4 | 41000 |
| Ex. 23 | 2-e | 17 | 5 | 4 | 40000 |
| Ex. 24 | 6-a | 17 | 5 | 4 | 38000 |
| Ex. 25 | 3-a | 12 | 5 | 5 | 47000 |
| Ex. 26 | 4-a | 14 | 5 | 4 | 49000 |
| Ex. 27 | 5-a | 16 | 5 | 5 | 47000 |
| Ex. 28 | 6-b | 14 | 5 | 4 | 46000 |
| Ex. 29* | 1-a | 10 | 5 | 5 | 65000 |
| Ex. 30** | 2-a | 10 | 5 | 5 | 72000 |
| Comp. Ex. 3 | x-1 | 48 | 1 | 1 | 22000 |
| Comp. Ex. 4 | x-2 | 18 | 4 | 3 | not more than 1000 |

For the image recording layers on the lithographic printing plate precursors used in Comparative Examples 3 and 4, the composition of the previously described photosensitive layer employed, respectively, x-1 as a low molecular weight compound that had a sulfonamide group but lacked a polymerizable group and x-2 as a polymerizable monomer that had a polymerizable group but lacked a sulfonamide group.
*The previously described B-10 was used as the binder polymer in Example 29.
**The previously described B-17 was used as the binder polymer in Example 30.

As may be understood from the results in Table 2, the present invention provides a lithographic printing plate precursor and a lithographic printing plate platemaking method that exhibit both an excellent gum developability (fine line reproducibility) and an excellent printing durability.

Examples 31 to 41 and Comparative Examples 5 to 7

Lithographic Printing Plate Precursors and Gum Development (1) Fabrication of the Lithographic Printing Plate Precursors
[Fabrication of the Support]

The following surface treatments were performed using aluminum sheet (JIS A1050) that had a thickness of 0.03 mm.

(a) Mechanical Surface Roughening Treatment

A mechanical surface roughening treatment was carried out using rotating roller-shaped nylon brushes; this was carried out while feeding a suspension of polishing agent (pumice) with a specific gravity of 1.12 + water as a polishing slurry to the surface of the aluminum sheet. The average particle size in the polishing agent was 30 μm and the maximum particle size was 100 μm. The nylon brushes were nylon 6·10; the bristle length was 45 mm; and the bristle diameter was 0.3 mm. The bristles in a nylon brush were densely implanted in holes in a 300 mmϕ stainless steel cylinder. Three rotating brushes were used. The gap between the two support rollers (200 mmϕ) underneath a brush was 300 mm. The brush rollers were pressed down until the load on the drive motor rotating the brush reached +7 kW with respect to the load prior to the application of the brush roller to the aluminum sheet. The direction of brush rotation was the same as the transport direction of the aluminum sheet. The brushes were rotated at 200 rpm.

(b) Alkali Etching Treatment

The aluminum sheet was etched by spraying using a 70° C. aqueous solution with 2.6 mass % sodium hydroxide and 6.5 mass % aluminum ion. 10 g/m$^2$ of the aluminum sheet was dissolved. This was followed by a water rinse by spraying.

(c) Desmutting

Desmutting was carried out by spraying with a 1 mass % aqueous nitric acid solution (contained 0.5 mass % aluminum ion) at 30° C.; this was followed by a water rinse by spraying. The aqueous nitric acid solution used for desmutting was the waste effluent from the electrochemical surface roughening treatment that used alternating current in an aqueous nitric acid solution described below.

(d) Electrochemical Surface Roughening Treatment

Continuous electrochemical surface roughening was carried out using 60 Hz alternating-current voltage. The electrolyte solution was a 10.5 g/L aqueous nitric acid solution (contained 5 g/L aluminum ion and 0.007 mass % ammonium ion); the temperature of the solution was 50° C. The electrochemical surface roughening was carried out using a trapezoidal square wave alternating current with a TP (time required for the current value to go from zero to the peak) of 0.8 msec and a duty ratio of 1:1 and using a carbon electrode as the counterelectrode. Ferrite was used as an auxiliary anode. The current density was 30 A/dm$^2$ at the current peak value, and the amount of electricity was 220 C/dm$^2$ as the sum of the amount of the electricity when the aluminum sheet was operating as an anode. 5% of the current flowing from the power source was branched to the auxiliary anode. This process was followed by a water rinse by spraying.

(e) Alkali Etching Treatment

The aluminum sheet was etched at 32° C. by spraying using an aqueous solution with 2.6 mass % sodium hydroxide and 6.5 mass % aluminum ion. 0.50 g/m$^2$ of the aluminum sheet was dissolved. This removed the smut component, which consisted mainly of aluminum hydroxide produced during the electrochemical surface roughening treatment with alternating current that was carried out in the preceding stage, and also dissolved the edge region of the produced pits and thereby smoothed these edge regions. This was followed by a water rinse by spraying.

(f) Desmutting

Desmutting was carried out by spraying with a 30° C. aqueous solution having a nitric acid concentration of 15 mass % (contained 4.5 mass % aluminum ion); this was followed by a water rinse by spraying. The aqueous nitric acid solution used for the desmutting treatment was the waste effluent from the step of electrochemical surface roughening using alternating current in an aqueous nitric acid solution.

(g) Electrochemical Surface Roughening

Continuous electrochemical surface roughening was carried out using 60 Hz alternating voltage. The electrolyte solution here was a 5.0 g/L aqueous hydrochloric acid solution (contained 5 g/L aluminum ion) and its temperature was 35° C. The electrochemical surface roughening was carried out using a trapezoidal square wave alternating current with a TP (time required for the current value to go from zero to the peak) of 0.8 msec and a duty ratio of 1:1 and using a carbon electrode as the counterelectrode. Ferrite was used for the auxiliary anode. A radial cell-type electrolytic cell was used. The current density was 25 A/dm$^2$ at the current peak value, and the amount of electricity was 50 C/dm$^2$ as the sum of the amount of the electricity when the aluminum sheet was operating as an anode. This process was followed by a water rinse by spraying.

(h) Anodic Oxidation

An anodic oxidation treatment was carried out using an anodic oxidation apparatus that employed a two-stage current feed electrolysis method (first and second electrolysis sections, length=6 m each; first and second current feed sections, length=3 m each; first and second current feed electrode sections, length=2.4 m each). The electrolyte bath supplied to the first and second electrolysis sections in each case had a sulfuric acid concentration of 50 g/L (contained 0.5 mass % aluminum ion) and a temperature of 20° C. This was followed by a water rinse by spraying. The final oxidation coating weight was 2.7 g/m$^2$.

The aluminum sheet on which all of the previously described steps (a) to (h) had been executed was used as the support. A center-line average roughness (reported as R$^a$ according to JIS B0601) of 0.52 μm was measured on this support using a stylus with a diameter of 2 μM.

[Formation of the Undercoat Layer]

The undercoat fluid 1 described below was coated on the previously described support using a bar coater to provide a dry coating weight of 2 mg/m$^2$; drying for 20 seconds at 80° C. then yielded the support.

| [Undercoat fluid 1] | |
|---|---|
| polymer (SP1) described below | 0.3 g |
| pure water | 60.0 g |
| methanol | 939.7 g |

[Undercoat fluid 1]

polymer (SP1)

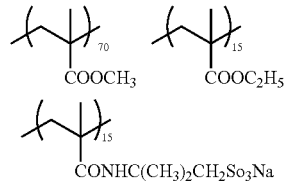

Mw = 20000

Formation of the Photosensitive Layer
<Photosensitive Layer 1>

Photosensitive layer 1 was formed by coating photosensitive layer coating fluid 1 (composition given below) on the support using a bar coater and then drying for 1 minute at 90° C. The dry coating weight for the photosensitive layer was 1.35 g/m².

| (Photosensitive layer coating fluid 1) | |
|---|---|
| polymerizable compound, PLEX6661-O (Degussa) | 1.18 mass parts |
| polymerizable monomer (indicated in Table 3 below, designation according to the previously provided examples) | 0.51 mass part |
| binder polymer PP-3 | 1.87 mass parts |
| sensitizing dye (D40) described below | 0.13 mass part |
| polymerization initiator described below (Kurogane Kasei Co., Ltd.) | 0.46 mass part |
| 25% MEK despersion of ε-phthalocyanine (F1) described below | 1.70 mass parts |
| mercapto-functional heterocyclic compound (SH-8) described below | 0.34 mass part |
| Megaface F-780F nonionic fluorosurfactant (Dainippon Ink and Chemicals, Incorporated) | 0.03 mass part |
| Cupferron AL (10% tricresyl phosphate solution, Wako Pure Chemical Industries, Ltd.) | 0.12 mass part |
| methyl ethyl ketone | 27.0 mass parts |
| propylene glycol monomethyl ether | 26.7 mass parts |
| Novoperm Yellow H2G (Clariant) | 0.20 mass part |

The binder polymer PP-3 used in the photosensitive layer coating fluid has a weight-average molecular weight of 90,000.

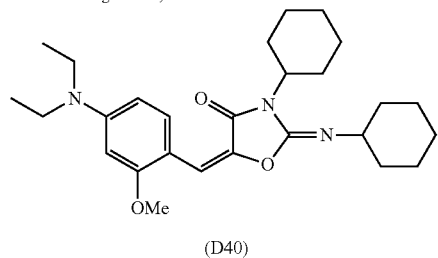

(D40)

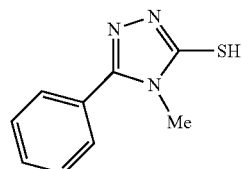

(SH-8)

(Photosensitive layer coating fluid 1)

[ε-phthalocyanine (F1)]

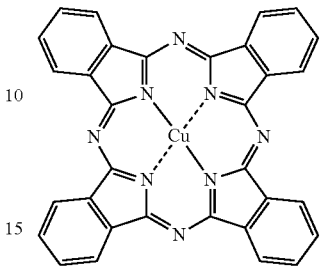

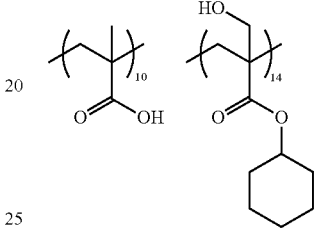

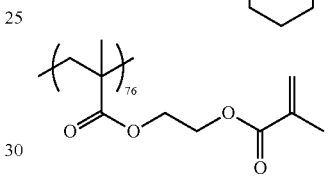

(PP-3)

(polymerization initiator)

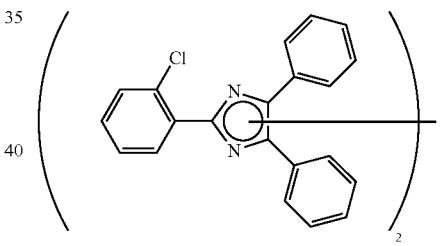

[Formation of the Protective Layer]

A protective layer coating fluid with the composition given below was coated using a bar coater on the photosensitive layer so as to provide a dry coating mass of 2.5 g/m² and was dried for 1 minute at 120° C. to form protective layer 1.

| (Protective layer coating fluid) | |
|---|---|
| Gohseran CKS-50 (from Nippon Synthetic Chemical Industry Co., Ltd., degree of saponification: 99 mol %, average degree of polymerization: 300, degree of modification: approximately 0.4 mol %) | 1.80 mass parts |
| polyvinylpyrrolidone | 0.40 mass part |
| EMALEX 710 (Nihon Emulsion Co., Ltd., nonionic surfactant) | 0.04 mass part |
| Paionin D230 (Takemoto Oil & Fat Co., Ltd., surfactant) | 0.05 mass part |
| Luviskol V64W (BASF) | 0.06 mass part |
| 13% aqueous solution of the polymer indicated below | 0.36 mass part |
| pure water | 36.0 mass parts |

(Protective layer coating fluid)

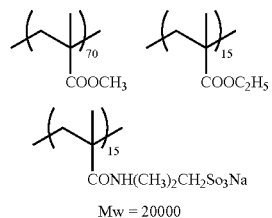

Mw = 20000

[Photoexposure, Development, and Printing]

Each of the previously described lithographic printing plate precursors was imagewise photoexposed using a Violet semiconductor laser Vx-9600 platesetter from FFEI (equipped with an InGaN-type semiconductor laser, 405 nm±10 nm emission wavelength/output 30 mW). Imaging was done at a plate surface photoexposure dose of 0.05 mJ/cm$^2$ using an FM screen (TAFFETA 20 from the Fujifilm Corporation) at a resolution of 2438 dpi.

Figure 2:
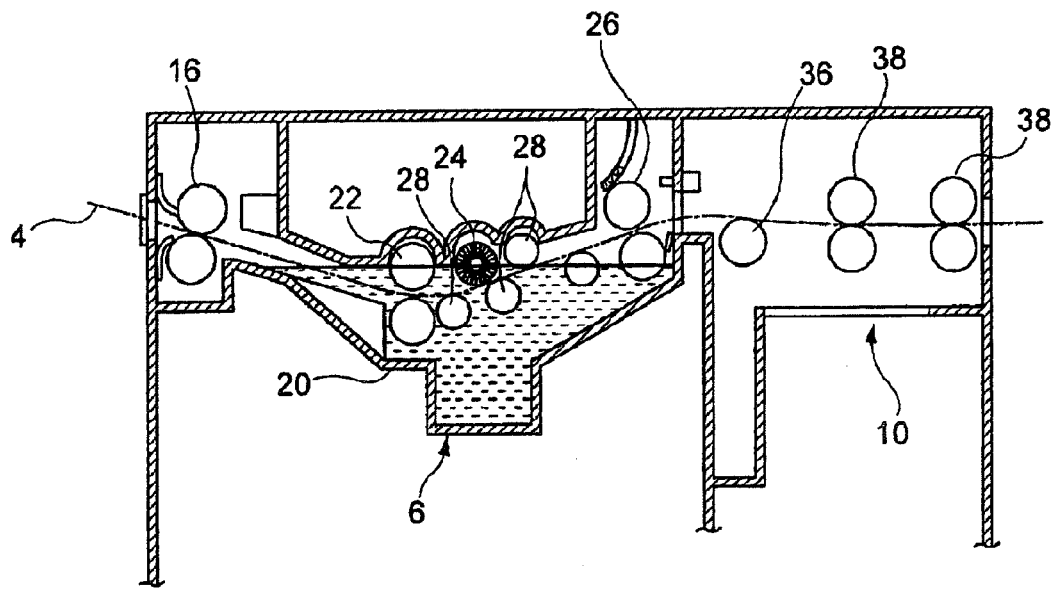
FIG. 2 is a drawing that shows the structure of an automatic developing processor for lithographic printing plates, wherein 4: lithographic printing plate precursor, 6: development section, 10: drying section, 16: transport roller, 20: development tank, 22: transport roller, 24: brush roller, 26: squeeze roller, 28: backup roller, 36: guide roller, 38: segmented roller.

Then, after preheating for 30 seconds at 100° C., development was carried out with the automatic developing apparatus with the structure shown in FIG. 2, using the treatment baths with the compositions shown below. This automatic developing apparatus had one brush roll, which had an outer diameter of 50 mm and was fitted with polybutylene terephthalate fibers (bristle diameter=200 μm, bristle length=17 mm) and was rotated at 200 rpm (peripheral velocity at the brush tip=0.52 m/sec) in the same direction as the transport direction. The temperature of the treatment bath was 30° C. The lithographic printing plate precursor was transported at a transport velocity of 100 cm/min. Development was followed by drying in the drying section. The drying temperature was 80° C. treatment bath 1 (pH 9.7)

| | |
|---|---|
| water | 8329.8 g |
| sodium carbonate | 130 g |
| sodium bicarbonate | 70 g |
| Newcol B13 | 500 g |
| gum arabic | 250 g |
| hydroxyalkylated starch (Penon JE66 from Nippon Starch Chemical Co., Ltd.) | 700 g |
| primary ammonium phosphate | 20 g |
| 2-bromo-2-nitropropane-1,3-diol | 0.1 g |
| 2-methyl-4-isothiazolin-3-one | 0.1 g |

Treatment bath 2 was prepared by adding a 1 M aqueous NaOH solution to treatment bath 1 to bring to a pH of 10.5. Treatment bath 3 was prepared by adding a 1 M aqueous H$_2$SO$_4$ solution to treatment bath 1 to bring to a pH of 8.7. Treatment bath 4 was prepared by adding a 1 M aqueous NaOH solution to treatment bath 1 to bring to a pH of 11.0. Treatment bath 5 was prepared by adding a 1 M aqueous H$_2$SO$_4$ solution to treatment bath 1 to bring to a pH of 8.3. Treatment bath 6 was prepared by adding a 1 M aqueous NaOH solution to treatment bath 1 to bring to a pH of 13.5. Treatment bath 7 was prepared by adding a 1 M aqueous H$_2$SO$_4$ solution to treatment bath 1 to bring to a pH of 5.5. Treatment bath 8 was prepared by adding 1 M H$_2$SO$_4$ to treatment bath 1 to bring to a pH of 4.8.

The resulting lithographic printing plate was mounted in a Heidelberg SOR-M press and printing was performed at a printing rate of 6000 impressions per hour using fountain solution (EU-3 (etching solution from Fujifilm Corporation)/water/isopropyl alcohol=1/89/10 (volumetric ratio)) and TRANS-G(N) black ink (Dainippon Ink and Chemicals, Incorporated).

Evaluations

The developability, processability, and printing durability were evaluated as described below using the individual lithographic printing plate precursors.

<Developability>

Printing was carried out using the lithographic printing plate and the conditions cited above. The unevenness in the tint image (unevenness in the ink density) due to scumming in the nonimage regions was evaluated on the 1000th impression. A score of O was rendered when there was no unevenness in the ink density in the tint image and a good-quality image was obtained; a score of Δ was rendered when there a slight unevenness in the ink density in the tint image, but the level thereof was still acceptable; and a score of x was rendered when there was unevenness in the ink density in the tint image.

<Processability>

500 m$^2$ of the particular lithographic printing plate precursor was developed over a 1 week period under the conditions described above, at which point the extent of production of scum adhering to the tank walls of the automatic developer was visually evaluated. The produced scum originated mainly with the binder in the protective layer. A score of O was rendered when no scum was produced; a score of Δ was rendered when scum was produced, but the level thereof was still acceptable; and a score of x was rendered when scum production was significant.

<Scumming Prevention>

Printing was carried out using the particular lithographic printing plate and the conditions described above, and scumming of the blanket in the nonimage areas was visually evaluated after 10,000 impressions. A score of O was rendered when blanket scumming was not present; a score of Δ was rendered when almost no blanket scumming was present; and a score of x was rendered when blanket scumming had occurred.

<Printing Durability>

The image in the photosensitive layer formed on the lithographic printing plate gradually undergoes wear and the ink receptivity declines as the number of impressions increases, and this is therefore accompanied by a decline in the ink density of the image on the printed material. The printing durability (immediately after production) was therefore scored based on the number of impressions until the ink density (density by reflection) fell by 0.1 from that at the start of printing. In addition, the lithographic printing plate was held for one week after its production in a 25° C./60% humidity environment, after which printing was carried out under the conditions described above and the printing durability (after one week) was evaluated in the same manner.

The results of the evaluations are shown in Table 3.

TABLE 3

|  | polymerizable monomer | developability | treatment bath | processability | scumming prevention | printing durability (10,000 impressions) immediately after production | after one week |
|---|---|---|---|---|---|---|---|
| Example 31 | 1-a | ○ | 1 | ○ | ○ | 5 | 5 |
| Example 32 | 1-a | ○ | 2 | ○ | ○ | 5 | 4 |
| Example 33 | 1-a | ○ | 3 | ○ | ○ | 5 | 5 |
| Example 34 | 1-a | ○ | 4 | ○ | ○ | 5 | 5 |
| Example 35 | 1-a | ○ | 5 | ○ | ○ | 5 | 4 |
| Example 36 | 1-a | ○ | 6 | ○ | ○ | 5 | 5 |
| Example 37 | 1-a | ○ | 7 | ○ | ○ | 5 | 5 |
| Example 38 | 2-b | ○ | 1 | ○ | ○ | 4.5 | 4 |
| Example 39 | 3-b | ○ | 1 | ○ | ○ | 5 | 5 |
| Example 40* | 1-a | ○ | 1 | ○ | ○ | 6 | 6 |
| Example 41** | 1-a | ○ | 1 | ○ | ○ | 6 | 6 |
| Comparative Example 5 | 1-a | ○ | 8 | Δ | Δ | 3 | 2 |
| Comparative Example 6 | x-1 | X | 1 | X | X | 3 | 3 |
| Comparative Example 7 | x-2 | ○ | 1 | ○ | ○ | 1 | 1 |

For the image recording layers on the lithographic printing plate precursors used in Comparative Examples 6 and 7, the composition of the previously described photosensitive layer employed, respectively, x-1 as a low molecular weight compound that had a sulfonamide group but lacked a polymerizable group and x-2 as a polymerizable monomer that had a polymerizable group but lacked a sulfonamide group.
*The previously described (B-10) was used as the binder polymer in Example 40.
**The previously described (B-11) was used as the binder polymer in Example 41.

As may be understood from the results in Table 3, the lithographic printing plate platemaking method of the present invention provides, due to its good developability, printed material free of screen tint variations and also provides a high processability free of scum generation in the development tank, an excellent scumming inhibition, and almost no decline in printing durability when the plate is allowed to stand after the development treatment.

Examples 42 to 48 and Comparative Examples 8 and 9

Lithographic Printing Plate Precursors and Gum Development

Lithographic printing plate precursors A to C were fabricated as follows.
(Preparation of a Water-Based Dispersion of a Silica-Containing Organic Resin Particulate)
(Production of a Water-Based Dispersion of Art Pearl J-7P)

With the goal of improving the dispersion stability, 77.0 weight parts of a mica dispersion (MEB 3L from Co-op Chemical Co., Ltd., solids fraction concentration: 3.4%) was combined and mixed with 3.0 weight parts of a nonionic surfactant (EMALEX 710 from Nihon Emulsion Co., Ltd.). To the resulting aqueous solution was added 20 weight parts of a crosslinked acrylic resin particulate/silica composite (Art Pearl J-7P from Negami Chemical Industrial Co., Ltd., average particle size: 6.6 μm); dispersion was carried out for 15 minutes at 10,000 rpm using an Ace Homogenizer from the Nissei Corporation to obtain a water-based Art Pearl J-7P dispersion 1.

When the Art Pearl J-7P was subjected to TEM observation and fluorescent x-ray analysis, silica was observed to be present at the surface. This water-based dispersion was used in the protective layer coating fluid described below.
<Production of Lithographic Printing Plate Precursor A>
(Production of Support 1)

The surface treatment shown below was carried out on JIS A 1050 aluminum sheet having a thickness of 0.30 mm and a width of 1030 mm.

(Surface Treatment)
The following treatments (a) to (f) were carried out in sequence for the surface treatment. The liquid was drained off with a nip roller after each treatment and water rinse.

(a) The aluminum sheet was etched at a temperature of 70° C., a sodium hydroxide concentration of 26 weight %, and an aluminum ion concentration of 6.5 weight %. 5 g/m$^2$ of the aluminum sheet was dissolved. This was followed by a water rinse.

(b) Desmutting was carried out by spraying with a 1 weight % aqueous nitric acid solution (contained 0.5 weight % aluminum ion) at a temperature of 30° C. This was followed by a water rinse.

(c) A continuous electrochemical surface roughening treatment was carried out using 60 Hz alternating-current voltage. The electrolytic solution here was a 1 weight % aqueous nitric acid solution (contained 0.5 weight % aluminum ion and 0.007 weight % ammonium ion) and the temperature was 30° C. The electrochemical surface roughening treatment was carried out using a carbon electrode for the counterelectrode and an alternating-current power source that provided a trapezoidal rectangular wave alternating current with a TP (time for the current value to go from zero to its peak) of 2 msec and a duty ratio of 1:1. Ferrite was used for the auxiliary anode. The current density was 25 A/dm$^2$ at the peak current value and the amount of electricity was 250 C/cm$^2$ as the sum of the amount of electricity when the aluminum sheet was functioning as an anode. 5% of the current flowing from the power source was branched to the auxiliary anode. This was followed by a water rinse.

(d) The aluminum sheet was etched by spraying at 35° C. using a sodium hydroxide concentration of 26 weight % and an aluminum ion concentration of 6.5 weight %. 0.2 g/m$^2$ of the aluminum sheet was dissolved. This removed the smut components (mainly aluminum hydroxide) produced during the alternating-current electrochemical roughening in the preceding step and also dissolved the edge regions of the produced pits to thereby smooth out the edge regions. This was followed by a water rinse.

(e) A desmutting treatment was carried out by spraying a 25 weight % aqueous sulfuric acid solution (contained 0.5 weight % aluminum ion) at 60° C. This was followed by a water rinse by spraying.

(f) An anodic oxidation treatment was carried out for 50 seconds using a sulfuric acid concentration of 170 g/L (contained 0.5 weight % aluminum ion), a temperature of 33° C., and a current density of 5 (A/dm²). This was followed by a water rinse. The anodic oxidation coating weight in this case was 2.7 g/m².

The surface roughness Ra (center-line average roughness) of the resulting aluminum support was 0.27 μm (measurement instrument: Surfcom from Tokyo Seimitsu Co., Ltd., stylus tip diameter=2 μm).

The aluminum support on which the preceding surface treatment had been executed was then coated with the intermediate layer coating fluid (1) described below so as to provide a dry coating weight of 10 mg/m² and drying was carried out.

| [Intermediate layer coating fluid (1)] | |
| --- | --- |
| compound (1) described below, Mw 100,000 | 0.017 mass part |
| methanol | 9.00 mass parts |
| water | 1.00 mass part |

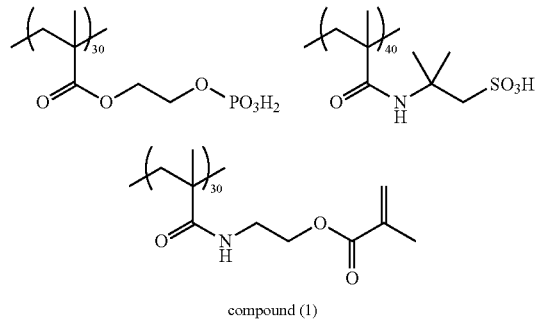

compound (1)

(Fabrication of the Lithographic Printing Plate Precursor)

The image recording layer (photosensitive layer) coating fluid (1) was bar coated on the support that had already been provided with the intermediate layer described above; this was followed by drying in an oven at 100° C. for 75 seconds to form an image recording layer (photosensitive layer) that exhibited a dry coating weight of 1.0 g/m². A protective layer coating fluid (1) having the composition described below was coated using a bar on the image recording layer so as to provide a dry coating weight of 0.5 g/m²; drying for 90 seconds at 100° C. in an oven then provided the lithographic printing plate precursor A.

The image recording layer (photosensitive layer) coating fluid (1) was prepared by mixing and stirring the photosensitive fluid (1) described below with the microcapsule fluid (1) described below at a mass ratio of 10:3 immediately before coating.

| (Photosensitive fluid (1)) | |
| --- | --- |
| binder polymer (1) described below (weight-average molecular weight: 80,000) | 0.162 mass part |
| polymerization initiator (1) described below | 0.100 mass part |
| infrared absorber (1) described below | 0.020 mass part |
| ethylenically unsaturated compound Aronix M315 (Toagosei Co., Ltd.) | 0.385 mass part |

| (Photosensitive fluid (1)) | |
| --- | --- |
| (triacrylate of the adduct of 3 moles ethylene oxide on isocyanuric acid) polymerizable monomer (indicated in Table 4 below, designation according to the previously provided examples) | 0.091 mass part |
| fluorosurfactant (1) described below | 0.044 mass part |
| Crystal Violet (Hodogaya Chemical Co., Ltd.) | 0.050 mass part |
| methyl ethyl ketone | 1.091 mass parts |
| 1-methoxy-2-propanol | 8.609 mass parts |

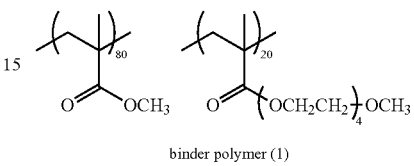

binder polymer (1)

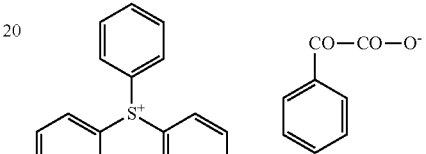

polymerization initiator (1)

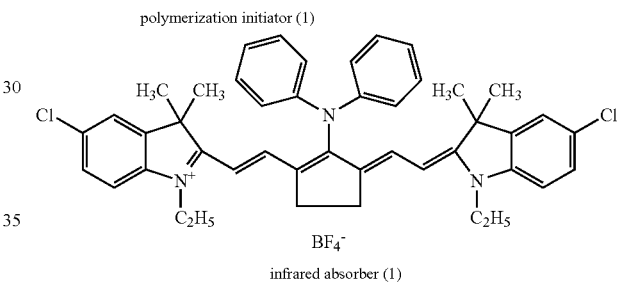

infrared absorber (1)

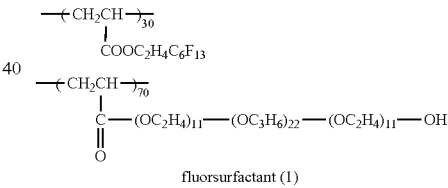

fluorsurfactant (1)

| (Microcapsule fluid (1)) | |
| --- | --- |
| microcapsule (1) synthesized as described below | 2.640 mass parts |
| water | 2.425 mass parts |

(Synthesis of Microcapsule (1))

An oil phase component was prepared by dissolving the following in 16.67 weight parts ethyl acetate: 10 weight parts trimethylolpropane/xylene diisocyanate adduct (Mitsui Takeda Chemicals, Inc., Takenate D-110N, 75% ethyl acetate solution), 6.00 weight parts Aronix M-215 (Toagosei Co., Ltd., bis(acryloyloxyethyl)isocyanurate and toluene mixture), and 0.12 weight part Paionin A-41C (Takemoto Oil & Fat Co., Ltd.). 37.5 weight parts of a 4 weight % aqueous solution of PVA-205 was prepared for the aqueous phase component. The oil phase component and aqueous phase component were mixed and were emulsified for 10 minutes at 12,000 rpm using a homogenizer. The resulting emulsion was added to 25 weight parts distilled water and stirring was performed for 30 minutes at room temperature and then for 2 hours at 40° C. The thusly obtained microcapsule fluid was diluted with distilled water to bring the solids fraction concentration to 15 weight %. The average particle size was 0.2 µm.

| (Protective layer coating fluid (1)) | |
|---|---|
| polyvinyl alcohol (6% aqueous solution) (CKS50, from Nippon Synthetic Chemical Industry Co., Ltd., degree of saponification: 98.5%, degree of polymerization: 300) | 2.24 mass parts |
| surfactant (EMALEX 710, from Nihon Emulsion Co., Ltd., 1% aqueous solution) | 2.15 mass parts |
| mica dispersion (3.4% aqueous dispersion) (Co-op Chemical Co., Ltd., flake synthetic mica (Somashif MEB3L)) | 3.75 mass parts |
| the previously described water-based Art Pearl J-7P dispersion 1 | 0.20 mass part |
| distilled water | 10.60 mass parts |

<Production of Lithographic Printing Plate Precursor B>
(Production of Support 2)
(Surface Treatment)

The following treatments (a) to (k) were carried out in sequence for the surface treatment. The liquid was drained off with a nip roller after each treatment and water rinse.

(a) Mechanical Surface Roughening Treatment

Figure 3:
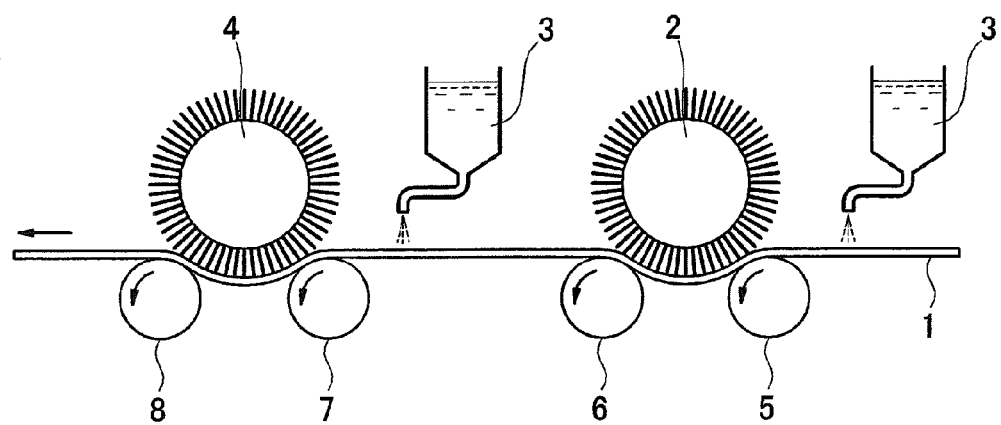
FIG. 3 is a schematic structural drawing that shows an example of a mechanical surface roughening apparatus used in the fabrication of a hydrophilic support used for a lithographic printing plate precursor, wherein 1: aluminum sheet, 2, 4: roller-shaped brush, 3: abrasive slurry fluid, 5, 6, 7, 8: support roller.

Using an apparatus as shown in FIG. 3, a mechanical surface roughening was carried out using rotating, roller-shaped nylon brushes; this was carried out while feeding a suspension of an abrasive (pumice) with a specific gravity of 1.12 and water as an abrasive slurry fluid to the surface of the aluminum sheet. In FIG. 3, 1 refers to an aluminum sheet; 2 and 4 refer to roller-shaped brushes; 3 refers to an abrasive slurry fluid; and 5, 6, 7, and 8 refer to support rollers. The average particle size of the abrasive was 30 µm and the maximum particle size was 100 µm. The nylon brushes were nylon 6-10; the bristle length was 45 mm; and the bristle diameter was 0.3 mm. The bristles in a nylon brush were densely implanted in holes in a 300 mmφ stainless steel cylinder. Three rotating brushes were used. The gap between the two support rollers (200 mmφ) underneath a brush was 300 mm. The brush rollers were pressed down until the load on the drive motor rotating the brush reached +7 kW with respect to the load prior to the application of the brush roller to the aluminum sheet. The direction of brush rotation was the same as the transport direction of the aluminum sheet. The brushes were rotated at 200 rpm.

(b) Alkali Etching Treatment

The aluminum sheet obtained as described above was etched by spraying using a 70° C. aqueous solution having a 2.6 weight % sodium hydroxide concentration and a 6.5 weight % aluminum ion concentration. 10 g/m² of the aluminum sheet was dissolved. This was followed by a water rinse by spraying.

(c) Desmutting

Desmutting was carried out by spraying with a 1 weight % aqueous nitric acid solution (contained 0.5 weight % aluminum ion) at 30° C.; this was followed by a water rinse by spraying. The aqueous nitric acid solution used for desmutting was the waste effluent from the electrochemical surface roughening treatment that used alternating current in an aqueous nitric acid solution.

(d) Electrochemical Surface Roughening Treatment

A continuous electrochemical surface roughening treatment was carried out using 60 Hz alternating voltage. The electrolyte solution was a 10.5 g/L aqueous nitric acid solution (contained 5 g/L aluminum ion and 0.007 weight % ammonium ion), and the bath temperature was 50° C. The electrochemical surface roughening treatment was performed with an alternating current power source waveform using a trapezoidal square wave alternating current with a TP (time required for the current value to go from zero to the peak) of 0.8 msec and a duty ratio of 1:1 and using a carbon electrode as the counterelectrode. Ferrite was used for the auxiliary anode.

The current density was 30 A/dm² at the current peak value, and the amount of electricity was 220 C/dm² as the sum of the amount of the electricity when the aluminum sheet was operating as an anode. 5% of the current flowing from the power source was branched to the auxiliary anode. This was followed by a water rinse by spraying.

(e) Alkali Etching Treatment

Etching was carried out at 32° C. by spraying the aluminum sheet with an aqueous solution that had a 26 mass % sodium hydroxide concentration and a 6.5 mass % aluminum ion concentration. 0.50 g/m² of the aluminum sheet was dissolved. This removed the smut component, which consisted mainly of aluminum hydroxide produced during the electrochemical surface roughening with alternating current that was carried out in the preceding stage, and also dissolved the edge region of the produced pits and thereby smoothed these edge regions. This was followed by a water rinse by spraying.

(f) Desmutting

Desmutting was carried out by spraying with a 30° C. aqueous solution that had a nitric acid concentration of 15 mass % (contained 4.5 mass % aluminum ion); this was followed by a water rinse by spraying. The aqueous nitric acid solution used for desmutting was the waste effluent from the electrochemical surface roughening treatment that used alternating current in an aqueous nitric acid solution.

(g) Electrochemical Surface Roughening Treatment

A continuous electrochemical surface roughening treatment was carried out using 60 Hz alternating voltage. The electrolyte solution was a 5.0 g/L aqueous hydrochloric acid solution (contained 5 g/L aluminum ion), and the temperature was 35° C. The electrochemical surface roughening treatment was performed using a trapezoidal square wave alternating current with a TP (time required for the current value to go from zero to the peak) of 0.8 msec and a duty ratio of 1:1 for the waveform from the alternating current power source and using a carbon electrode as the counterelectrode. Ferrite was used for the auxiliary anode.

The current density was 25 A/dm² at the current peak value, and the amount of electricity was 50 C/dm² as the sum of the amount of the electricity when the aluminum sheet was operating as an anode. This was followed by a water rinse by spraying.

(h) Alkali Etching Treatment

Etching was carried out at 32° C. by spraying the aluminum sheet with an aqueous solution that had a 26 weight % sodium hydroxide concentration and a 6.5 weight % aluminum ion concentration. 0.10 g/m² of the aluminum sheet was dissolved. This removed the smut component, which consisted mainly of aluminum hydroxide produced during the electrochemical surface roughening with alternating current that was carried out in the preceding stage, and also dissolved the edge region of the produced pits and thereby smoothed these edge regions. This was followed by a water rinse by spraying.

(i) Desmutting

Desmutting was carried out by spraying with a 60° C. aqueous solution that had a sulfuric acid concentration of 25 weight % (contained 0.5 weight % aluminum ion); this was followed by a water rinse by spraying.

(j) Anodic Oxidation Treatment

An anodic oxidation treatment was carried out using an anodic oxidation apparatus (first and second electrolysis sections, length=6 m each; first and second current feed sections, length=3 m each; first and second current feed sections, length=2.4 m each). Sulfuric acid was used for the electrolyte bath supplied to the first and second electrolysis sections. In both cases the electrolyte bath had a sulfuric acid concentration of 50 g/L (contained 0.5 weight % aluminum ion) and a temperature of 20° C. This was followed by a water rinse by spraying.

(k) Treatment with Alkali Metal Silicate

The aluminum support yielded by the anodic oxidation treatment was treated with alkali metal silicate (silicate treatment) by immersion for 10 seconds in a treatment tank that contained a 1 weight % aqueous solution of #3 sodium silicate at 30° C. This was followed by a water rinse by spraying using well water to obtain a support on which a surface silicate hydrophilicizing treatment had been executed.

(Intermediate Layer Formation)

The support obtained as described above was then coated with the previously described intermediate layer coating fluid (1) so as to provide a dry coating weight of 10 mg/m$^2$ and drying was performed.

(Photosensitive Layer Formation)

The photosensitive layer coating fluid B described below was prepared and coated using a wire bar on the intermediate layer formed as described above. Drying was performed for 34 seconds at 125° C. using a convection dryer. The coating weight after drying was 1.4 g/m$^2$.

| (Photosensitive layer coating fluid B) | |
|---|---|
| infrared absorber (IR-1) | 0.038 mass part |
| polymerization initiator A (S-1) | 0.061 mass part |
| polymerization initiator B (I-1) | 0.094 mass part |
| mercapto compound (E-1) | 0.015 mass part |
| ethylenically unsaturated compound (M-1) (trade name: A-BPE-4, from Shin-Nakamura Chemical Co., Ltd.) | 0.298 mass part |
| polymerizable monomer (indicated in Table 4 below, designation according to the previously provided examples) | 0.127 mass part |
| binder polymer A (BP-A) | 0.311 mass part |
| binder polymer B (BP-B) | 0.250 mass part |
| binder polymer C (BP-C) | 0.062 mass part |
| additive (T-1) | 0.079 mass part |
| polymerization inhibitor (Q-1) | 0.0012 mass part |
| Ethyl Violet (EV-1) | 0.021 mass part |
| fluorosurfactant (Megaface F-780-F, from Dainippon Ink and Chemicals, Incorporated, 30 weight % methyl isobutyl ketone (MIBK) solution) | 0.0081 mass part |
| methyl ethyl ketone | 5.886 mass parts |
| methanol | 2.733 mass parts |
| 1-methoxy-2-propanol | 5.886 mass parts |

The structures of the infrared absorber (IR-1), polymerization initiator A (S-1), polymerization initiator B (1-1), mercapto compound (E-1), polymerizable compound (M-1), binder polymer A (BP-A), binder polymer B (BP-B), binder polymer C (BP-C), additive (T-1), polymerization initiator (Q-1), and Ethyl Violet (EV-1) used in the photosensitive layer coating fluid B are shown below.

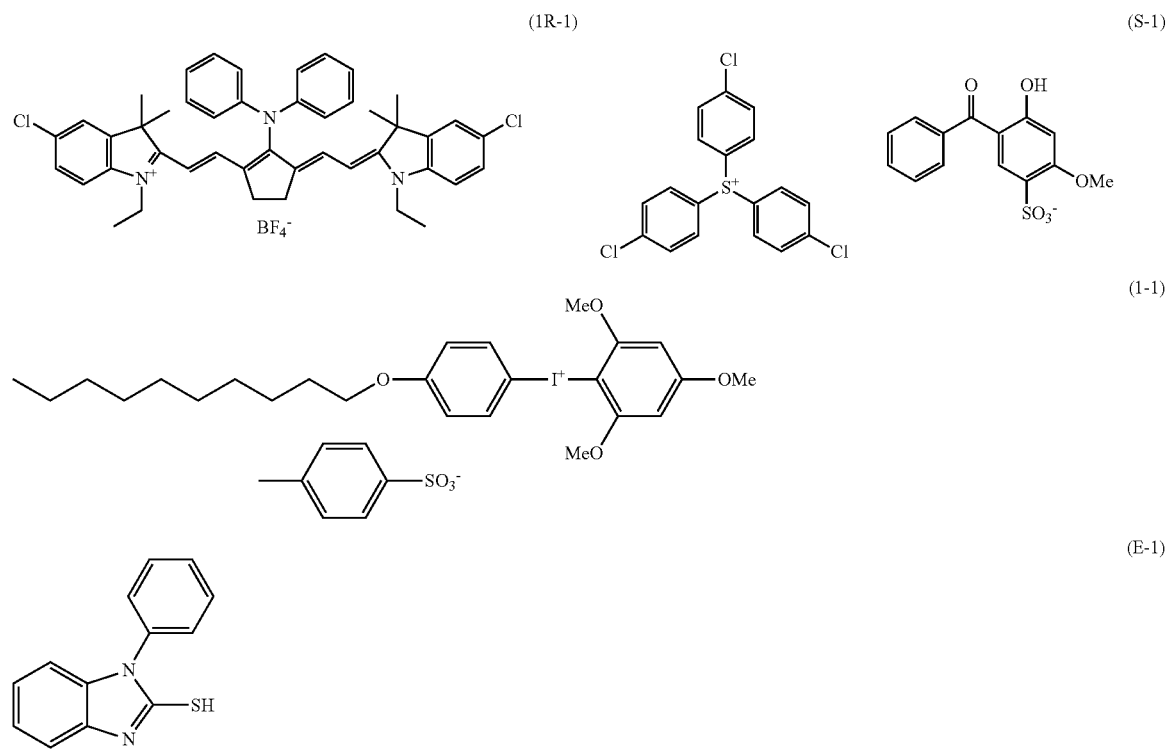

-continued
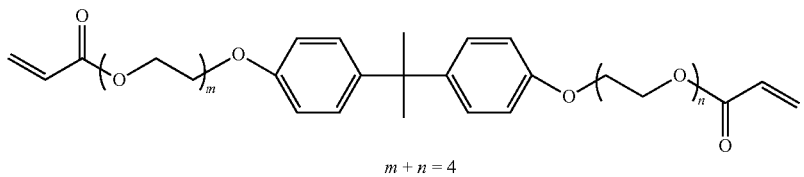
(M-1)
m + n = 4
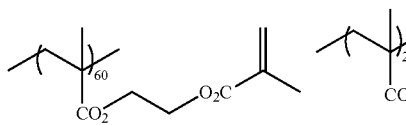 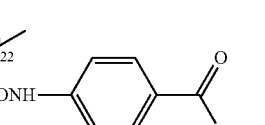 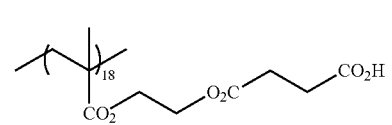
(BP-A)
Mw = 100000
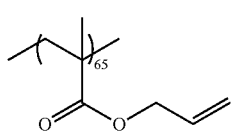 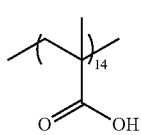 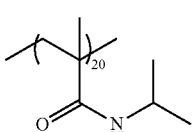
(BP-B)
Mw = 100000
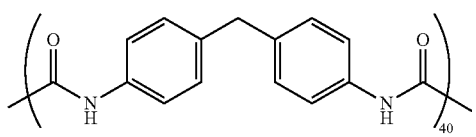 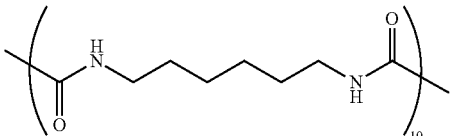
(BP-C)
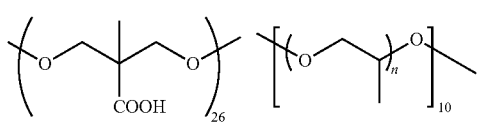 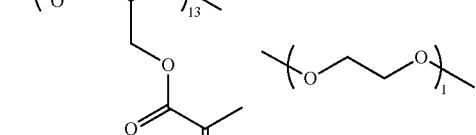
Mw = 1000
(average value of n:17)
Mw = 100000
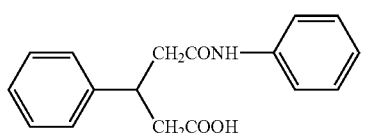
(T-1)
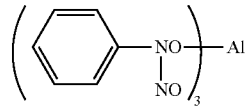
(Q-1)
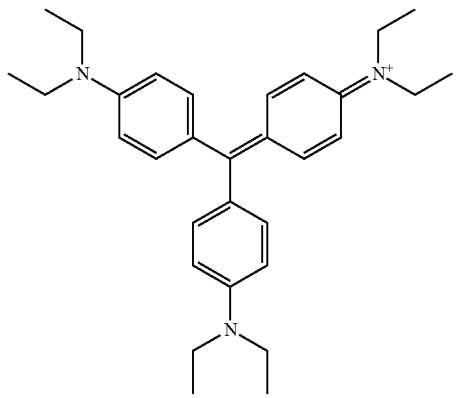
(EV-1)
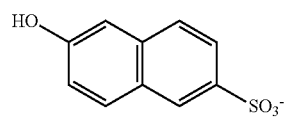

<Lower Protective Layer Formation>

A mixed aqueous solution (the coating fluid for lower protective layer formation) of synthetic mica (Somashif MEB-3L, 3.2% aqueous dispersion, from Co-op Chemical Co., Ltd.), polyvinyl alcohol (Gohseran CKS-50, degree of saponification=99 mol %, degree of polymerization=300, sulfonic acid-modified polyvinyl alcohol, from Nippon Synthetic Chemical Industry Co., Ltd.), surfactant A (EMALEX 710 from Nihon Emulsion Co., Ltd.), and surfactant B (Adeka Pluronic P-84 from the Adeka Corporation) was coated with a wire bar on the photosensitive layer that had been formed. This was followed by drying for 30 seconds at 125° C. in a convection dryer.

The proportions in this mixed aqueous solution (the coating fluid for lower protective layer formation) were synthetic mica (solids fraction)/polyvinyl alcohol/surfactant A/surfactant B=7.5/89/2/1.5 (weight %), and the coating weight (post-drying coating weight) was 0.5 g/m².

<Upper Protective Layer Formation>

A mixed aqueous solution (the coating fluid for upper protective layer formation) of organic filler (Art Pearl J-7P, from Negami Chemical Industrial Co., Ltd.), synthetic mica (Somashif MEB-3L, 3.2% aqueous dispersion, from Co-op Chemical Co., Ltd.), polyvinyl alcohol (L-3266, degree of saponification=87 mol %, degree of polymerization=300, sulfonic acid-modified polyvinyl alcohol, from Nippon Synthetic Chemical Industry Co., Ltd.), thickener (Celogen FS-B from Dai-ichi Kogyo Seiyaku Co., Ltd.), and surfactant (EMALEX 710 from Nihon Emulsion Co., Ltd.) was coated with a wire bar on the lower protective layer. This was followed by drying for 30 seconds at 125° C. in a convection dryer.

The proportions in this mixed aqueous solution (the coating fluid for upper protective layer formation) were organic filler/synthetic mica (solids fraction)/polyvinyl alcohol/thickener/surfactant=3.2/2.0/80.5/11.5/2.8 (weight %), and the coating weight (post-drying coating weight) was 1.76 g/m².

<Production of Lithographic Printing Plate Precursor C>

The intermediate layer described below was disposed on a support 1 as described above for the lithographic printing plate precursor A.

(Intermediate Layer Formation)

The intermediate layer fluid described below was first coated using a bar coater on aluminum sheet on which the previously described electrolytic surface roughening treatment had been executed; this was followed by drying for 20 seconds at 80° C. The intermediate layer coating weight after drying was 25 mg/m².

| (Intermediate layer coating fluid) | |
|---|---|
| sol as described below | 100 g |
| methanol | 900 g |
| (Sol) | |
| Phosmer PE (Uni-Chemical Co., Ltd.) | 5 mass parts |
| methanol | 45 mass parts |
| water | 10 mass parts |
| 85 mass % phosphoric acid | 5 mass parts |
| tetraethoxysilane | 20 mass parts |
| 3-methacryloxypropyltrimethoxysilane | 15 mass parts |

(Formation of the Image Recording Layer)

The composition P-1 described below was coated, so as to provide a dry coating weight of 1.4 g/m², on the previously described intermediate layer that had been formed on the support and was dried for 1 minute at 100° C. to form the image recording layer.

| (Composition P-1) | |
|---|---|
| polymerizable compound that contains the urethane bond and a plurality of ethylenically unsaturated bonds (AM-1) | 2.9 mass parts |
| polymerizable monomer (indicated in Table 4 below, designation according to the previously provided examples) | 1.3 mass parts |
| polyurethane binder (BT-1), Mw 100,000 | 3.6 mass parts |
| infrared absorber (IR-1) | 0.31 mass part |
| onium salt (OS-12) | 1.2 mass parts |
| ε-phthalocyanine dispersion | 0.92 mass part |
| Megaface F780 nonionic fluorosurfactant (from Dainippon Ink and Chemicals, Inc.) | 0.05 mass part |
| methyl ethyl ketone | 62 mass parts |
| propylene glycol monomethyl ether acetate | 57 mass parts |

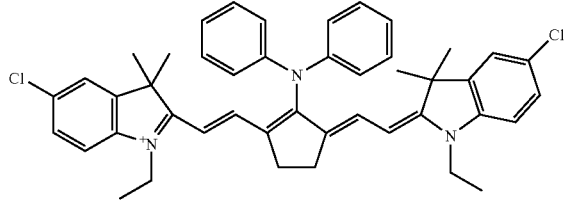

(IR-1)

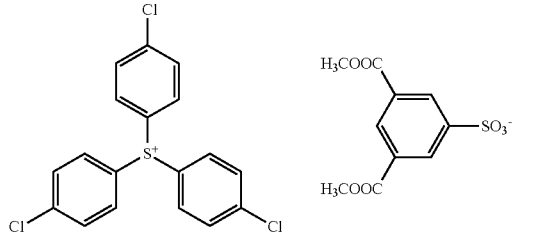

(OS-12)

Mw = 1000
(average value of n: 17)

(BT-1)

-continued (Composition P-1)

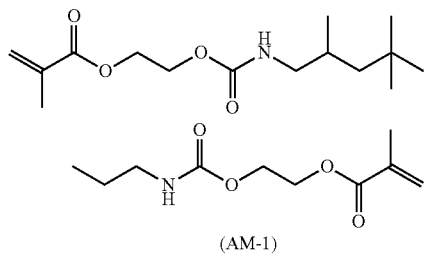

(AM-1)

(Protective Layer Formation)

A mixed aqueous solution of polyvinyl alcohol (degree of saponification: 98 mol %, degree of polymerization: 500) and polyvinylpyrrolidone (Luviskol K-30 from BASF) was coated using a wire bar on the surface of the image recording layer described above. The protective layer was then formed by drying for 75 seconds at 125° C. in a convection dryer, which yielded the lithographic printing plate precursor (negative-working lithographic printing plate precursor). The polyvinyl alcohol/polyvinylpyrrolidone content ratio was 4/1 (weight ratio), and the coating weight (post-drying coating weight) was 2.45 g/m².

(Backcoat Layer Formation)

A backcoat layer as described in Example 1 of Japanese Patent Application Publication No. Hei 6-35174 was disposed on the surface opposite from the side of lithographic printing plate precursors A and B on which the photosensitive layer and protective layer were disposed.

Platemaking and Evaluation

<Platemaking-1: Lithographic Printing Plate Precursors A and B>

The obtained lithographic printing plate precursors A and B were subjected to photoexposure, development, and drying in the given sequence.

Imagewise photoexposure was performed using an infrared semiconductor laser for the photoexposure light source (setter) (Trendsetter 3244VX (Creo), equipped with a water-cooled 40 W infrared semiconductor laser); photoexposure was carried out at an output of 9 W, an external drum rotation rate of 210 rpm, and a resolution of 2400 dpi.

Figure 4:
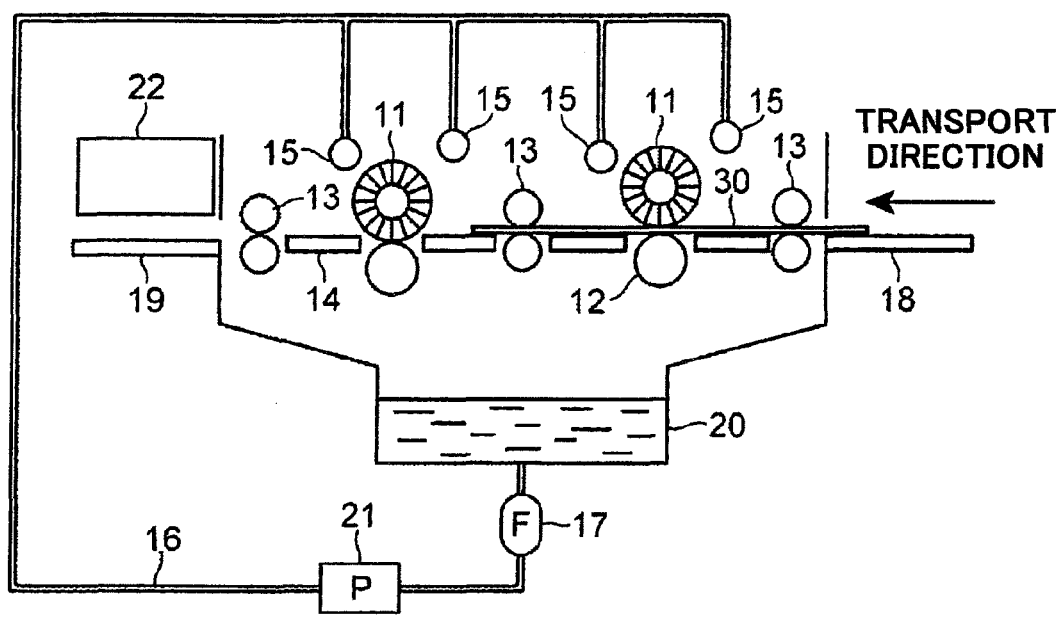
FIG. 4 is a schematic drawing that shows the structure of an example of a development processing apparatus, wherein 11: rotating brush roller, 12: backing roll, 13: transport roll, 14: transport guide plate, 15: spray pipe.

Following photoexposure, development was performed within 30 seconds without carrying out a heat treatment or a water rinse, and was performed using the development bath described below (treatment bath No. 1) with the composition described below and using an automatic developing apparatus with the structure shown in FIG. 4. This automatic developing apparatus had two rotating brush rolls: the first brush roll was a brush roll that had an outer diameter of 50 mm and was implanted with polybutylene terephthalate fibers (bristle diameter=200 μm, bristle length=17 mm) and was rotated at 200 rpm (peripheral velocity at the brush tip=0.52 m/sec) in the same direction as the transport direction; the second brush roll was a brush roll that had an outer diameter of 50 mm and was implanted with polybutylene terephthalate fibers (bristle diameter=200 μm, bristle length=17 mm) and was rotated at 200 rpm (peripheral velocity at the brush tip=0.52 m/sec) in the direction opposite from the transport direction. The lithographic printing plate precursor was transported at a transport velocity of 100 cm/min.

The development bath was fed to the plate surface by a circulation pump as a shower from a spray pipe.

The development bath tank capacity was 10 liters.

| treatment bath 1 (pH 9.7) | |
|---|---|
| water | 8329.8 |
| sodium carbonate | 130 |
| sodium bicarbonate | 70 |
| Newcol B13 | 500 |
| gum arabic | 250 |
| hydroxyalkylated starch (Penon JE66 from Nippon Starch Chemical Co., Ltd.) | 700 |
| primary ammonium phosphate | 20 |
| 2-bromo-2-nitropropane-1,3-diol | 0.1 |
| 2-methyl-4.isothiazolin-3-one | 0.1 |

<Platemaking-2: Lithographic Printing Plate Precursor C>

The obtained lithographic printing plate precursor C was subjected to photoexposure, preheating, development, and drying in the given sequence.

Photoexposure was performed by the same method as in Platemaking-1.

Then, within 30 seconds, preheating was performed for 30 seconds at 100° C. This was followed by development using the development bath with the composition described above (treatment bath No. 1) and the automatic developing apparatus with the structure shown in FIG. 4. This was followed within 30 seconds by development in the automatic developing apparatus in each case using the development bath with the previously described composition (treatment bath No. 1). The automatic developing apparatus was run using the same method as for Platemaking-1.

The obtained lithographic printing plate was mounted in an SOR-M press (Heidelberg); fountain solution and ink were supplied using a fountain solution of Ecolity-2 from the Fujifilm Corporation/tap water=2/98 (volume ratio) and Best Cure UV-BF-WRO standard black ink (T&K TOKA Company); and printing was then performed at a printing speed of 6000 impressions per hour.

[Evaluation]

The developability, processability, and printing durability were evaluated as follows on the obtained lithographic printing plate precursors.

<Developability>

Printing was performed as described above using each lithographic printing plate, and at the 1,000th printed sheet the variation in the screen tint image (ink density variation) due to scumming of the nonimage area was evaluated. The evaluation was carried out as follows: an x was assigned in the case of ink density variation in the screen tint image; a Δ was assigned when a slight ink density variation in the screen tint image occurred, but was at an acceptable level; and a O was assigned when no variation occurred in the ink density in the screen tint image and an excellent image was obtained.

<Processability>

500 m² of each of the lithographic printing plate precursors was developed as described above over 1 week, at which point the extent of production of scum adhering to the tank walls of the automatic developing apparatus was visually inspected. The produced scum originates mainly with the binder in the protective layer. The evaluation was performed as follows: a O was assigned when no scum production occurred; a Δ was assigned when scum production did occur, but at an acceptable level; and an x was assigned when significant scum production had occurred.

<Scumming Inhibition>

Printing was performed as described above with each of the lithographic printing plates, and blanket scumming in the nonimage areas was visually evaluated after 10,000 impressions had been printed. The scumming inhibition was evaluated on a three level scale using O, Δ, and x starting from the lowest degree of blanket scumming: O: no scumming occurred; Δ: almost no scumming occurred; and x: scumming was present.

<Printing Durability>

As the number of printed sheets increases, the photosensitive layer image formed on the lithographic printing plate is gradually worn off and the ink receptivity declines; this is accompanied as a consequence by a decline in the ink density of the image on the printed paper.

The printing durability was therefore evaluated as the number of printed sheets at which the ink density (reflection density) had declined 0.1 from that at the start of printing.

The printing durability was evaluated after photoexposure and development. In addition, the lithographic printing plate was held for 1 week at room temperature after its production and printing was then performed under the conditions indicated above and the printing durability (after 1 week) was evaluated as described above.

The results are given in Table 4.

voltage. The electrolyte solution here was a 1 mass % aqueous nitric acid solution (contained 0.5 mass % aluminum ion) and the bath temperature was 50° C. The electrochemical surface roughening treatment was performed with an alternating current power source waveform using a trapezoidal square wave alternating current with a TP (time required for the current value to go from zero to the peak) of 0.8 msec and a duty ratio of 1:1 and using a carbon electrode as the counterelectrode. Ferrite was used for the auxiliary anode. The current density was 30 A/dm$^2$ at the peak current value, and 5% of the current flowing from the power source was branched to the auxiliary anode.

The amount of electricity in the nitric acid electrolysis was 175 C/dm$^2$ for the time in which the aluminum sheet was an anode.

This was followed by a water rinse by spraying.

An electrochemical surface roughening treatment was then performed by the same method as for the nitric acid hydrolysis using a 0.5 mass % aqueous hydrochloric acid solution (contained 0.5 mass % aluminum ion) for the electrolysis bath

TABLE 4

| | lithographic printing plate precursor | polymerizable monomer | developability | processability | scumming inhibition | printing durability (10,000 impressions) | |
|---|---|---|---|---|---|---|---|
| | | | | | | immediately after production | after one week |
| Example 42 | A | 1-a | O | O | O | 5 | 5 |
| Example 43 | B | 1-a | O | O | O | 5 | 4 |
| Example 44 | C | 1-a | O | O | O | 5 | 5 |
| Example 45 | B | 2-b | O | O | O | 5 | 4 |
| Example 46 | B | 3-a | O | O | O | 5 | 4 |
| Example 47* | A | 1-a | O | O | O | 6 | 6 |
| Example 48** | A | 1-a | O | O | O | 6 | 6 |
| Comparative Example 8 | B | x-1 | X | X | Δ | 2 | 2 |
| Comparative Example 9 | B | x-2 | O | O | O | not more than 0.1 | not more than 0.1 |

For the image recording layers on the lithographic printing plate precursors used in Comparative Examples 8 and 9, the composition of the previously described photosensitive layer employed, respectively, x-1 as a low molecular weight compound that had a sulfonamide group but lacked a polymerizable group and x-2 as a polymerizable monomer that had a polymerizable group but lacked a sulfonamide group.
*The previously described (B-10) was used as the binder polymer in Example 47.
**The previously described (B-17) was used as the binder polymer in Example 48.

Examples 49 to 54 and Comparative Examples 10 and 11

Lithographic Printing Plate Precursors and Alkaline Development

Production of the Lithographic Printing Plate Precursors
[Preparation of the Support]

A degreasing treatment was performed for 30 seconds at 50° C. using a 10 mass % aqueous sodium aluminate solution in order to remove the rolling oil on the surface of 0.3 mm-thick aluminum sheet (material: 1050). The aluminum surface was then grained using three nylon brushes implanted with bristles having a diameter of 0.3 mm and using a water-based suspension (specific gravity of 1.1 g/cm$^3$) of pumice having a median diameter of 30 μm; the brush rotation rate was 250 rpm. This was followed by a thorough water rinse. The resulting sheet was etched by immersion for 9 seconds in a 25% aqueous sodium hydroxide solution at 45° C.; then rinsed with water; then immersed for 20 seconds in 20% nitric acid at 60° C.; and then rinsed with water. The amount of etching of the grained surface was approximately 3 g/m$^2$.

A continuous electrochemical surface roughening treatment was subsequently carried out using 60 Hz alternating and using a bath temperature of 50° C. and a quantity of electricity for the time in which the aluminum sheet was an anode of 50 C/dm$^2$. This was followed by a water rinse by spraying.

A 2.5 g/m$^2$ direct current anodic oxidation coating was then disposed on this sheet using 15% sulfuric (contained 0.5 mass % aluminum ion) for the electrolysis bath and using a current density of 15 A/dm$^2$. This was followed by a water rinse and drying to provide support A. The center-line average roughness (Ra) for this substrate was 0.51 μm when measured using a stylus with a diameter of 2 μm.

<Intermediate Layer>

The undercoat layer coating fluid described below was then coated with a wire bar on the surface of this aluminum support and drying was performed for 10 seconds at 100° C. The coating weight was 10 mg/m$^2$.

| Undercoat layer coating fluid | |
|---|---|
| polymer compound (U-1) | 0.05 g |
| methanol | 27 g |
| ion-exchanged water | 3 g |

Undercoat layer coating fluid

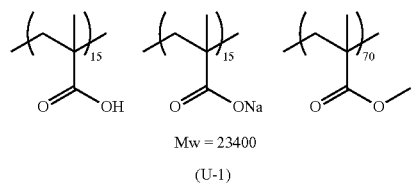

Mw = 23400

(U-1)

[Application of the Photosensitive Layer]

A photosensitive layer coating fluid with the composition given below was prepared and was coated on the preceding using a wire bar so as to provide a coating weight after drying of 0.9 g/m². The photosensitive layer was then formed by drying for 34 seconds at 115° C. in a convection dryer.

| (Photosensitive layer coating fluid) | |
|---|---|
| infrared absorber (IR-1) | 0.038 g |
| polymerization initiator A (S-1) | 0.061 g |
| polymerization initiator B (I-1) | 0.094 g |
| mercapto compound (SH-1) | 0.015 g |
| auxiliary sensitizer (T-1) | 0.081 g |
| polymerizable monomer (indicated in Table 5 below, designation according to the previously provided examples) | 0.107 g |
| addition-polymerizable compound (M-1) | 0.321 g |
| binder polymer A (BP-A) | 0.311 g |
| binder polymer B (BP-B) | 0.250 g |
| binder polymer C (BP-C) | 0.062 g |
| polymerization inhibitor (Q-1) | 0.0012 g |
| copper phthalocyanine pigment dispersion | 0.159 g |
| fluorosurfactant (Megaface F-780-F, from Dainippon Ink and Chemicals, Incorporated, 30 mass % methyl isobutyl ketone (MIBK) solution) | 0.081 g |
| methyl ethyl ketone | 5.886 g |
| methanol | 2.733 g |
| 1-methoxy-2-propanol | 5.886 g |

IR-1

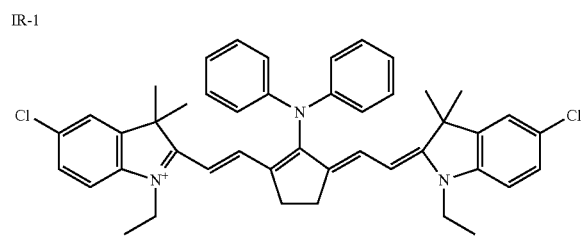

S-1

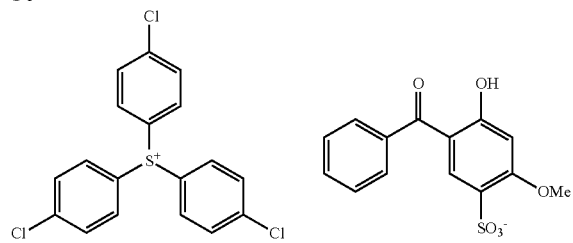

(Photosensitive layer coating fluid)

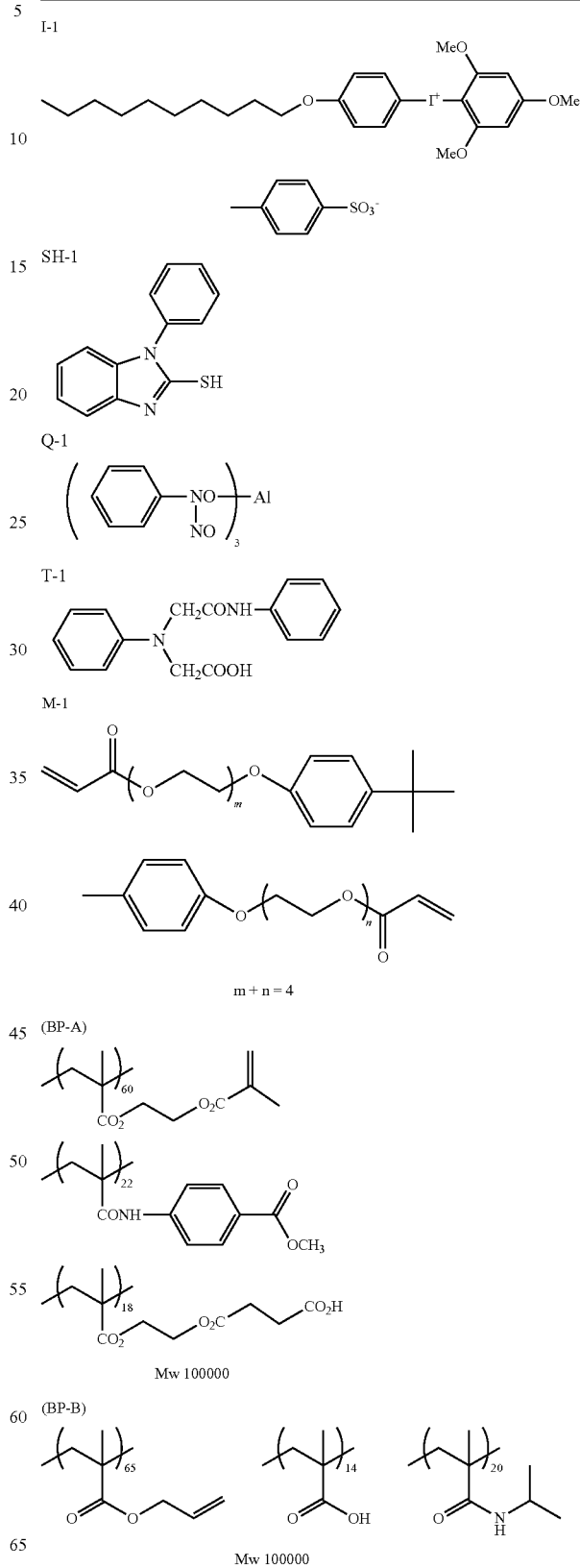

-continued (Photosensitive layer coating fluid)

(BP-C)

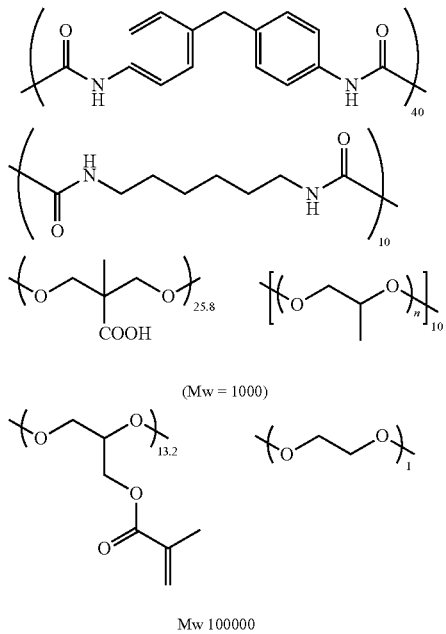

(Mw = 1000)

Mw 100000

[Application of the Protective Layer]
<The Lower Protective Layer>

A mixed aqueous solution (the coating fluid for protective layer formation) of synthetic mica (Somashif MEB-3L, 3.2% aqueous dispersion, from Co-op Chemical Co., Ltd.), polyvinyl alcohol (Gohseran CKS-50, degree of saponification=99 mol %, degree of polymerization=300, sulfonic acid-modified polyvinyl alcohol, from Nippon Synthetic Chemical Industry Co., Ltd.), surfactant A (EMALEX 710 from Nihon Emulsion Co., Ltd.), and surfactant B (Adeka Pluronic P-84 from the Adeka Corporation) was coated with a wire bar on the surface of the photosensitive layer. This was followed by drying for 30 seconds at 125° C. in a convection dryer.

The proportions in this mixed aqueous solution (the coating fluid for protective layer formation) were synthetic mica (solids fraction)/polyvinyl alcohol/surfactant A/surfactant B=7.5/89/2/1.5 (mass %), and the coating weight (post-drying coating weight) was 0.5 g/m².

<The Upper Protective Layer>

A mixed aqueous solution (the coating fluid for protective layer formation) of organic filler (Art Pearl J-7P, from Negami Chemical Industrial Co., Ltd.), synthetic mica (Somashif MEB-3L, 3.2% aqueous dispersion, from Co-op Chemical Co., Ltd.), polyvinyl alcohol (L-3266, degree of saponification=87 mol %, degree of polymerization=300, sulfonic acid-modified polyvinyl alcohol, from Nippon Synthetic Chemical Industry Co., Ltd.), thickener (Celogen FS-B from Dai-ichi Kogyo Seiyaku Co., Ltd.), polymer compound A (structure given above), and surfactant (EMALEX 710 from Nihon Emulsion Co., Ltd.) was coated with a wire bar on the surface of the lower protective layer. This was followed by drying for 30 seconds at 125° C. in a convection dryer.

The proportions in this mixed aqueous solution (the coating fluid for protective layer formation) were organic filler/synthetic mica (solids fraction)/polyvinyl alcohol/thickener/polymer compound A/surfactant=4.7/2.8/67.4/18.6/2.3/4.2 (mass %), and the coating weight (post-drying coating weight) was 1.8 g/m².

The respective lithographic printing plate precursors were obtained proceeding as described above.

Platemaking and Evaluation (1) Evaluation of the Sensitivity

The obtained lithographic printing plate precursor was photoexposed using a Trendsetter 3244VX (Creo) equipped with a water-cooled 40 W infrared semiconductor laser. This photoexposure was performed at a resolution of 175 lpi and an external drum rotation rate of 150 rpm and was performed in 0.15 steps as log E in the output range from 0 to 8 W. Photoexposure was carried out at 25° C./50% RH. After photoexposure, development was performed for 12 seconds at 30° C. using an LP-1310News from the Fujifilm Corporation. A 1:4 aqueous dilution of DH-N from the Fujifilm Corporation was used for the developing bath and a 1:1 aqueous dilution of GN-2K from the Fujifilm Corporation was used for the finisher.

The image area density on the lithographic printing plate yielded by development was measured using an RD-918 reflection densitometer from Macbeth; the cyan density was measured using a red filter built into this densitometer. The reciprocal of the photoexposure dose required to obtain a measured density of 0.8 was used as the sensitivity index. For the results of the evaluation, the sensitivity of the lithographic printing plate obtained in Example 49 was taken to be 100, and the sensitivity of the other lithographic printing plates was evaluated relative to this. Larger values are indicative of a better sensitivity. The results are given in Table 5.

(2) Evaluation of the Printing Durability and Scumming

An 80% screen tint image with a resolution of 175 lpi was photoexposed onto the produced lithographic printing plate precursor using a Trendsetter 3244VX (Creo) equipped with a water-cooled 40 W infrared semiconductor laser and using an output of 8 W, an external drum rotation rate of 206 rpm, and a plate surface energy of 100 mJ/cm². Photoexposure was followed by removal of the protective layer by a water rinse with tap water and then development by the same method as for the development step in the (1) Evaluation of the sensitivity. Using the resulting lithographic printing plate, a fountain solution of Ecolity-2 (Fujifilm Corporation)/tap water=2/98 (volume ratio), and Best Cure UV-BF-WRO standard black ink (T&K TOKA Company), the fountain solution and ink were supplied and printing was performed using a Lithrone 26 press from the Komori Corporation. The printing in the solid image area was inspected, and the printing durability index was taken to be the number of sheets at which the image began to blur (number of impressions at the printing end point).

With regard to the print scumming resistance, 1000 sheets were printed and ink scumming in the nonimage areas reprinted after 1 hour was visually evaluated on a 5-level scale. Larger numerical values are indicative of a better resistance to scumming. An evaluation of 4 or more is a practical level, while an evaluation of 3 is the lowest acceptable level. The results are given in Table 5. In addition, the lithographic printing plate precursor was subjected to a forcing interval for 2 days at 60° C./75% RH, after which a lithographic printing plate was prepared by the same method and evaluation was then performed by the same printing process as for the absence of the forcing interval.

TABLE 5

| | polymerizable monomer | sensitivity | print scumming pre-forcing interval | print scumming post-forcing interval | printing durability (impressions) |
|---|---|---|---|---|---|
| Ex. 49 | 1-a | 100 | 5 | 5 | 66000 |
| Ex. 50 | 2-b | 100 | 5 | 4 | 49000 |
| Ex. 51 | 3-a | 100 | 5 | 5 | 55000 |
| Ex. 52 | 4-a | 100 | 5 | 5 | 60000 |
| Ex. 53* | 1-a | 100 | 5 | 5 | 71000 |
| Ex. 54** | 1-a | 100 | 5 | 5 | 76000 |
| Comp. Ex. 10 | x-1 | 100 | 1 | 1 | 21000 |
| Comp. Ex. 11 | x-2 | 100 | 4 | 4 | not more than 1000 |

For the image recording layers on the lithographic printing plate precursors used in Comparative Examples 10 and 11, the composition of the previously described photosensitive layer employed, respectively, x-1 as a low molecular weight compound that had a sulfonamide group but lacked a polymerizable group and x-2 as a polymerizable monomer that had a polymerizable group but lacked a sulfonamide group.
*The previously described (B-10) was used as the binder polymer in Example 53.
**The previously described (B-17) was used as the binder polymer in Example 54.

As may be understood from Table 5, the lithographic printing plate precursor that uses the special monomer provides a lithographic printing plate precursor that exhibits not only an excellent printing durability and an excellent chemical resistance, but also an excellent scumming resistance.

The invention claimed is:

1. A lithographic printing plate precursor, comprising: a support; and an image recording layer disposed thereon and containing a radical polymerization initiator and a polymerizable monomer that has a sulfonamide group and at least two ethylenically unsaturated groups, wherein the polymerizable monomer further contains at least one selected from a ureido bond, a urethane bond, and an isocyanuric acid structure.

2. A lithographic printing plate precursor according to claim 1, wherein the image recording layer further contains a sensitizing dye.

3. The lithographic printing plate precursor according to claim 1, wherein the sulfonamide group is an arylsulfonamide group.

4. The lithographic printing plate precursor according to claim 3, wherein the arylsulfonamide group is benzenesulfonamide group.

5. The lithographic printing plate precursor according to claim 1, wherein the lithographic printing plate precursor further comprises a protective layer.

6. The lithographic printing plate precursor according to claim 5, wherein the protective layer contains mica.

7. A lithographic printing plate platemaking method comprising:
carrying out imagewise photoexposure, with a laser, of a lithographic printing plate precursor that has a support, and an image recording layer disposed thereon and containing a radical polymerization initiator, a sensitizing dye, and a polymerizable monomer that has a sulfonamide group and at least two ethylenically unsaturated groups, wherein the polymerizable monomer further contains at least one selected from a ureido bond, a urethane bond, and an isocyanuric acid structure; and
subsequently removing a nonphotoexposed region of the image recording layer using a printing ink and/or a fountain solution.

8. The lithographic printing plate platemaking method according to claim 7, wherein the sulfonamide group is an arylsulfonamide group.

9. A lithographic printing plate platemaking method comprising:
carrying out imagewise photoexposure, with a laser, of a lithographic printing plate precursor that has a support, and an image recording layer disposed thereon and containing a radical polymerization initiator, a sensitizing dye, and a polymerizable monomer that has a sulfonamide group and at least two ethylenically unsaturated groups, wherein the polymerizable monomer further contains at least one selected from a ureido bond, a urethane bond, and an isocyanuric acid structure; and
subsequently removing a nonphotoexposed region of the image recording layer in the presence of a developing solution that has a pH of 5.0 to 13.5.

10. The lithographic printing plate platemaking method according to claim 9, wherein the sulfonamide group is an arylsulfonamide group.

11. The lithographic printing plate platemaking method according to claim 9, wherein the nonphotoexposed region of the image recording layer is removed in the presence of a developing solution that has a pH of 8.5 to 10.8.

12. The lithographic printing plate platemaking method according to claim 9, wherein the developing solution contains a hydrophilic resin.

13. A polymerizable monomer that has a sulfonamide group, at least two ethylenically unsaturated groups, and at least one group selected from a ureido bond, a urethane bond, and an isocyanuric acid structure.

14. The polymerizable monomer according to claim 13, wherein the sulfonamide group is an arylsulfonamide group.

15. The polymerizable monomer according to claim 14, wherein the arylsulfonamide group is a benzenesulfonamide group.

16. The polymerizable monomer according to claim 13, that has the isocyanuric acid structure.

* * * * *